United States Patent
Lim et al.

(10) Patent No.: US 10,986,726 B2
(45) Date of Patent: Apr. 20, 2021

(54) FLEXIBLE CIRCUIT BOARD FOR ALL-IN-ONE CHIP ON FILM, CHIP PACKAGE INCLUDING SAME, AND ELECTRONIC DEVICE INCLUDING SAME

(71) Applicant: LG INNOTEK CO., LTD., Seoul (KR)

(72) Inventors: Jun Young Lim, Seoul (KR); Jong Seok Park, Seoul (KR); Hyung Kyu Yoon, Seoul (KR); Seong Hwan Im, Seoul (KR); Gi Uk Yang, Seoul (KR); Dae Sung Yoo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/614,192

(22) PCT Filed: May 9, 2018

(86) PCT No.: PCT/KR2018/005294
§ 371 (c)(1),
(2) Date: Nov. 15, 2019

(87) PCT Pub. No.: WO2018/212498
PCT Pub. Date: Nov. 22, 2018

(65) Prior Publication Data
US 2021/0045229 A1 Feb. 11, 2021

(30) Foreign Application Priority Data

May 15, 2017 (KR) .................. 10-2017-0060056
May 15, 2017 (KR) .................. 10-2017-0060178

(51) Int. Cl.
*H05K 1/02* (2006.01)
*H05K 1/14* (2006.01)
(Continued)

(52) U.S. Cl.
CPC ............... *H05K 1/028* (2013.01); *H05K 1/14* (2013.01); *H05K 3/28* (2013.01); *H05K 3/4691* (2013.01)

(58) Field of Classification Search
CPC ............ H05K 1/028; H05K 1/14; H05K 3/28; H05K 3/4691
(Continued)

(56) References Cited

U.S. PATENT DOCUMENTS 7,638,854 B2 12/2009 Tanaka et al.
2001/0011764 A1 8/2001 Elenius et al.
(Continued)

FOREIGN PATENT DOCUMENTS

JP 2001-308491 A 11/2001
JP 2004-311751 A 11/2004
(Continued)

OTHER PUBLICATIONS

International Search Report in International Application No. PCT/KR2018/005294, filed May 9, 2018.
(Continued)

*Primary Examiner* — Tremesha S Willis
(74) *Attorney, Agent, or Firm* — Saliwanchik, Lloyd & Eisenschenk

(57) ABSTRACT

A flexible circuit board for all-in-one chip on film according to an embodiment may include: a substrate; a conductive pattern part disposed on the substrate; and a protective layer partially disposed on the conductive pattern part, wherein the conductive pattern part includes a first conductive pattern part and a second conductive pattern part which are spaced apart from each other, each of the first conductive pattern part and the second conductive pattern part includes a wiring pattern layer, a first plating layer, and a second plating layer that are sequentially placed on the substrate, the
(Continued)

first conductive pattern part includes a first open region in which the protective layer is open, the second conductive pattern part includes a second open region in which the protective layer is open, and a content of tin of the second plating layer in the first open region is greater than that of the second plating layer in the second open region.

20 Claims, 30 Drawing Sheets

(51) Int. Cl.
*H05K 3/46* (2006.01)
*H05K 3/28* (2006.01)

(58) Field of Classification Search
USPC .......................................................... 361/749
See application file for complete search history.

(56) References Cited

U.S. PATENT DOCUMENTS

| | | | |
|---|---|---|---|
| 2003/0020152 A1 | 1/2003 | Inoue et al. | |
| 2010/0132985 A1 | 6/2010 | Kang et al. | |
| 2013/0082091 A1 | 4/2013 | Matejat et al. | |
| 2015/0195912 A1 | 7/2015 | Hurwitz et al. | |
| 2016/0271738 A1 | 9/2016 | Murphy et al. | |
| 2018/0310404 A1 | 10/2018 | Lim et al. | |

FOREIGN PATENT DOCUMENTS

| | | |
|---|---|---|
| JP | 2006-202856 A | 8/2006 |
| JP | 2007-214581 A | 8/2007 |
| JP | 2008-218927 A | 9/2008 |
| KR | 2001-0031276 A | 4/2001 |
| KR | 10-0374075 B1 | 3/2003 |
| KR | 10-2007-0019629 A | 2/2007 |
| KR | 10-2009-0108744 A | 10/2009 |
| KR | 10-2009-0110588 A | 10/2009 |
| KR | 10-2010-0061026 A | 6/2010 |
| KR | 10-1049520 B1 | 7/2011 |
| KR | 10-2013-0113409 A | 10/2013 |
| KR | 10-2014-0022210 A | 4/2014 |
| KR | 10-2016-0054449 A | 5/2016 |
| KR | 10-2016-0078379 A | 7/2016 |
| KR | 10-2016-0144540 A | 12/2016 |
| KR | 10-2017-0040944 A | 4/2017 |

OTHER PUBLICATIONS

Office Action dated Oct. 20, 2020 in Japanese Application No. 2019-562551.

FLEXIBLE CIRCUIT BOARD FOR ALL-IN-ONE CHIP ON FILM, CHIP PACKAGE INCLUDING SAME, AND ELECTRONIC DEVICE INCLUDING SAME

CROSS-REFERENCE TO RELATED APPLICATIONS

This application is the U.S. national stage application of International Patent Application No. PCT/KR2018/005294, filed May 9, 2018, which claims the benefit under 35 U.S.C. § 119 of Korean Application Nos. 10-2017-0060056, filed May 15, 2017; and 10-2017-0060178, filed May 15, 2017; the disclosures of each of which are incorporated herein by reference in their entirety.

TECHNICAL FIELD

An embodiment relates to a flexible circuit board for all-in-one chip on film, a chip package including the same, and an electronic device including the same.

Specifically, the flexible circuit board for all-in-one chip on film may be a flexible circuit board capable of mounting different types of chips on one substrate, a chip package thereof, and an electronic device including the same.

BACKGROUND ART

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible circuit board in the form of a thin film. For example, the semiconductor chip may be an integrated circuit (IC) chip or a large scale integrated circuit (LSI) chip However, a COF flexible circuit board may not be directly connected between a display panel and a main board.

That is, at least two printed circuit boards are required between the display panel and the main board.

An electronic device having a display unit requires a plurality of printed circuit boards, and thus there is a problem that a thickness is increased. In addition, sizes of the plurality of printed circuit boards may be a limitation on miniaturization of the electronic device. Further, poor bonding of the plurality of printed circuit boards may deteriorate reliability of the electronic device.

Therefore, a new flexible circuit board that may solve such a problem is required.

DISCLOSURE

Technical Problem

An embodiment provides a flexible circuit board for all-in-one chip on film capable of mounting a plurality of chips on one substrate, a chip package including the same, and an electronic device including the same.

Technical Solution

A flexible circuit board for all-in-one chip on film according to an embodiment may include: a substrate; a conductive pattern part disposed on the substrate; and a protective layer partially disposed on the conductive pattern part, wherein the conductive pattern part includes a first conductive pattern part and a second conductive pattern part which are spaced apart from each other, each of the first conductive pattern part and the second conductive pattern part includes a wiring pattern layer, a first plating layer, and a second plating layer that are sequentially placed on the substrate, the first conductive pattern part includes a first open region in which the protective layer is open, the second conductive pattern part includes a second open region in which the protective layer is open, and a content of tin of the second plating layer in the first open region is greater than that of the second plating layer in the second open region.

A chip package including a flexible circuit board for all-in-one chip on film according to an embodiment may include a first chip disposed in a first open region of the flexible circuit board for all-in-one chip on film and a second chip disposed in a second open region of the flexible circuit board for all-in-one chip on film.

An electronic device according to an embodiment may include a flexible circuit board for all-in-one chip on film, a display panel connected to one end of the flexible circuit board for all-in-one chip on film, and a main board connected to the other end opposite to the one end of the flexible circuit board for all-in-one chip on film.

Advantageous Effects

A flexible circuit board for all-in-one chip on film according to an embodiment may include a substrate and a conductive pattern part disposed on the substrate.

The conductive pattern part may include a first conductive pattern part and a second conductive pattern part that are spaced apart from each other on the substrate.

The first conductive pattern part includes a first lead pattern part positioned at one end and the other end of the first conductive pattern part, and a first extension pattern part connecting the one end and the other end of the first conductive pattern part, and the second conductive pattern part includes a second lead pattern part positioned at one end and the other end of the second conductive pattern part, and a second extension pattern part connecting the other end the one end of the second conductive pattern part.

The first lead pattern part may be different in shape from the second lead pattern part. Accordingly, the flexible circuit board for all-in-one chip on film according to the embodiment may improve adhesion between different types of the first chip and the second chip.

The conductive pattern part may include a wiring pattern layer, a first plating layer, and a second plating layer.

A protective layer may be disposed in one region of the conductive pattern part to form a protective part, and the one region and another region may be an open region in which the protective part is not disposed. The protective part may be disposed on the first extension pattern part and the second extension pattern part. The protective part may not be disposed on the first lead pattern part and the second lead pattern part. That is, one surface of the first lead pattern part may be exposed to the outside, and may be a first open region in which the protective layer is open. One surface of the second lead pattern part may be exposed to the outside, and may be a second open region in which the protective layer is open, a content of tin (Sn) of the second plating layer of the first lead pattern part in the first open region may be different from that of the second plating layer of the second lead pattern part in the second open region. Accordingly, the first lead pattern part may be excellent in assembly with a first connection part on the first lead pattern part, and may be excellent in electrical connection with the first chip on the first connection part. In addition, the second lead pattern part may be excellent in assembly with the second connection part on the second lead pattern part, and may be excellent in electrical connection with the second chip on the second connection part. That is, different types of first chip and second chips may be mounted on one flexible circuit board, and thus the embodiment may provide a chip package including a flexible circuit board for all-in-one chip on film with improved reliability.

In addition, one flexible circuit board all-in-one chip on film according to the embodiment may directly connect a display panel and a main board. Accordingly, a size and thickness of the flexible circuit board for transmitting a signal generated from the display panel to the main board may be reduced.

Accordingly, the flexible circuit board for all-in-one chip on film according to the embodiment, the chip package including the same, and the electronic device including the same may increase spaces of other components and/or a battery space.

In addition, since connection of a plurality of printed circuit boards is not required, convenience of a process and reliability of electrical connection may be improved.

Accordingly, the flexible circuit board for all-in-one chip on film according to the embodiment, the chip package including the same, and the electronic device including the same may be suitable to an electronic device having a high-resolution display unit.

DESCRIPTION OF DRAWINGS

FIG. 8b is a cross-sectional view of a chip package including the double-side flexible circuit board for all-in-one chip on film according to according to FIG. 8a.

FIG. 11 is a plan view of the double-side flexible circuit board for all-in-one chip on film according to FIG. 8a.

FIG. 12 is a bottom view of the double-side flexible circuit board for all-in-one chip on film according to FIG. 8a.

FIG. 14b is a cross-sectional view of a chip package including the double-side flexible circuit board for all-in-one chip on film of FIG. 14a.

MODES OF THE INVENTION

Figure 1A:
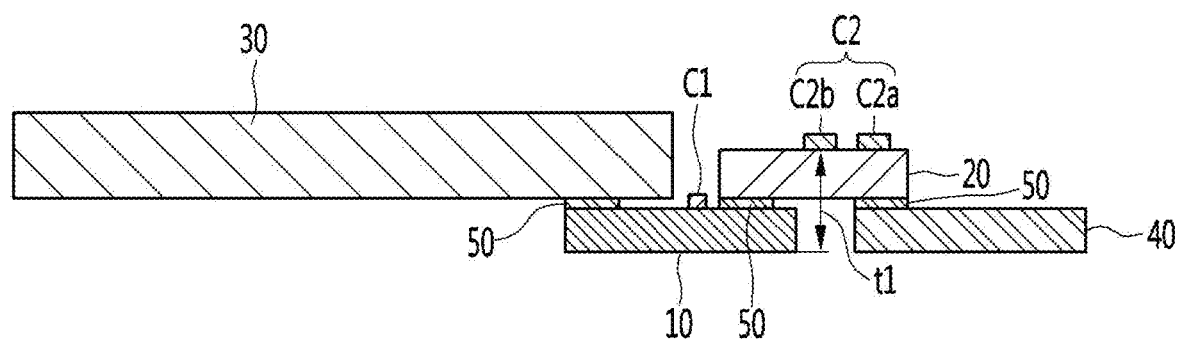
FIG. 1a is a cross-sectional view of an electronic device including a display unit including a conventional printed circuit board.

In the description of embodiments, when it is described that each layer (film), region, pattern, or structure is formed "above/on" or "below/under" a substrate, each layer (film), region, pad or pattern, the description includes being formed both "directly" or "indirectly (by interposing another layer)" "above/on" or "below/under". A reference of above/on or below/under of each layer will be described with reference to the drawings In addition, when a certain part is referred to as being "connected" to another part, it includes not only "directly connected" but also "indirectly connected" with another member therebetween. Further, when a certain part "includes" a certain component, unless described to the contrary, this means that other components may not be excluded, but other components may be further provided.

In the drawings, a thickness or a size of each layer (film), region, pattern or structure may be modified for clarity and convenience of explanation, and thus does not entirely reflect the actual size Hereinafter, embodiments of the present disclosure will be described in detail with reference to the accompanying drawings.

A printed circuit board according to a comparative example will be described with reference to FIGS. 1A to 1C.

An electronic device having a display unit requires at least two printed circuit boards to transmit display panel signals to a main board.

There may be at least two printed circuit boards included in the electronic device including the display unit according to the comparative example.

The electronic device including the display unit according to the comparative example may include a first printed circuit board 10 and a second printed circuit board 20.

The first printed circuit board 10 may be a flexible printed circuit board. Specifically, the first printed circuit board 10 may be a flexible printed circuit board for chip on film (COF).

The first printed circuit board 10 may be a COF flexible printed circuit board on which a first chip C1 is mounted. More specifically, the first printed circuit board 10 may be a COF flexible printed circuit board for disposing a drive IC chip.

The second printed circuit board 20 may be a flexible printed circuit board. Specifically, the second printed circuit board 20 may be a flexible printed circuit board (FPCB) for disposing a second chip C2 which is a different type from that of the first chip C1. Here, the second chip C2 is other than the drive IC chip, and another chip excluding the drive IC chip. It may refer to various chips such as a semiconductor element, a socket, and the like, which are disposed on the flexible printed circuit board for electrical connection. The second printed circuit board 20 may be a flexible printed circuit board (FPCB) for disposing a plurality of second chips C2. For example, the second printed circuit board 20 may be a flexible printed circuit board for disposing a plurality of second chips C2a and C2b which are different types.

The first printed circuit board 10 and the second printed circuit board 20 may have different thicknesses. A thickness of the second printed circuit board 20 may be smaller than that of the first printed circuit board 10. For example, the first printed circuit board 10 may have a thickness of about 20 μm to 100 μm. The second printed circuit board 20 may have a thickness of about 100 μm to 200 μm. For example, a total thickness t1 of the first printed circuit board 10 and the second printed circuit board may be 200 μm to 250 μm.

In the electronic device including the display unit according to the comparative example, the first and second printed circuit boards are required between the display panel and the main board, and thus an overall thickness of the electronic device may be increased. Specifically, the electronic device including the display unit according to the comparative example requires the first and second printed circuit boards stacked vertically, and thus the overall thickness of the electronic device may be increased.

The first printed circuit board 10 and the second printed circuit board 20 may be formed by different processes. For example, the first printed circuit board 10 may be manufactured by a roll-to-roll process. The second printed circuit board 20 may be manufactured by using a sheet method. Specifically, since the first printed circuit board 10 having a conductive pattern part disposed at a fine distance and the second printed circuit board 20 having a conductive pattern part disposed at a distance of 100 μm or more are difficult to apply the same process, they have been generally manufactured in different processes.

Since the first and second printed circuit boards according to the comparative example are formed in different processes, process efficiency may be lowered.

In addition, since the chip package including the flexible circuit board according to the comparative example has difficulty in a process of disposing different types of chips on one substrate, separate first and second printed circuit boards are required.

Further, the chip package including the flexible circuit board according to the comparative example has a problem that it is difficult to connect different types of chips on one substrate.

That is, the first and second printed circuit boards may be disposed between the conventional display panel and main board.

In order to control, process, or transmit R, G, and B signals generated from a display panel 30, the first printed circuit board 10 may be connected to the display panel 30, the first printed circuit board 10 may be again connected to the second printed circuit board 20, and the second printed circuit board 20 may be connected to a main board 40.

One end of the first printed circuit board 10 may be connected to the display panel 30. The display panel 30 may be connected to the first printed circuit board 10 by an adhesive layer 50.

The other end opposite to the one end of the first printed circuit board 10 may be connected to the second printed circuit board 20. The first printed circuit board 10 may be connected to the second printed circuit board 20 by the adhesive layer 50.

One end of the second printed circuit board 20 may be connected to the first printed circuit board 10, and the other end opposite to the one end of the second printed circuit board 20 may be connected to the main board 40. The second printed circuit board 20 may be connected to the main board 40 by the adhesive layer 50.

In the electronic device including the display unit according to the comparative example, a separate adhesive layer 50 may be respectively required between the display panel 30 and the first printed circuit board 10, the first printed circuit board 10 and the second printed circuit board 20, and the second printed circuit board 20 and the main board 40. That is, in the electronic device including the display unit according to the comparative example, a plurality of adhesive layers are required, and thus there is a problem that reliability of the electronic device may be lowered due to poor connection of the adhesive layer. In addition, the adhesive layer disposed between the first printed circuit board 10 and the second printed circuit board 20 connected vertically may increase the thickness of the electronic device.

A first printed circuit board 10, a second printed circuit board 20, a display panel 30, and a main board 40 housed in an electronic device according to a comparative example will be described with reference to FIGS. 1b and 1c.

Figure 1B:
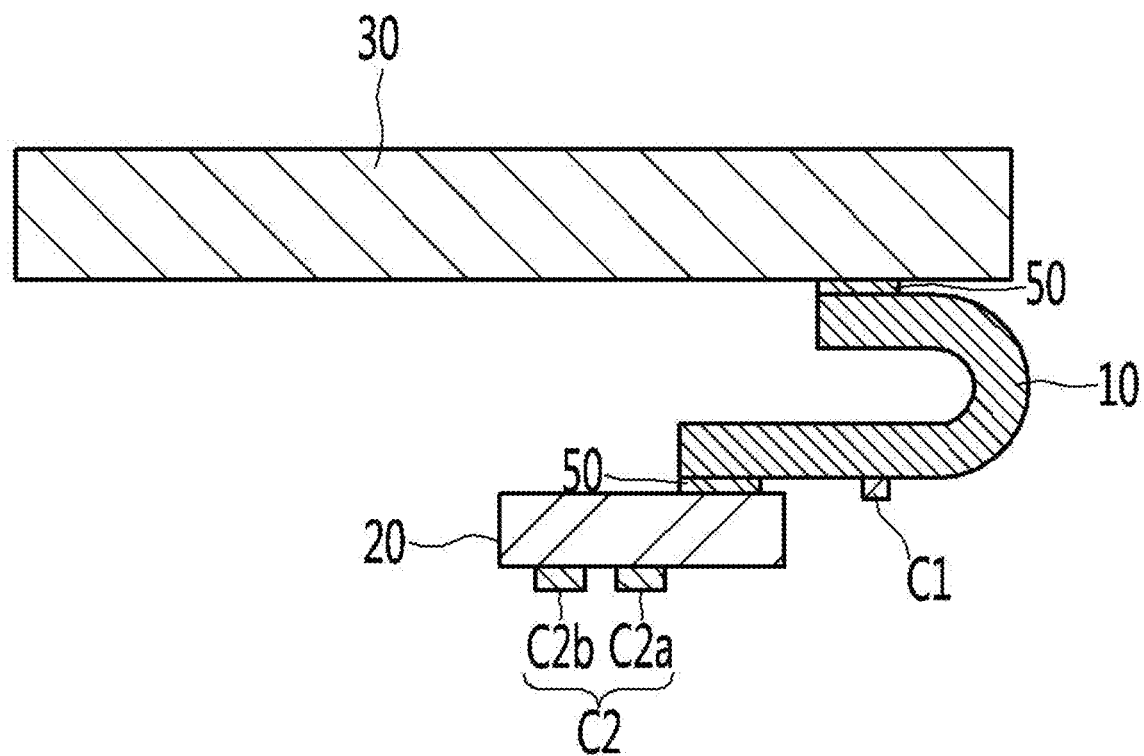
FIG. 1b is a cross-sectional view of a form that the printed circuit board according to FIG. 1a is bent.
Figure 1C:
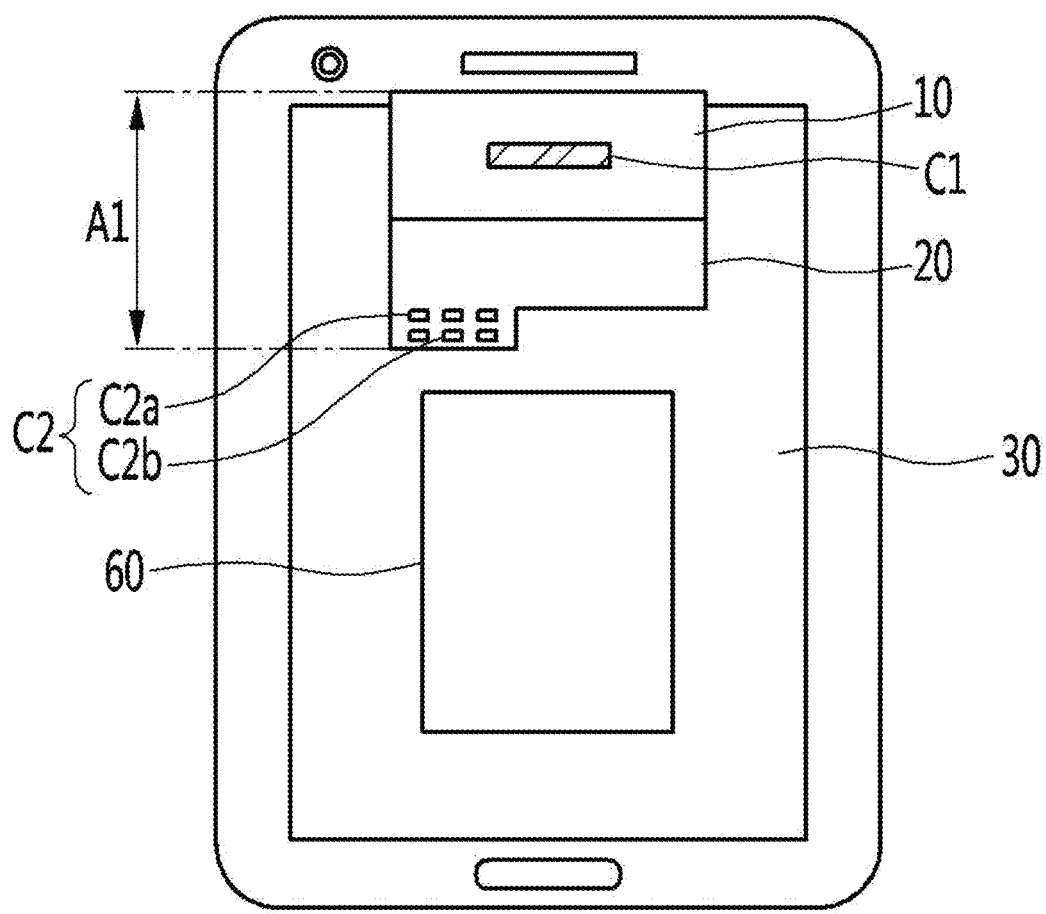
FIG. 1c is a plan view of a form that the printed circuit board according to FIG. 1a is bent.

FIG. 1b is a cross-sectional view of a form that the printed circuit board according to FIG. 1a is bent, and FIG. 1c is a plan view of a lower surface of FIG. 1b.

The display panel 30 and the main board 40 may be disposed to face each other. The first printed circuit board 10 including a bending region may be disposed between the display panel 30 and the main board 40 disposed to face each other.

One region of the first printed circuit board 10 is bent, and the first chip C1 may be disposed in a region thereof which is not bent.

In addition, the second printed circuit board 20 may be disposed to face the display panel 30. The second chip C2 may be disposed in an unbending region of the second printed circuit board 20.

Referring to FIG. 1c, since the comparative example requires a plurality of substrates, a length A1 in one direction may be a sum of lengths of the first printed circuit board 10 and the second printed circuit board 20, respectively. The length A1 in one direction of the first printed circuit board 10 and the second printed circuit board 20 may be a sum of a short side length of the first printed circuit board 10 and a short side length of the second printed circuit board 20. As an example, the length A1 in one direction of the first printed circuit board 10 and the second printed circuit board 20 may be 30 mm to 40 mm. However, the length A1 in one direction of the first printed circuit board 10 and the second printed circuit board 20 may have various sizes depending on a type of chip to be mounted and a type of electronic device.

In the electronic device according to the comparative example, since a plurality of printed circuit boards are required, a space for mounting another component or a space for disposing a battery 60 may be reduced.

Recently, a component having various functions have been added to an electronic device such as a smartphone in order to enhance user convenience and security. For example, electronic devices such as smartphones and smart watches are equipped with a plurality of camera modules (dual camera module, dual camera module), and a component having various functions such as iris recognition and virtual reality (VR) is added. Accordingly, it is important to secure a space for mounting the added component.

In addition, various electronic devices such as wearable devices are required to increase a battery space in order to improve user convenience.

Therefore, a plurality of printed circuit boards used in conventional electronic devices are replaced with a single printed circuit board, and thus importance of securing a space for mounting a new component or securing a space for increasing a battery size is emerged.

In the electronic device according to the comparative example, different types of the first chip and the second chip may be disposed on the first printed circuit board 10 and second printed circuit board 30, respectively. Accordingly, there was a problem that a thickness of the adhesive layer 50 between the first printed circuit board 10 and the second printed circuit board 30 and a thickness of the second printed circuit board 30 increase a thickness of the electronic device.

In addition, there was a problem that a battery space corresponding to a size of the second printed circuit board 30 or a space for mounting other components is reduced.

Further, there was a problem that poor bonding between the first and second printed circuit boards deteriorates reliability of the electronic device.

In order to solve such problems, embodiments may provide a new flexible circuit board for all-in-one chip on film capable of mounting a plurality of chips on one substrate, a chip package including the same, and an electronic device including the same. The same drawing numerals in the embodiments and the comparative examples indicate the same components, and redundant description with the comparative examples described above is omitted.

Figure 2A:
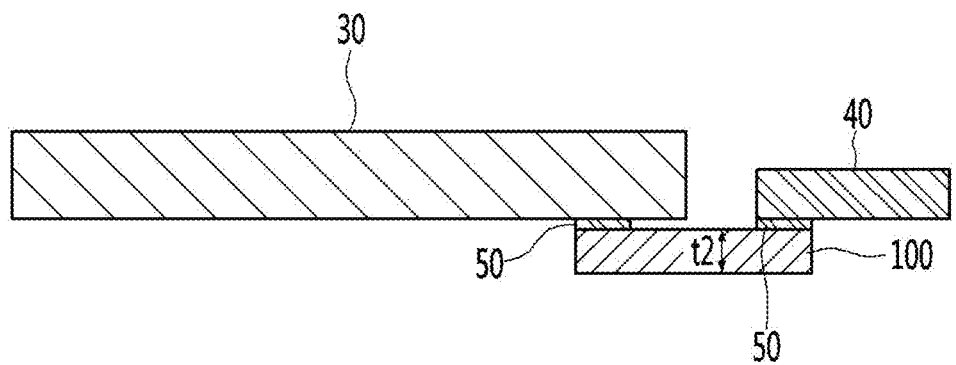
FIG. 2a is a cross-sectional view of an electronic device including a display unit including a flexible circuit board for all-in-one chip on film according to an embodiment.

An electronic device including a flexible circuit board for all-in-one chip on film according to an embodiment will be described with reference to FIGS. 2a to 2c.

The electronic device according to the embodiment may use one printed circuit board in order to transmit a display panel signal to a main board. The printed circuit board included in the electronic device including a display unit according to the embodiment may be one flexible printed circuit board. Accordingly, a flexible circuit board 100 for all-in-one chip on film according to the embodiment may be bent between the display unit and the main board facing each other to connect the display unit and the main board.

Specifically, the flexible circuit board 100 for all-in-one chip on film according to the embodiment may be one substrate for disposing a plurality of different types of chips.

The flexible circuit board 100 for all-in-one chip on film according to the embodiment may be a substrate for disposing different types of a first chip C1 and a second chip C2.

A thickness t2 of the flexible circuit board 100 for all-in-one chip on film according to the embodiment may be 20 μm to 100 μm. For example, the thickness t2 of the flexible circuit board 100 for all-in-one chip on film according to the embodiment may be 30 μm to 80 μm. For example, the thickness t2 of the flexible circuit board 100 for all-in-one chip on film according to the embodiment may be 50 μm to 75 μm. The thickness of the flexible circuit board 100 for all-in-one chip on film according to the embodiment may be 20 μm to 100 μm, 30 μm to 80 μm, or 50 μm to 75 μm, depending on a type of a chip and a type of a device to be mounted.

A thickness t2 of the flexible circuit board 100 for all-in-one chip on film according to the embodiment may have a thickness of ⅕ to ½ level of the thickness t1 of the plurality of first and second printed circuit boards according to the comparative example. That is, the thickness t2 of the flexible circuit board 100 for all-in-one chip on film according to the embodiment may have a thickness of 20% to 50% level of the thickness t1 of the plurality of first and second printed circuit boards according to the comparative example. For example, the thickness t2 of the flexible circuit board 100 for all-in-one chip on film according to the embodiment may have a thickness of 25% to 40% level of the thickness t1 of the plurality of first and second printed circuit boards according to the comparative example. For example, the thickness t2 of the flexible circuit board 100 for all-in-one chip on film according to the embodiment may have a thickness of 25% to 35% level of the thickness t1 of the plurality of first and second printed circuit boards according to the comparative example.

Since the electronic device including the display unit according to the embodiment requires only one flexible circuit board 100 for all-in-one chip on film between the display panel and the main board, the overall thickness of the electronic device may be reduced. Specifically, since the electronic device including the display unit according to the embodiment requires a single-layer printed circuit board, the overall thickness of the electronic device may be reduced.

In addition, the embodiment may omit the adhesive layer 50 between the first printed circuit board and the second printed circuit board included in the comparative example, and thus the overall thickness of the chip package including the flexible circuit board for all-in-one chip on film and the electronic device including same may be reduced.

Further, since the embodiment may omit the adhesive layer 50 between the first printed circuit board and the second printed circuit board, a problem due to the adhesion failure may be solved, thereby improving reliability of the electronic device.

Furthermore, since a bonding process of a plurality of printed circuit boards may be omitted, process efficiency may be increased and a process cost may be reduced.

Furthermore, management of the substrate in a separate process is replaced by management in one process, thereby improving the process efficiency and the product yield.

The flexible circuit board 100 for all-in-one chip on film according to the embodiment may include a bending region and a non-bending region. The flexible circuit board 100 for all-in-one chip on film according to the embodiment includes the bending region, thereby connecting the display panel 30 and the main board 40 that are disposed to face each other.

The non-bending region of the flexible circuit board 100 for all-in-one chip on film according to the embodiment may be disposed to face the display panel 30. The first chip C1 and the second chip C2 may be disposed on the non-bending region of the flexible circuit board 100 for all-in-one chip on film according to the embodiment. Accordingly, the flexible circuit board 100 for all-in-one chip on film according to the embodiment may stably mount the first chip C1 and the second chip C2.

Figure 2B:
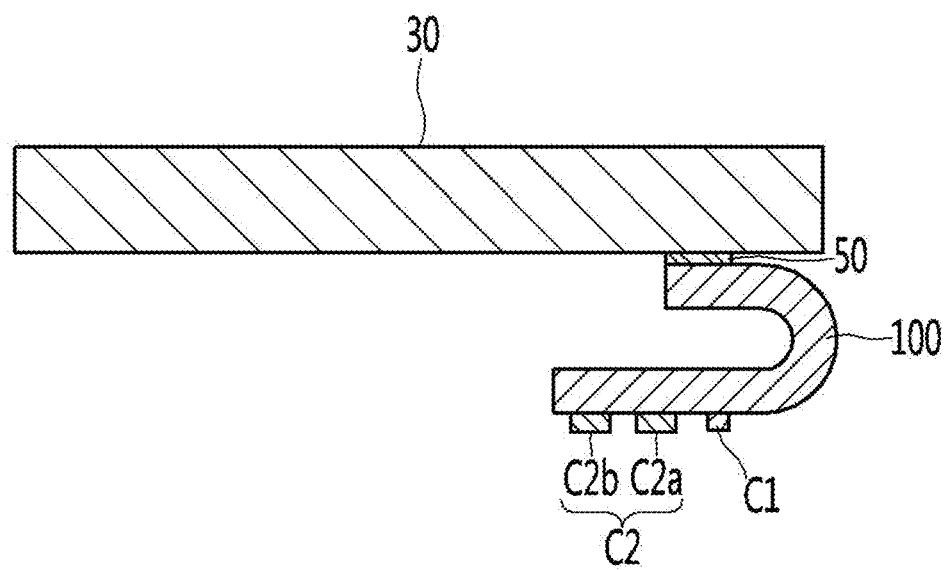
FIG. 2b is a cross-sectional view of a form that the flexible circuit board for all-in-one chip on film according to FIG. 2a is bent.
Figure 2C:
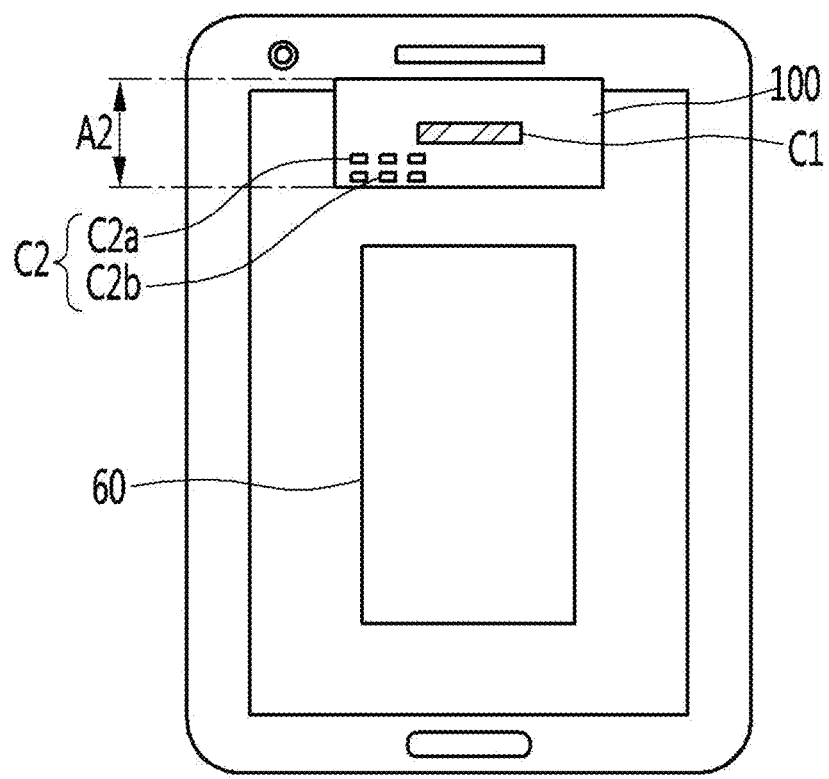
FIG. 2c is a plan view of a form that the flexible circuit board for all-in-one chip on film according to FIG. 2a is bent.

FIG. 2c is a plan view of a lower surface in FIG. 2b.

Referring to FIG. 2c, since an embodiment requires one substrate, a length A2 in one direction may be a length of one substrate. The length A2 in one direction of a flexible circuit board 100 for all-in-one chip on film according to the embodiment may be a length of a short side of the flexible circuit board 100 for all-in-one chip on film according to the embodiment. As an example, the length A2 in one direction of the flexible circuit board 100 for all-in-one chip on film according to the embodiment may be 10 mm to 50 mm. For example, the length A2 in one direction of the flexible circuit board 100 for all-in-one chip on film according to the embodiment may be 10 mm to 30 mm. For example, the length A2 in one direction of the flexible circuit board 100 for all-in-one chip on film according to the embodiment may be 15 mm to 25 mm. However, the embodiment is not limited thereto, and it is needless to say that various sizes may be designed according to the type and/or number of chips to be disposed and the type of an electronic device.

A length L2 in one direction of the flexible circuit board 100 for all-in-one chip on film according to the embodiment may have a length of 50% to 70% level of a length L1 in one direction of the plurality of first and second printed circuit boards according to the comparative example. For example, the length L2 in one direction of the flexible circuit board 100 for all-in-one chip on film according to the embodiment may have a length of 55% to 70% level of the length L1 in one direction of the plurality of first and second printed circuit boards according to the comparative example. The length L2 in one direction of the flexible circuit board 100 for all-in-one chip on film according to the embodiment may have a length of 60% to 70% level of the length L1 in one direction of the plurality of first and second printed circuit boards according to the comparative example.

Accordingly, in the embodiment, a size of a chip package including the flexible circuit board 100 for all-in-one chip on film in the electronic device may be reduced, so that a space for disposing a battery 60 may be increased. In addition, the chip package including the flexible circuit board 100 for all-in-one chip on film according to the embodiment may reduce a plane area, so that a space for mounting other components may be secured.

With reference to FIGS. 3a, 3b, 7, 8a, 8b, 9 and 10, a flexible circuit board 100 for all-in-one chip on film according to an embodiment and a chip package thereof will be described.

Figure 3A:
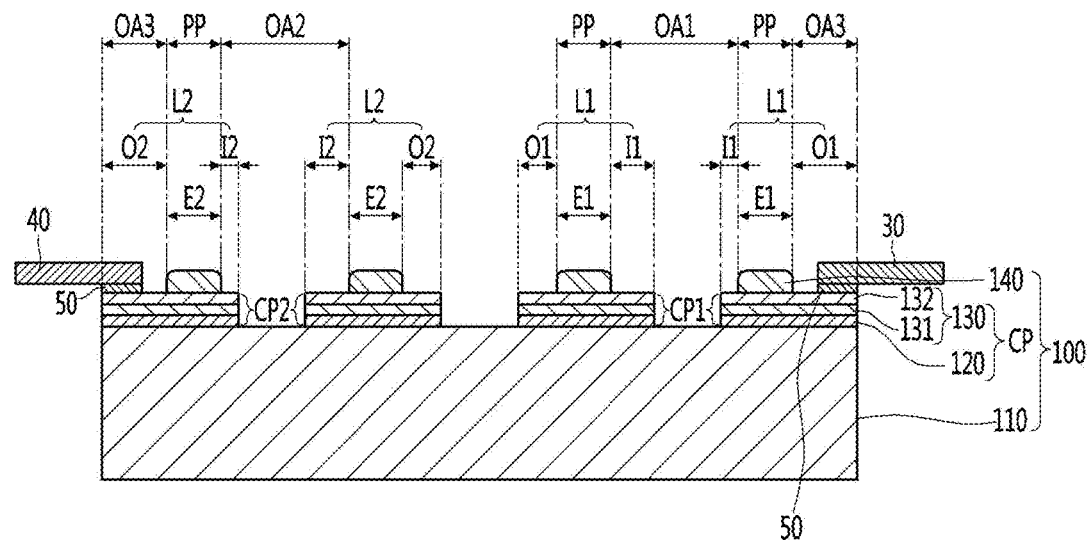
FIG. 3a is a cross-sectional view of a single-side flexible circuit board for all-in-one chip on film according to an embodiment.
Figure 3B:
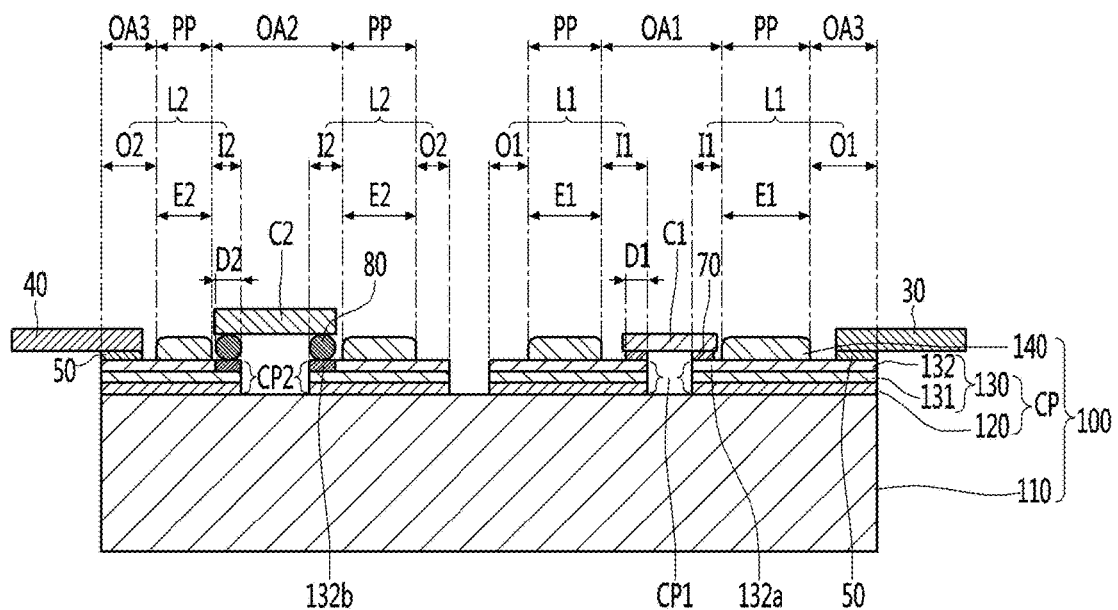
FIG. 3b is a cross-sectional view of a chip package including a single-side flexible circuit board for all-in-one chip on film according to an embodiment.

Referring to FIGS. 3a and 3b, the flexible circuit board 100 for all-in-one chip on film according to the embodiment may be a single-side flexible circuit board for all-in-one chip on film having a conductive pattern part CP on one surface thereof.

A plurality of conductive pattern parts CP may be disposed to be spaced apart from each other on the substrate. The conductive pattern part CP may include a first conductive pattern part CP1 and a second conductive pattern part CP2 that are spaced apart from each other. The first conductive pattern part CP1 and the second conductive pattern part CP2 may be spaced apart from each other in order to transmit different signals of a first chip and a second chip.

The first conductive pattern part CP1 may include first conductive pattern parts CP1 disposed to be spaced apart from each other at a first pitch on the substrate. The second conductive pattern part CP2 may include second conductive pattern parts CP2 disposed to be spaced apart from each other at a second pitch different from the first pitch on the substrate. In the embodiment, in order to mount different first and second chips on one flexible circuit board for all-in-one chip on film, the first conductive pattern parts CP1 spaced apart from each other at the first pitch and the second conductive pattern parts CP2 spaced apart from each other at the second pitch may be disposed on one surface of the substrate.

The first conductive pattern part CP1 may include a first lead pattern part L1 positioned at one end and the other end of the first conductive pattern part, and a first extension pattern part E1 connecting the one end and the other end of the first conductive pattern part. Specifically, the first conductive pattern part CP1 may include a first inner lead pattern part I1 positioned at the one end of the first conductive pattern part, a first outer lead pattern part O1 positioned at the other end of the first conductive pattern part, and the first extension pattern part E1 connecting the one end and the other end of the first conductive pattern part.

The second conductive pattern part CP2 may include a second lead pattern part L2 positioned at one end and the other end of the second conductive pattern part, a second extension pattern part E2 connecting the one end and the other end of the second conductive pattern part. Specifically, the second conductive pattern part CP2 includes a second inner lead pattern part I2 positioned at the one end of the second conductive pattern part, a second outer lead pattern part O2 positioned at the other end of the second conductive pattern part, and the second extension pattern part E2 connecting the one end and the other end of the second conductive pattern part.

The conductive pattern part CP may include a wiring pattern layer 120 and a plating layer 130. Specifically, the first conductive pattern part CP1 and the second conductive pattern part CP2 may include the wiring pattern layer 120, a first plating layer 131, and a second plating layer 132, which are sequentially disposed on the substrate, respectively. That is, the conductive pattern part CP may be a multi-layered structure pattern for inhibiting whiskers and improving reliability.

A protective layer 140 may be partially disposed on the conductive pattern part. The conductive pattern part may include a protective part PP covered with a protective layer and open regions OA1, OA2, and OA3 not covered with the protective layer.

In a region in which the protective part PP is positioned, one surface of the conductive pattern part CP may be in direct contact with the protective layer 140, and the other surface opposite to the one surface of the conductive pattern part CP may be in direct contact with the substrate 110. In the region in which the protective part PP is positioned, the one surface of the conductive pattern part CP may not be exposed to the outside, so that corrosion of the conductive pattern part CP may be inhibited.

In the open regions OA1, OA2, and OA3, one surface of the conductive pattern part CP is exposed to the outside, and the other surface opposite to the one surface of the conductive pattern part CP may be in direct contact with the substrate 110. In the open regions OA1, OA2, and OA3, the one surface of the conductive pattern part CP is exposed to the outside, so that it may be electrically connected to other components such as a first chip, a second chip, a display panel, and the main board.

The protective layer 140 may be disposed on the first extension pattern part E1 and the second extension pattern part E2. Specifically, the protective layer 140 may be entirely disposed on the first extension pattern part E1 and the second extension pattern part E2. That is, the protective layer 140 may be disposed only on the first extension pattern part E1 and the second extension pattern part E2. Accordingly, one surface of the first lead pattern part L1 and the second lead pattern part L2 may be exposed to the outside. For example, the second plating layer 132 of the first inner lead pattern part I1 may be exposed to the outside. For example, the second plating layer 132 of the second inner lead pattern part I2 may be exposed to the outside.

A first connection part 70 may be disposed on the first inner lead pattern part I1, and a first chip C1 may be disposed on the first connection part 70. That is, the second plating layer 132 of the first inner lead pattern part I1 may be in direct contact with the first connection part 70. At this time, a second plating layer 132a of the first inner lead pattern part I1 may be a pure tin layer. Accordingly, the second plating layer 132a of the first inner lead pattern part I1 may be improved in assembly characteristics with the first connection part 70. A second connection part 80 may be disposed on the second inner lead pattern part I2, and a second chip C2 may be disposed on the second connection part 80. That is, the second plating layer 132 of the second inner lead pattern part I2 may be in direct contact with the second connection part 80. At this time, a second plating layer 132b of the second inner lead pattern part I2 may be a tin alloy layer. Specifically, the second plating layer 132b of the second inner lead pattern part I2 may be an alloy layer of copper and tin. Accordingly, the second plating layer 132b of the first inner lead pattern part I1 may be improved in assembly characteristics with the second connection part 80.

In the first open region OA1, the first inner lead pattern part I1 and the first connection part 70 may be overlapped vertically. In the second open region OA2, the second inner lead pattern part I2 and the second connection part 80 may be overlapped vertically.

An area of an overlapping region of the first inner lead pattern part I1 and the first connection part 70 may be different from that of an overlapping region of the second inner lead pattern part I2 and the second connection part 80. For example, an area of an overlapping region between the one first inner lead pattern part I1 and the one first connection part 70 may be smaller than that of an overlapping region between the one second inner lead pattern part I2 and the one second connection part 80. Accordingly, the embodiment may provide the flexible circuit board for all-in-one chip on film having a high adhesive strength when mounting different the first and the second chips.

A flexible circuit board 100 for an all-in-one chip on film according to an embodiment may include a substrate 110, a wiring pattern layer 120 disposed on the substrate 110, a plating layer 130, and a protective layer 140.

The substrate 110 may be a supporting substrate for supporting the wiring pattern layer 120, the plating layer 130, and the protective layer 140.

The first substrate 110 may include a bending region and a region other than the bending region. That is, the substrate 110 may include a bending region in which bending is performed and a non-bending region other than the folding region The substrate 110 may be a flexible substrate. Accordingly, the substrate 110 may be partially bent. That is, the substrate 110 may include a flexible plastic. For example, the substrate 110 may be a polyimide (PI) substrate. However, the embodiment is not limited thereto, and may be a substrate made of a polymer material such as polyethylene terephthalate (PET), polyethylene naphthalate (PEN), or the like. Accordingly, a flexible circuit board including the substrate 110 may be used in various electronic devices having a curved display device. For example, a flexible circuit board including the substrate 110 is excellent in flexible characteristics, thereby having suitability of mounting a semiconductor chip on a wearable electronic device. In particular, the embodiment may be suitable for an electronic device including a curved display.

The substrate 110 may be an insulating substrate. That is, the substrate 110 may be an insulating substrate supporting various wiring patterns.

The substrate 110 may have a thickness of 20 μm to 100 μm. For example, the substrate 110 may have a thickness of 25 μm to 50 μm. For example, the substrate 100 may have a thickness of 30 μm to 40 μm. When the thickness of the substrate 100 exceeds 100 μm, the thickness of the entire flexible circuit board may be increased. When the thickness of the substrate 100 is less than 20 μm, it may be difficult to dispose the first chip C1 and the second chip C2 at the same time. When the thickness of the substrate 110 is less than 20 μm, the substrate 110 may be vulnerable to heat/pressure in a process of mounting a plurality of chips, and thus it is difficult to dispose the plurality of chips at the same time.

A wiring may be disposed on the substrate 110. The wiring may be a plurality of patterned wirings. For example, the plurality of wirings on the substrate 110 may be disposed to be spaced apart from each other. That is, a wiring pattern layer 120 may be disposed on one surface of the substrate 110.

An area of the substrate 110 may be larger than that of the wiring pattern layer 120. Specifically, a planar area of the substrate 110 may be larger than that of the wiring pattern layer 120. That is, the wiring pattern layer 120 may be partially disposed on the substrate 110. For example, a lower surface of the wiring pattern layer 120 may be in contact with the substrate 110, and the substrate 110 may be exposed between the plurality of wirings. The wiring pattern layer 120 may include a conductive material.

For example, the wiring pattern layer 200 may include a metal material having excellent electrical conductivity. More specifically, the wiring pattern layer 200 may include copper (Cu). However, the embodiment is not limited thereto, and it is possible to include at least one metal among copper (Cu), aluminum (Al), chromium (Cr), nickel (Ni), silver (Ag), molybdenum (Mo), gold (Au), titanium (Ti), and an alloy thereof.

The wiring pattern layer 120 may be disposed to have a thickness of 1 μm to 15 μm. For example, the wiring pattern layer 120 may be disposed to have a thickness of 1 μm to 10 μm. For example, the wiring pattern layer 120 may be disposed to have a thickness of 2 μm to 10 μm.

When the thickness of the wiring pattern layer 120 is less than 1 μm, a resistance of the wiring pattern layer 120 may increase. When the thickness of the wiring pattern layer 120 exceeds 10 μm, it is difficult to realize a fine pattern.

The plating layer 130 may be disposed on the wiring pattern layer 120. The plating layer 130 may include a first plating layer 131 and a second plating layer 132.

The first plating layer 131 may be disposed on the wiring pattern layer 120, and the second plating layer 132 may be disposed on the first plating layer 131. The first plating layer 131 and the second plating layer 132 may be formed in two layers on the wiring pattern layer 120 in order to inhibit formation of whiskers. Accordingly, a short circuit between patterns of the wiring pattern layer 120 may be inhibited. Korean Registered Patent No. 10-0374075 also discloses a two-layered plating layer.

In addition, since two plating layers are disposed on the wiring pattern layer 120, bonding characteristics with the chip may be improved. When the wiring pattern layer includes copper (Cu), the wiring pattern layer may not be directly bonded to the first chip C1, and a separate bonding process may be required. On the other hand, when the plating layer disposed on the wiring pattern layer includes tin (Sn), a surface of the plating layer may be a pure tin layer, and thus bonding with the first chip C1 may be facilitated. At this time, a wire connected to the first chip C1 may be simply connected to the pure tin layer only by heat and pressure, and thus accuracy of wire bonding of the chip and convenience of a manufacturing process may be improved.

A region in which the first plating layer 131 is disposed may correspond to a region in which the second plating layer 132 is disposed. That is, an area in which the first plating layer 131 is disposed may correspond to an area in which the second plating layer 132 is disposed.

The plating layer 130 may include tin (Sn). For example, the first plating layer 131 and the second plating layer 132 may include tin (Sn).

For example, the wiring pattern layer 120 may be formed of copper (Cu), and the first plating layer 131 and the second plating layer 132 may be formed of tin (Sn). When the plating layer 130 includes tin, corrosion resistance of tin (Sn) is excellent, and thus the wiring pattern layer 120 may be inhibited from being oxidized.

Meanwhile, a material of the plating layer 130 may have a lower electrical conductivity than that of the wiring electrode layer 120. The plating layer 130 may be electrically connected to the wiring electrode layer 120.

The first plating layer 131 and the second plating layer 132 may be formed of the same tin (Sn), but may be formed in a separate process.

For example, when the manufacturing process of a flexible circuit board according to the embodiment includes a heat treatment process such as thermal curing, a diffusion action of copper (Cu) of the wiring pattern layer 120 or tin (Sn) of the plating layer 130 may occur. Specifically, the diffusion action of copper (Cu) of the wiring pattern layer 120 or tin (Sn) of the plating layer 130 may occur by curing of the protective layer 140.

Accordingly, as the diffusion concentration of copper (Cu) decreases from the first plating layer 131 to a surface of the second plating layer 132, a content of copper (Cu) may be continuously reduced. Meanwhile, the content of tin (Sn) may continuously increase from the first plating layer 131 to the surface of the second plating layer 132. Accordingly, the uppermost portion of the plating layer 130 may include a pure tin layer.

That is, the wiring pattern layer 120 and the plating layer 130 may be an alloy of tin and copper due to a chemical action at a stacking interface. The thickness of the alloy of tin and copper after the protective layer 140 is cured on the plating layer 130 may be increased than the thickness of the alloy of tin and copper after the plating layer 130 is formed on the wiring pattern layer 120.

An alloy of tin and copper included in at least a part of the plating layer 130 may have a chemical formula of $Cu_xSn_y$, and may be $0<x+y<12$. For example, in the chemical formula, a sum of x and y may be $4 \leq x+y \leq 11$. For example, the alloy of tin and copper included in the plating layer 130 may include at least one of $Cu_3Sn$ and $Cu_6Sn_5$. Specifically, the first plating layer 131 may be an alloy layer of tin and copper.

In addition, the first plating layer 131 and the second plating layer 132 may have different contents of tin and copper. The first plating layer 131 in direct contact with the copper wiring pattern layer may have a copper content greater than that of the second plating layer 132.

The second plating layer 132 may have a higher tin content than the first plating layer 131. The second plating layer 132 may include a pure tin layer. Here, pure tin may mean that a content of tin (Sn) is 50 atomic % or more, 70 atomic % or more, or 90 atomic % or more. At this time, an element other than tin may be copper. For example, the second plating layer 132 may have a tin (Sn) content of 50 atomic % or more. For example, the second plating layer 132 may have a tin (Sn) content of 70 atomic % or more. For example, the second plating layer 132 may have a tin (Sn) content of 90 atomic % or more. For example, the second plating layer 132 may have a tin (Sn) content of 95 atomic % or more. For example, the second plating layer 132 may have a tin (Sn) content of 98 atomic % or more.

The plating layer according to the embodiment may inhibit electrochemical migration resistance due to a diffusion phenomenon of Cu/Sn, and may inhibit short-circuit defects due to metal growth.

However, the embodiment is not limited thereto, and the plating layer 130 may include any one of a Ni/Au alloy, gold (Au), electroless nickel immersion gold (ENIG), a Ni/Pd alloy, and organic solderability preservative (OSP).

The first plating layer 131 and the second plating layer 132 may correspond to each other, or have different thicknesses. The total thickness of the first plating layer 131 and the second plating layer 132 may be 0.3 µm to 1 µm. The total thickness of the first plating layer 131 and the second plating layer 132 may be 0.3 µm to 0.7 µm. The total thickness of the first plating layer 131 and the second plating layer 132 may be 0.3 µm to 0.5 µm. Any one plating layer of the first plating layer 131 and the second plating layer 132 may have a thickness of 0.05 µm to 0.15 µm. For example, any one plating layer of the first plating layer 131 and the second plating layer 132 may have a thickness of 0.07 µm to 0.13 µm.

The protective layer 140 may be partially disposed on the wiring pattern layer 120. For example, the protective layer 140 may be disposed on the plating layer 130 on the wiring pattern layer 120. Since the protective layer 140 may cover the plating layer 130, it is possible to inhibit damage or delamination of a film caused by oxidation of the wiring pattern layer 120 and the plating layer 130.

The protective layer 140 may be partially disposed in a region excluding a region in which the wiring pattern layer 120 and/or the plating layer 130 is electrically connected to a display panel 30, a main board 40, the first chip C1, or the second chip C2.

Accordingly, the protective layer 140 may be partially overlapped with the wiring pattern layer 120 and/or the plating layer 130.

An area of the protective layer 140 may be smaller than that of the substrate 110. The protective layer 140 may be disposed in a region excluding an end of the substrate, and may include a plurality of open regions.

The protective layer 140 may include a first open region OA1 having a shape like a hole. The first open region OA1 may be a non-disposing region of the protective layer 140 for electrically connecting the wiring pattern layer 120 and/or the plating layer 130 to the first chip C1.

The protective layer 140 may include a second open region OA2 having a shape like a hole. The second open region OA2 may be a non-disposing region of the protective layer 140 for electrically connecting the wiring pattern layer 120 and/or the plating layer 130 to the second chip C2. Accordingly, the plating layer 130 may be exposed to the outside in the second open region OA2.

In the second open region OA2, a copper content of the plating layer 130 may be 50 atomic % or more. For example, the copper content in the plating layer 130 may be 60 atomic % or more. For example, the copper content in the plating layer 130 may be 60 atomic % to 80 atomic %. Specifically, a copper content of the first plating layer 131 measured in the second open region OA2 may be 60 atomic % to 80 atomic %.

The protective layer 140 may not be disposed on the conductive pattern part for being electrically connected to the main board 40 or the display panel 30. The embodiment may include a third open region OA3 that is a non-disposing region of the protective layer 140 on the conductive pattern part to be electrically connected to the main board 40 or the display panel 30. Accordingly, the plating layer 130 may be exposed to the outside in the third open region OA3.

In the third open region OA3, a copper content of the plating layer 130 may be 50 atomic % or more. Alternatively, in the third open region OA3, a copper content of the plating layer 130 may be less than 50 atomic %.

The third open region OA3 may be positioned outside the substrate as compared with the first open region OA1. In addition, the third open region OA3 may be positioned outside the substrate as compared with the second open region OA2.

The first open region OA1 and the second open region OA2 may be positioned in a central region of the substrate as compared with the third open region OA3.

The protective layer 140 may be disposed in a bending region. Accordingly, the protective layer 140 may disperse stress that may occur during bending. Therefore, reliability of the flexible circuit board for all-in-one chip on film according to the embodiment may be improved.

The protective layer 140 may include an insulating material. The protective layer 140 may include various materials that may be heated and cured after being applied to protect the surface of the conductive pattern part. The protective layer 140 may be a resist layer. For example, the protective layer 140 may be a solder resist layer including an organic polymer material. For example, the protective layer 140 may include an epoxy acrylate resin. In detail, the protective layer 140 may include a resin, a curing agent, a photo initiator, a pigment, a solvent, a filler, an additive, an acrylic monomer, and the like. However, the embodiment is not limited thereto, and it is needless to say that the protective layer 140 may be any one of a photo-solder resist layer, a cover-lay, and a polymer material.

The protective layer 140 may have a thickness of 1 μm to 20 μm. The protective layer 140 may have a thickness of 1 μm to 15 μm. For example, the protective layer 140 may have a thickness of 5 μm to 20 μm. When the thickness of the protective layer 140 exceeds 20 μm, the thickness of the flexible circuit board for all-in-one chip on film may increase. When the thickness of the protective layer 140 is less than 1 μm, reliability of the conductive pattern part included in the flexible circuit board for all-in-one chip on film may be lowered.

With reference to FIG. 3b, a chip package including a single-side flexible circuit board 100 for all-in-one chip on film according to an embodiment will be described.

The single-side flexible circuit board 100 for all-in-one chip on film according to the embodiment may include a substrate 110, a conductive pattern part CP disposed on one surface of the substrate, and a protective part PP formed by partially disposing a protective layer 140 in one region on the conductive pattern part CP.

The conductive pattern part CP may include the wiring pattern layer 120 and the plating layer 130.

The protective part PP may not be disposed on one region and another region on the conductive pattern part CP. Accordingly, the conductive pattern part CP and the substrate 110 between the separated conductive pattern parts CP may be exposed on the one region and the other region on the conductive pattern part CP. A first connection part 70 and a second connection part 80 may be disposed on the one region and the other region on the conductive pattern part CP, respectively. Specifically, the first connection part 70 and the second connection part 80 may be disposed on an upper surface of the conductive pattern part CP in which the protective part PP is not disposed, respectively.

The first connection part 70 and the second connection part 80 may have different shapes. For example, the first connection part 70 may be a hexahedral shape. Specifically, a cross-section of the first connection part 70 may include a quadrangular shape. In more detail, the cross-section of the first connection part 70 may include a rectangular or square shape. For example, the second connection part 80 may include a spherical shape. A cross-section of the second connection part 80 may include a circular shape. Alternatively, the second connection part 80 may include a partially or wholly rounded shape. As an example, the cross-sectional shape of the second connection part 80 may include a flat surface on one side surface and a curved surface on the other side surface opposite to the one side surface.

The first connection part 70 and the second connection part 80 may have different sizes. The first connection part 70 may be smaller than the second connection part 80.

Widths of the first connection part 70 and the second connection part 80 may be different from each other. For example, a width D1 between both side surfaces of one first connection part 70 may be smaller than a width D2 between both side surfaces of one second connection part 80.

The first chip C1 may be disposed on the first connection part 70. The first connection part 70 may include a conductive material. Accordingly, the first connection part 70 may electrically connect the first chip C1 disposed on an upper surface of the first connection part 70 and the conductive pattern part CP disposed on a lower surface of the first connection part 70.

The second chip C2 may be disposed on the second connection part 80. The second connection part 80 may include a conductive material. Accordingly, the second connection part 80 may electrically connect the second chip C2 disposed on an upper surface of the second connection part 80 and the conductive pattern part CP disposed on a lower surface of the second connection part 80.

Different types of first and second chips C1 and C2 may be disposed on the same one surface of the single-side flexible circuit board 100 for all-in-one chip on film according to the embodiment. Specifically, one first chip C1 and a plurality of second chips C2 may be disposed on the same one surface of the single-side flexible circuit board 100 for all-in-one chip on film according to the embodiment. Accordingly, efficiency of a chip packaging process may be improved.

The first chip C1 may include a drive IC chip.

The second chip C2 may refer to a chip other than a drive IC chip. The second chip C2 may refer to various chips including a socket or an element other than a drive IC chip. For example, the second chip C2 may include at least one of a diode chip, a power supply IC chip, a touch sensor IC chip, a multilayer ceramic capacitor (MLCC) chip, a ball grid array (BGA) chip, and a chip condenser.

The plurality of second chips C2 disposed on the flexible circuit board 100 for all-in-one chip on film may refer to at least one of a diode chip, a power supply IC chip, a touch sensor IC chip, an MLCC chip, a BGA chip, and a chip condenser disposed in plural. As an example, a plurality of MLCC chips may be disposed on the flexible circuit board 100 for all-in-one chip on film.

In addition, the second chip C2 may include at least two of the diode chip, the power supply IC chip, the touch sensor IC chip, the MLCC chip, the BGA chip, and the chip condenser. That is, a plurality of different types of second chips C2a and C2b may be disposed on the flexible circuit board 100 for all-in-one chip on film. For example, the second chip C2a of any one of the diode chip, the power supply IC chip, the touch sensor IC chip, the MLCC chip, the BGA chip, and the chip condenser and one second chip C2b different from the any one of the diode chip, the power supply IC chip, the touch sensor IC chip, the MLCC chip, the BGA chip, and the chip condenser may be included on the flexible circuit board 100 for all-in-one chip on film.

Specifically, the second chip C2a of any one of the diode chip, the power supply IC chip, the touch sensor IC chip, the MLCC chip, the BGA chip, and the chip condenser may be disposed on the flexible circuit board 100 for all-in-one chip on film in plural, and the second chip C2b different from the any one of the diode chip, the power supply IC chip, the touch sensor IC chip, the MLCC chip, the BGA chip, and the chip condenser may be disposed thereon in plural. As an example, a plurality of MLCC chips C2a and a plurality of power supply IC chips C2b may be included on the flexible circuit board 100 for all-in-one chip on film. As an example, the plurality of MLCC chips C2a and a plurality of diode chips C2b may be included on the flexible circuit board 100 for all-in-one chip on film. As an example, the plurality of MLCC chips C2a and a plurality of BGA chips C2b may be included on the flexible circuit board 100 for all-in-one chip on film.

In the embodiment, a type of the second chip is not limited to two, and it is needless to say that all the various chips excluding the drive IC chip may be included in the second chip.

One end of the flexible circuit board 100 for all-in-one chip on film may be connected to a display panel 30. One end of the flexible circuit board 100 for all-in-one chip on film may be connected to the display panel 30 by an adhesive layer 50. Specifically, the display panel 30 may be disposed on an upper surface of the adhesive layer 50, and the flexible circuit board 100 for all-in-one chip on film may be disposed on a lower surface of the adhesive layer 50. Accordingly, the display panel 30 and the flexible circuit board 100 for all-in-one chip on film may be bonded vertically with the adhesive layer 50 interposed therebetween.

The other end opposite to the one end of the flexible circuit board 100 for all-in-one chip on film may be connected to a main board 40. The other end opposite to the one end of the flexible circuit board 100 for all-in-one chip on film may be connected to the main board 40 by an adhesive layer 50. Specifically, the main board 40 may be disposed on the upper surface of the adhesive layer 50, and the flexible circuit board 100 for all-in-one chip on film may be disposed on the lower surface of the adhesive layer 50. Accordingly, the main board 40 and the flexible circuit board 100 for all-in-one chip on film may be bonded vertically with the adhesive layer 50 interposed therebetween.

The adhesive layer 50 may include a conductive material. The adhesive layer 50 may be formed by dispersing conductive particles in an adhesive material. For example, the adhesive layer 50 may be an anisotropic conductive film (ACF).

Accordingly, the adhesive layer 50 may transmit electrical signals between the display panel 30, the flexible circuit board 100 for all-in-one chip on film, and the main board 40, and may stably connect other components.

Figure 4:
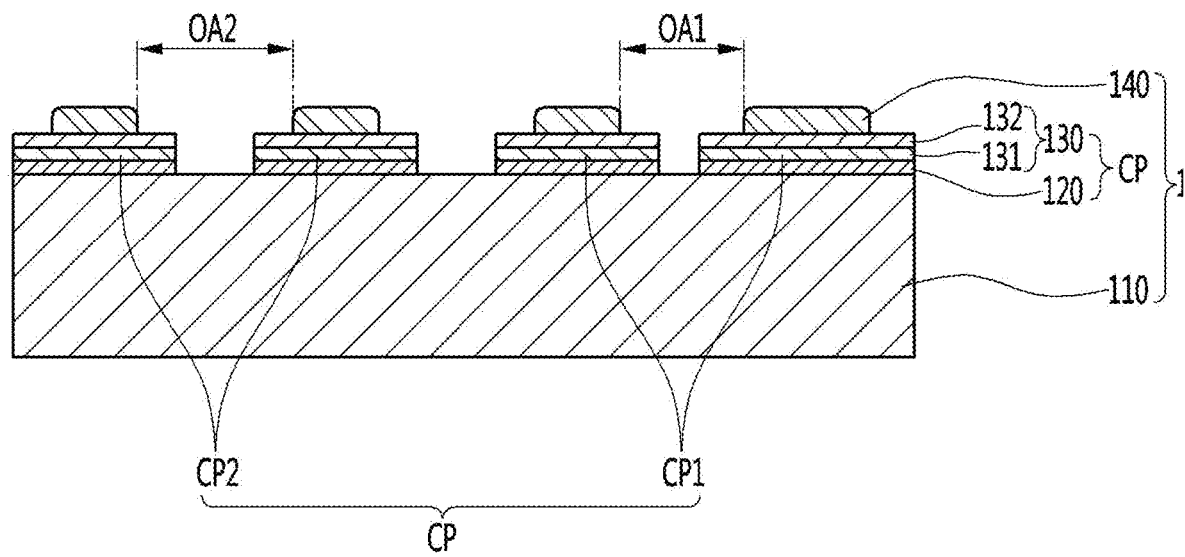
FIGS. 4 to 6 are cross-sectional views showing a manufacturing process of a chip package including a flexible circuit board for all-in-one chip on film according to an embodiment.
Figure 5:
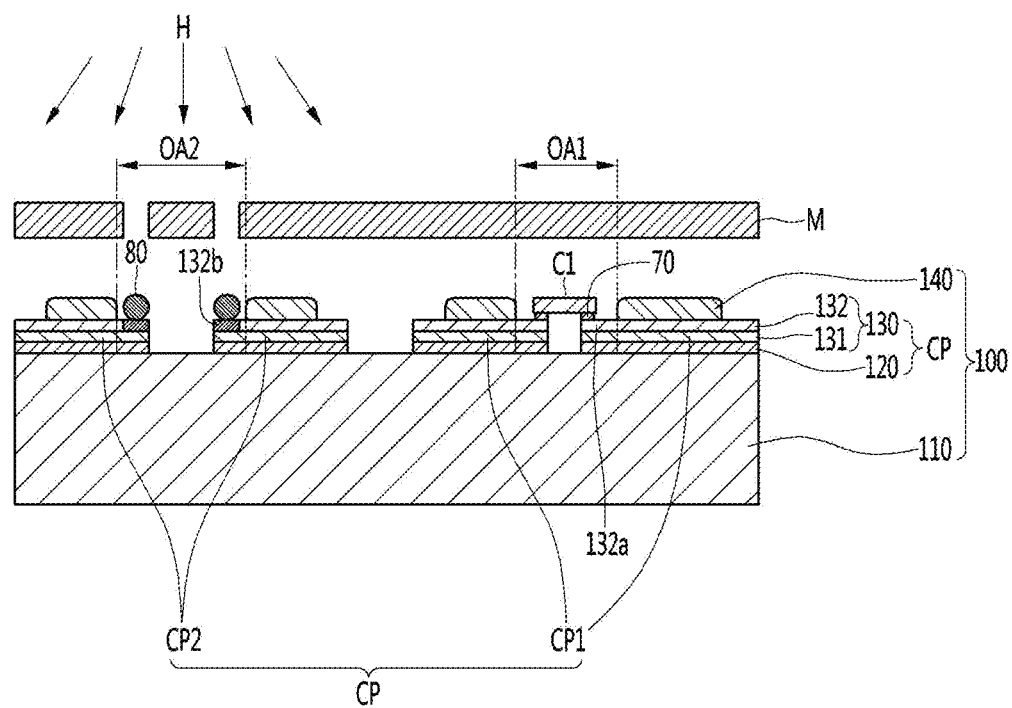
Figure 6:
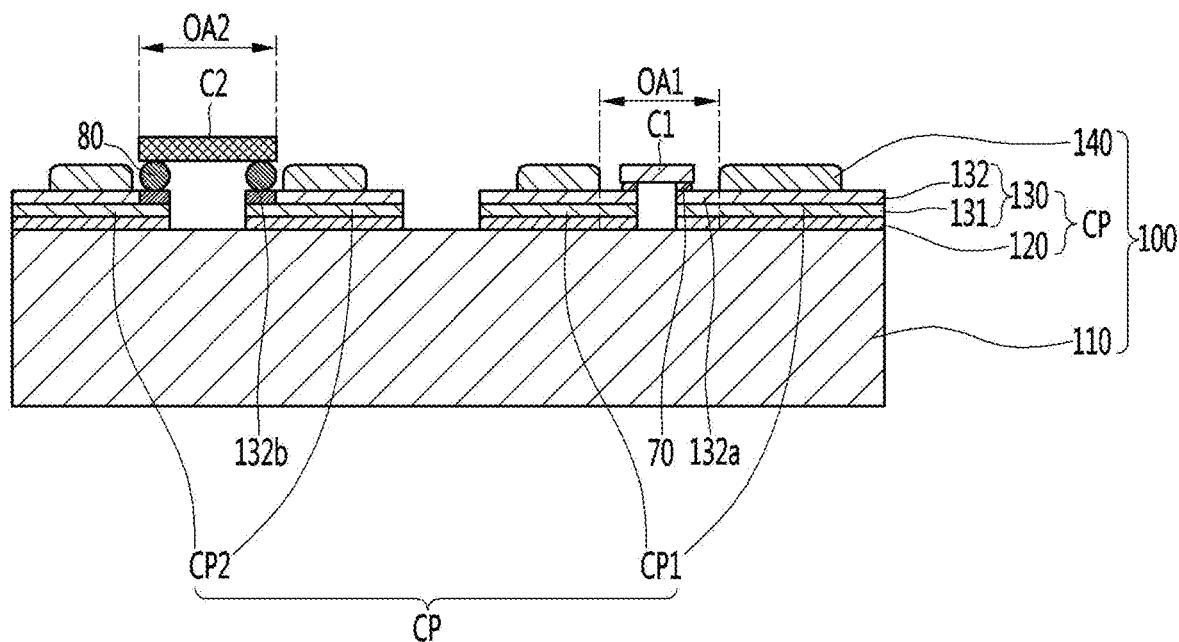

With reference to FIG. 4 to FIG. 6, a manufacturing process of a chip package including a flexible circuit board for all-in-one chip on film according to an embodiment will be described.

Referring to FIG. 4, a pattern layer 120, a conductive pattern part CP including a first plating layer 131 and a second plating layer 132, and a protective layer 140 may be disposed on one surface of a substrate 100 to prepare a flexible circuit board for all-in-one chip on film.

At this time, the protective layer 140 may include a first open region OA1 and a second open region OA2.

The second plating layer 132 may be exposed in the first open region OA1. In addition, the second plating layer 132 may be exposed in the second open region OA2.

With reference to FIGS. 5 and 6, a first step of disposing a first chip C1 and a second step of disposing a second chip C2 on a flexible circuit board for all-in-one chip on film according to an embodiment will be described.

First, a step of disposing the first chip C1 on the flexible circuit board for all-in-one chip on film according to the embodiment will be described.

A first connection part 70 may be disposed in the first open region OA1 of the flexible circuit board for all-in-one chip on film according to the embodiment.

In the first open region OA1, a tin (Sn) content of the second plating layer 132a may be 50 atomic % or more. In the first open region OA1, the second plating layer 132a may include a pure tin layer. For example, in the first open region OA1, the tin (Sn) content of the second plating layer 132a may be 70 atomic % or more. For example, in the first open region OA1, the tin (Sn) content of the second plating layer 132a may be 90 atomic % or more. For example, in the first open region OA1, the tin (Sn) content of the second plating layer 132a may be 95 atomic % or more. For example, in the first open region OA1, the tin (Sn) content of the second plating layer 132a may be 98 atomic % or more. In the first open region OA1, when the tin (Sn) content of the second plating layer 132 is less than 50 atomic %, the connection between the second plating layer 132 and the first chip C1 by the connection part 70 may be difficult. Specifically, in the first open region OA1, when the tin (Sn) content of the second plating layer 132 is less than 50 atomic %, the connection between the second plating layer 132 and the first chip C1 by the connection part 70 may be difficult.

The first connection part 70 may include gold (Au). The first connection part 70 may be a gold bump.

In order to dispose one first chip C1 on the flexible circuit board for all-in-one chip on film according to the embodiment, a plurality of the first connection parts 70 may be disposed between the first chip C1 and the second plating layer 132*a*.

The tin (Sn) content of the second plating layer 132 in the first open region OA1 is 50 atomic % or more, and thus adhesion characteristics with the first connection part 70 including gold (Au) may be excellent. In a chip package including the flexible circuit board for all-in-one chip on film according to the embodiment, the electrical connection between the first chip C1 and the conductive pattern may be excellent through the first connection part 70, and thus the reliability thereof may be improved.

Next, a step of disposing the second chip C2 on the flexible circuit board for all-in-one chip on film according to an embodiment will be described.

A second connection part 80 is disposed in the second open region OA2 of the flexible circuit board for all-in-one chip on film according to the embodiment.

In order to dispose the second chip C2 on the flexible circuit board for all-in-one chip on film according to the embodiment, heat H may be selectively applied only to a portion corresponding to a region in which the second connection part 80 is disposed via a mask M. Specifically, according to the embodiment, heat may be selectively supplied to the region in which the second connection part 80 for connecting the second chips C2 is disposed through a selective reflow process.

Specifically, in the flexible circuit board for all-in-one chip on film according to the embodiment, heat may be partially supplied through the selective reflow process even when the second chip C2 is disposed after the first chip C1 is mounted.

That is, a manufacturing process according to the embodiment may inhibit the first open region OA from being exposed to heat through the mask. Accordingly, it is possible to inhibit that the second plating layer positioned at the first open region OA from being modified from a pure tin layer to an alloy layer of tin and copper by supplying heat. Accordingly, even when the first chip C1 and the second chip C2 which are different from each other are mounted on one flexible circuit board 100 for all-in-one chip on film, the tin (Sn) content of the second plating layer 132*a* may be 50 atomic % or more in the first open region, and thus assembly of the drive IC chip may be excellent.

Meanwhile, a hole of the mask may be disposed in a region corresponding to the second open region OA2. Accordingly, in the second open region OA2, the plating layer exposed by heat may be modified to an alloy layer of tin and copper.

Specifically, a diffusion phenomenon of tin/copper may further progress in a portion of the second plating layer 132 exposed by heat via the hole of the mask. Accordingly, in the second open region OA2, the tin (Sn) content of the second plating layer 132*b* may be less than 50 atomic %. In the second open region OA2, the second plating layer 132*b* may be an alloy layer of copper (Cu) and tin (Sn).

The second connection part 80 may include a metal other than gold (Au). Accordingly, the second connection part 80 may be excellent in assembly performance with the second chip C2 even when the second plating layer 132*b* positioned under the second connection part 80 is not a pure tin layer. In addition, the second connection part 80 may include a metal other than gold (Au), and thus a manufacturing cost may be reduced.

For example, the second connection part 80 may include at least one of copper (Cu), tin (Sn), aluminum (Al), zinc (Zn), indium (In), lead (Pb), antimony (Sb), bismuth (bi), silver (Ag), and nickel (Ni).

The second connection part 80 may be a solder bump. The second connection part 80 may be a solder ball. The solder ball may be melted at a temperature of the reflow process.

In order to dispose one second chip C2 on the flexible circuit board for all-in-one chip on film according to the embodiment, a plurality of the second connection parts 80 may be disposed between the second chip C2 and the second plating layer 132*b*.

At the temperature of the reflow process, the second chip C2 may be bonded excellently with the second plating layer 132*b* on the second open region OA2 via the second connection part 80.

In the flexible circuit board for all-in-one chip on film according to the embodiment, connection of the first chip C1 may be excellent via the first connection part 70 in the first open region, and connection of the second chip C2 may be excellent via the second connection part 80 in the second open region.

The flexible circuit board for all-in-one chip on film according to the embodiment may include a plating layer having different tin (Sn) contents in the first open region OA1 and the second open region OA2, and thus assembly performance of the first chip C1 is excellent and assembly performance of the second chip C2 may be excellent.

As in a comparative example, after a first chip is mounted on a first printed circuit board and a second chip is mounted on a second printed circuit board, when the first printed circuit board including the first chip and the second printed circuit board including the second chip are bonded by an adhesive layer, a problem due to thermal modification of the first chip may not occur.

However, when different first and second chips are mounted on one substrate as in the embodiment, the second plating layer is modified by heat in the first open region of the protective layer for connecting the first chip, and thus there was a problem that it is difficult to assemble the first chip by the first connection part.

In order to solve such a problem, the first chip and the second chip were disposed in order on the flexible circuit board for all-in-one chip on film through a selective reflow process. Accordingly, in the flexible circuit board for all-in-one chip on film and the chip package including the same according to the embodiment, the tin content of the second plating layer in the first open region may be different from the tin content of the second plating layer in the first open region. Therefore, in the chip package including the flexible circuit board for all-in-one chip on film according to the embodiment, electrical connection between the first chip C1 and the second chip C2 which are different from each other may be excellent.

The first chip which is a drive IC chip may be stably mounted on the second plating layer including a pure tin layer in the first open region via the first connection part including gold (Au). In addition, the second chip which is at least one of a diode chip, a power supply IC chip, a touch sensor IC chip, an MLCC chip, a BGA chip, and a chip condenser may be stably mounted on the second plating layer including an alloy layer of copper and tin in the second open region via the second connection part including a metal other than gold (Au).

Accordingly, in the flexible circuit board for all-in-one chip on film and the chip package including the same according to the embodiment, different types of first and second chips may be mounted on one all-in-one flexible circuit board with excellent yield.

In addition, since a plurality of conventional printed circuit boards may be replaced with one flexible circuit board for all-in-one chip on film, the flexible circuit board for all-in-one chip on film for connecting a display panel and a main board may be reduced in size and thickness.

Therefore, an electronic device including the flexible circuit board for all-in-one chip on film of the embodiment may be easily mounted with various functional parts such as a camera module, an iris recognition module, and the like. In addition, the electronic device including the flexible circuit board for all-in-one chip on film of the embodiment may increase a battery space.

In addition, the flexible circuit board for all-in-one chip on film may be manufactured through a roll-to-roll process, and mounting of a chip on the flexible circuit board for all-in-one chip on film may be performed through a selective reflow process, and thus convenience of a manufacturing process and a manufacturing yield may be improved.

As described above, in the chip package including the single-side flexible circuit board for all-in-one chip on film, the first chip, the second chip, the display panel, and the main board may all be connected to the same one surface.

Such a single-side flexible circuit board for all-in-one chip on film may be difficult to realize a circuit having high resolution (QHD).

Recently, various electronic devices having a display unit such as a smartphone, a television, a monitor, electronic paper, a wearable device, and the like are required to realize a high-resolution display.

Accordingly, the flexible circuit board for all-in-one chip on film according to the embodiment may include a double-side flexible circuit board for all-in-one chip on film.

In the double-side flexible circuit board for all-in-one chip on film, a conductive pattern layer may be positioned on both sides of the board in order to realize a high-resolution display.

With reference to FIGS. 7, 8*a*, 8*b*, 9, and 10, the double-side flexible circuit board for all-in-one chip on film according to the embodiment will be described. The same drawing is given to the same component as the single-side flexible circuit board for all-in-one chip on film described above. Description of a thickness of each component, a material of each component, etc., which overlaps with those described above, is excluded.

FIGS. 7, 8*a*, 8*b*, and 9 are various cross-sectional views of the double-side flexible circuit board for all-in-one chip on film according to the embodiment centered on mounting of a first chip. That is, FIGS. 7, 8*a*, 8*b*, and 9 are views for describing various cross-sectional structures of a first conductive pattern part for mounting the first chip.

Referring to FIGS. 7, 8*a*, 8*b*, 9, and 10, the flexible circuit board 100 for all-in-one chip on film according to the embodiment may be a double-side flexible circuit board for all-in-one chip on film having electrode pattern parts on both sides thereof.

The flexible circuit board 100 for all-in-one chip on film according to the embodiment may include a substrate 110, a wiring pattern layer 120 disposed on the substrate 110, a plating layer 130, and a protective layer 140.

After the wiring pattern layer 120, the plating layer 130, and the protective layer 140 are disposed on one surface of the substrate 110 according to the embodiment, the wiring pattern layer 120, the plating layer 130, and the protective layer 140 are disposed on the other opposite to the one surface of the substrate 110.

That is, an upper wiring pattern layer, an upper plating layer, and an upper protective layer may be disposed on one surface of the substrate 110 according to the embodiment, and a lower wiring pattern layer, a lower plating layer, and a lower protective layer are disposed on the other surface opposite to the one surface of the substrate 110.

The upper wiring pattern layer may include a metal material corresponding to the lower wiring pattern layer. Accordingly, process efficiency may be improved. However, it is needless to say that the embodiment is not limited thereto, and may include other conductive materials.

A thickness of the upper wiring pattern layer may correspond to a thickness of the lower wiring pattern layer. Accordingly, process efficiency may be improved.

The upper plating layer may include a metal material corresponding to the lower plating layer. Accordingly, process efficiency may be improved. However, it is needless to say that the embodiment is not limited thereto, and may include other conductive materials.

A thickness of the upper plating layer may correspond to a thickness of the lower plating layer. Accordingly, process efficiency may be improved.

The substrate 110 may include a through-hole. The substrate 110 may include a plurality of through-holes. The plurality of through-holes of the substrate 110 may be formed individually or simultaneously by a mechanical process or a chemical process. For example, the plurality of through-holes of the substrate 110 may be formed by a drilling process or an etching process. As an example, the through-holes of the substrate may be formed through laser punching and desmearing processes. The desmearing process may be a process of removing a polyimide smear attached to an inner surface of the through-hole. By the desmearing process, an inner surface of the polyimide substrate may have an inclined surface similar to a straight line.

The wiring pattern layer 120, the plating layer 130, and the protective layer 140 may be disposed on the substrate 110. In detail, the wiring pattern layer 120, the plating layer 130, and the protective layer 140 may be sequentially disposed on both surfaces of the substrate 110.

The wiring pattern layer 120 may be formed by at least one method of evaporation, plating, and sputtering.

As an example, a wiring layer for forming a circuit may be formed by electrolytic plating after sputtering. For example, a wiring layer for forming a circuit may be a copper plating layer formed by electroless plating. Alternatively, the wiring layer may be a copper plating layer formed by electroless plating and electrolytic plating.

Next, a patterned wiring layer may be formed on both surfaces of a flexible circuit board, that is, on the upper and lower surfaces, after laminating a dry film on the wiring layer, through the processes of exposure, development, and etching. And thus the wiring pattern layer 120 may be formed.

Conductive materials may be filled in via holes V1, V2, and V3 passing through the substrate 110. The conductive material filled in a via hole may correspond to the wiring pattern layer 120, or may be different conductive materials. For example, the conductive material filled in a via hole may include at least one metal among copper (Cu), aluminum (Al), chromium (Cr), nickel (Ni), silver (Ag), molybdenum (Mo), gold (Au), titanium (Ti), and an alloy thereof. The electrical signal of the conductive pattern part CP on the upper surface of the substrate 110 may be transmitted to the conductive pattern part CP of the lower surface of the substrate 110 through the conductive material filled in a via hole.

Next, a plating layer 130 may be formed on the wiring pattern layer 120.

Thereafter, a protective part PP may be screen printed on the conductive pattern part CP.

The conductive pattern part CP may include the wiring pattern layer 120 and the plating layer 130. The area of the wiring pattern layer 120 may correspond to or be different from that of the plating layer 130. The area of the first plating layer 131 may correspond to or different from that of the second plating layer 132.

Figure 7:
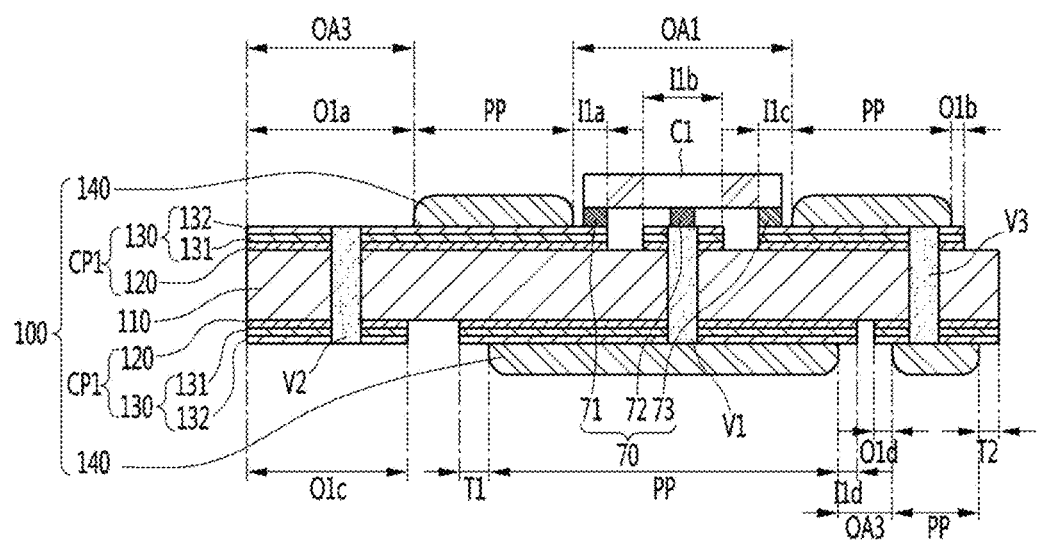
FIG. 7 is a cross-sectional view of a chip package including a double-side flexible circuit board for all-in-one chip on film according to an embodiment.

Referring to FIG. 7, the area of the wiring pattern layer 120 may correspond to the plating layer 130. The area of the first plating layer 131 may correspond to the area of the second plating layer 132.

Figure 8A:
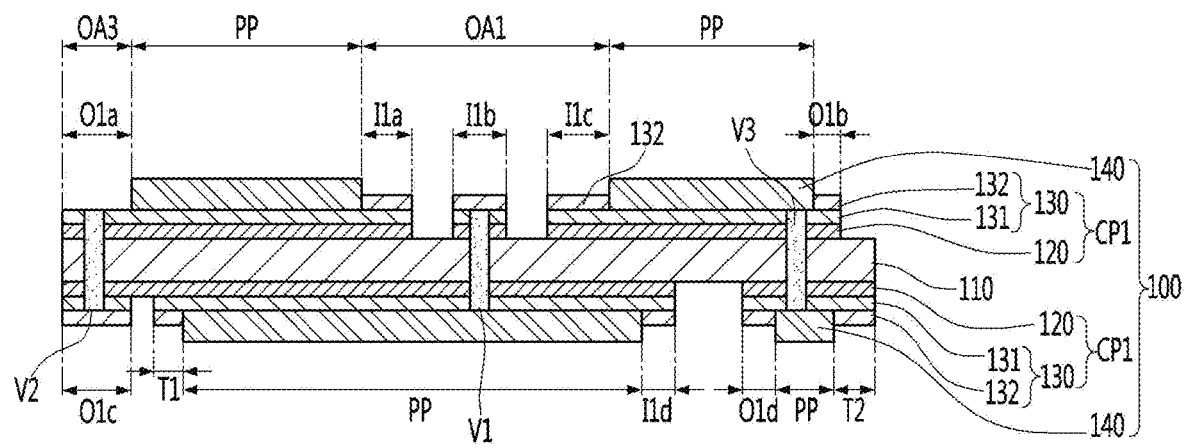
FIG. 8a is another cross-sectional view of a double-side flexible circuit board for all-in-one chip on film according to an embodiment.
Figure 8B:
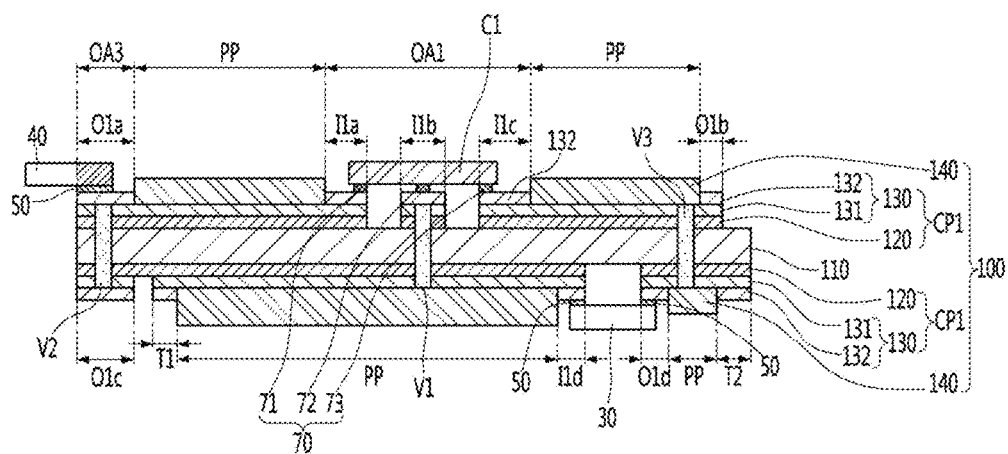

Referring to FIGS. 8a and 8b, the area of the wiring pattern layer 120 may be different from that of the plating layer 130. The area of the wiring pattern layer 120 may correspond to the area of the first plating layer 131. The area of the first plating layer 131 may be different from that of the second plating layer 132. For example, the area of the first plating layer 131 may be larger than that of the second plating layer 132.

Figure 9:
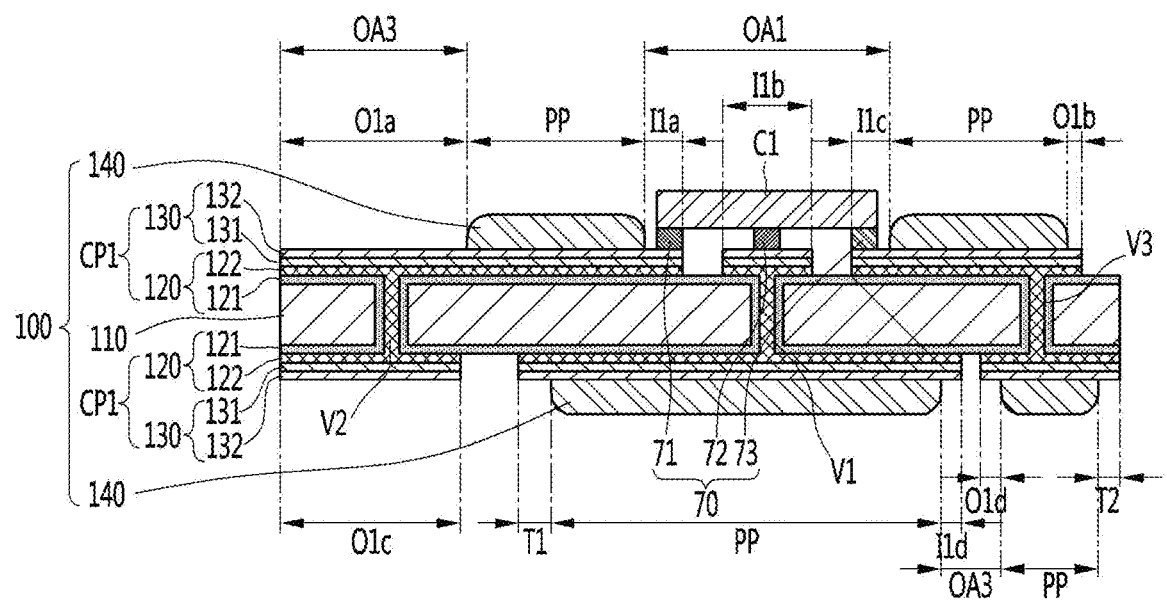
FIG. 9 is still another cross-sectional view of a chip package including a double-side flexible circuit board for all-in-one chip on film according to an embodiment.

Referring to FIG. 9, the area of the wiring pattern layer 120 may be different from that of the plating layer 130.

Figure 10:
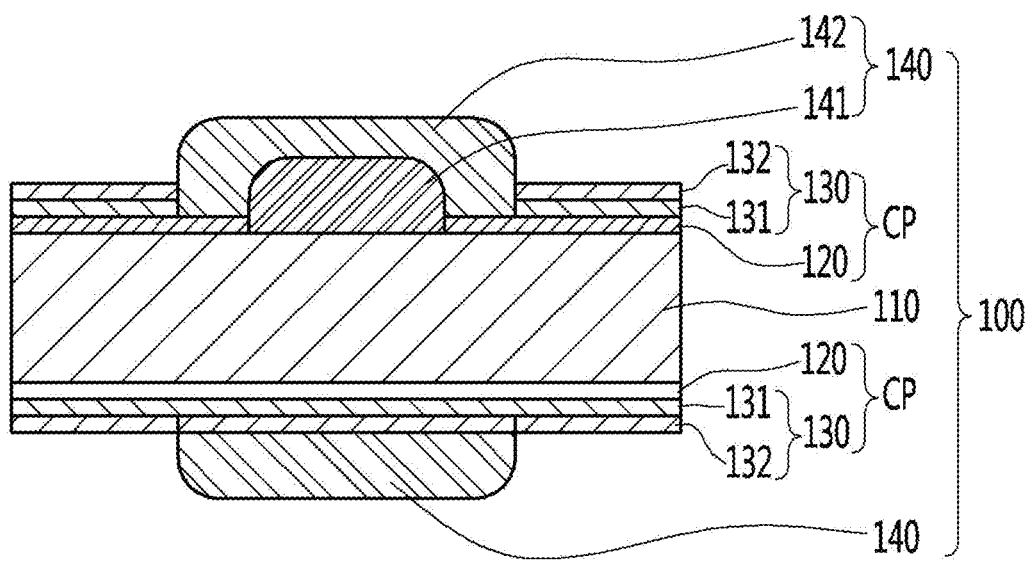
FIG. 10 is an enlarged cross-sectional view of one region of a double-side flexible circuit board for all-in-one chip on film according to an embodiment.

Referring to FIG. 10, the area of the wiring pattern layer 120 on one surface of the substrate 110 is different from that of the plating layer 130, and the area of the wiring pattern layer 120 on the other surface of the substrate 110 may correspond to the area of the plating layer. 130.

The protective layer 140 may be disposed on the substrate 110 in direct contact, disposed on the wiring pattern layer 120 in direct contact, or disposed on the first plating layer 131 in direct contact. or disposed on the second plating layer 132 in direct contact.

Referring to FIG. 7, the first plating layer 131 may be disposed on the wiring pattern layer 120, the second plating layer 132 may be formed on the first plating layer 131, and the protective layer 140 may be partially disposed on the second plating layer 132.

Referring to FIGS. 8a and 8b, the first plating layer 131 may be disposed on the wiring pattern layer 120, and the protective layer 140 may be partially disposed on the first plating layer 131. The second plating layer 132 may be disposed in a region other than a region in which the protective layer 140 is disposed on the plating layer 131.

The first plating layer 131 in contact with a lower surface of the protective layer 140 may be an alloy layer of copper and tin. The second plating layer 132 contacting a side surface of the protective layer 140 may include pure tin. Accordingly, formation of a cavity part between the protective layer 140 and the first plating layer 131 may inhibit the protective layer from being removed and inhibit formation of whiskers, thereby increasing adhesion of the protective layer. Therefore, the embodiment may include two layers of plating layers, and thus an electronic device with high reliability may be provided.

In addition, when only the single-layered tin plating layer 131 is disposed on the wiring pattern layer 120, and when the protective layer 140 is disposed on one tin plating layer 131, the tin plating layer 131 is heated when the protective layer 140 is thermally cured, and thus copper may diffuse into the tin plating layer 131. Accordingly, since the tin plating layer 131 may be an alloy layer of tin and copper, there is a problem that the first chip having a gold bump may be not firmly mounted. Therefore, the plating layer 130 according to the embodiment requires the first plating layer 131 and the second plating layer 132 that may continuously increase a tin concentration as a distance from the substrate increases.

Referring to FIG. 9, the first plating layer 131 may be disposed on the wiring pattern layer 120, and the protective layer 140 may be partially disposed on the first plating layer 131. The second plating layer 132 may be disposed in a region other than the region in which the protective layer 140 is disposed on the plating layer 131.

At this time, the wiring pattern layer 120 may include a first wiring pattern layer 121 and a second wiring pattern layer 122. That is, a plurality of wiring pattern layers may be disposed on the substrate.

In addition, although not shown in drawings, a metal seed layer for improving adhesion between the substrate 110 and the first wiring pattern layer 121 may be further included between the substrate 110 and the first wiring pattern layer 121. At this time, the metal seed layer may be formed by sputtering. The metal seed layer may include copper.

The first wiring pattern layer 121 and the second wiring pattern layer 122 may correspond to each other, or may be formed in different processes.

The first wiring pattern layer 121 may be formed by sputtering copper in a thickness of 0.1 μm to 0.5 μm. The first wiring pattern layer 121 may be disposed at upper and lower portions of the substrate and an inner side surface of the through-hole. At this time, since the first wiring pattern layer 121 is thin, the inner side surface of the through-hole may be spaced apart from each other.

Next, the second wiring pattern layer 122 may be disposed on the first wiring pattern layer 121. In addition, the second wiring pattern layer 122 may be entirely filled in the through-hole by plating.

Since the first wiring pattern layer 121 is formed by sputtering, the first wiring pattern layer 121 has an advantage of excellent adhesion to the substrate 110 or the metal seed layer, but a manufacturing cost is high, and thus the manufacturing cost may be reduced by forming again the second wiring pattern layer 122 on the first wiring pattern layer 121 by plating. In addition, the second wiring pattern layer 122 may be disposed on the first wiring pattern layer 121 and at the same time, the via hole may be filled with copper without separately filling the through-hole of the substrate with a conductive material, thereby improving process efficiency. Further, since it is possible to inhibit voids from being formed in the via hole, a highly reliable flexible circuit board for all-in-one chip on film and an electronic device including the same may be provided.

Referring to FIG. 10, a plurality of protective layers 140 may be disposed on one surface of the substrate. The protective layer may include a first protective layer 141 and a second protective layer 142.

For example, the first protective layer 141 may be partially disposed on one surface of the substrate, and the wiring pattern layer 120 may be disposed on a region other than the region in which the protective layer 141 is disposed.

The second protective layer 142 may be disposed on the protective layer 141. The second protective layer 142 may cover the first protective layer 141 and the wiring pattern layer 120, and may be disposed in a larger region than the first protective layer 141.

The protective layer 142 may be disposed on a region corresponding to the protective layer 141 while surrounding an upper surface of the first protective layer 141. A width of the second protective layer 142 may be larger than that of the protective layer 141. Accordingly, a lower surface of the second protective layer 142 may be in contact with the wiring pattern layer 120 and the first protective layer 141. Accordingly, the second protective layer 142 may relieve stress concentration at an interface between the first protective layer 141 and the wiring pattern layer 120. Therefore, when bending the flexible circuit board for all-in-one chip on film according to the embodiment, it is possible to reduce an occurrence of removal of a film or cracks.

The plating layer 130 may be disposed in a region other than the region in which the second protective layer 142 is disposed. Specifically, the first plating layer 131 may be disposed on the wiring pattern layer 120 in a region other than the region in which the second protective layer 142 is disposed, and the second plating layer 132 may be disposed on the first plating layer 131 in order.

The wiring pattern layer 120 may be disposed on the other surface opposite to the one surface of the substrate. The plating layer 130 may be disposed on the wiring pattern layer 120. The protective layer 140 may be partially disposed on the plating layer 130.

Widths of the protective layer disposed on one surface of the substrate and the protective layer disposed on the other surface of the substrate may correspond to each other or may be different from each other.

In the drawing, it is shown that a plurality of protective layers are disposed only on one surface of the substrate, but the embodiment is not limited thereto, and it is needless to say that the plurality of protective layers may be included on both surfaces of the substrate. In addition, it is needless to say that a plurality of or one protective layer may be disposed only on one surface of the substrate.

In addition, it is needless to say that a structure of one surface or both surfaces of the substrate may be variously disposed by combining structures of the conductive pattern part and the protective part according to at least one of FIGS. 7, 8a, 9, and 10.

Referring to FIGS. 7, 8a, 8b, 9, 11, and 12, connection relationship of the first chip C1, the display panel 30, and the main board 40 mounted on the double-side flexible circuit board 100 for all-in-one chip on film will be described.

The double-side flexible circuit board 100 for all-in-one chip on film according to the embodiment may include: a substrate 100 including a through-hole; a wiring pattern layer 120 disposed on both surfaces of the substrate including the through-hole; a first plating layer 131 disposed on the wiring pattern layer 120; a second plating layer 132 disposed on the first plating layer 131; and a protective layer 140 partially disposed on the wiring pattern layer.

A disposing region of the protective layer 400 in which the protective layer 140 is formed may be the protective part PP. The conductive pattern part CP may be exposed to the outside in a region other than the protective portion PP in which the protective layer 140 is not formed. That is, the conductive pattern part CP may be electrically connected to the first chip C1, the display panel 30, and the main board 40 in an open region of the protective layer or a region in which the protective part is not disposed on the conductive pattern part.

A lead pattern part and a test pattern part of the flexible circuit board for all-in-one chip on film according to the embodiment may not overlap with the protective part. That is, the lead pattern part and the test pattern part may refer to a conductive pattern part positioned in an open region that is not covered by a protective layer, and may be distinguished into a lead pattern part and a test pattern part according to functions.

The lead pattern part may refer to a conductive pattern part to be connected to the first chip, the second chip, the display panel, or the main board.

The test pattern part may refer to a conductive pattern part for checking whether the flexible circuit board for all-in-one chip on film according to the embodiment and a product of a chip package including the same is defective.

The lead pattern part may be distinguished into an inner lead pattern part and an outer lead pattern part depending on a location. One region of a conductive pattern part that is relatively close to the first chip C1 and is not overlapped by a protective layer may be represented as the inner lead pattern part. One region of a conductive pattern part that is positioned relatively far from the first chip C1 and is not overlapped by a protective layer may be represented as the outer lead pattern part.

Referring to FIGS. 7, 8a, 8b, 9, 11, and 12, a flexible circuit board 100 for all-in-one chip on film according to the embodiment may include a first sub first inner lead pattern part I1a, a second sub first inner lead pattern part I1b, a third sub first inner lead pattern part I1c, and a fourth sub first inner lead pattern part I1d The flexible circuit board 100 for all-in-one chip on film according to the embodiment may include a first sub first outer lead pattern part O1a, a second sub first outer lead pattern part O1b, a third sub first outer lead pattern part O1c, and a fourth sub first outer lead pattern part O1d.

The flexible circuit board 100 for all-in-one chip on film according to the embodiment may include a first test pattern part T1 and a second test pattern part T2.

The first sub first inner lead pattern part I1a, the second sub first inner lead pattern part I1b, the third sub first inner lead pattern part I1c, the first sub first outer lead pattern part O1a, and the second sub first outer lead pattern part O1b may be disposed on one surface of the flexible circuit board 100 for all-in-one chip on film according to the embodiment.

The fourth sub first inner lead pattern part I1d, the third sub first outer lead pattern part O1c, the fourth sub first outer lead pattern part O1d, the first test pattern part T1, and the second test pattern part T2 may be included on the other surface opposite to the one surface of the flexible circuit board 100 for all-in-one chip on film according to the embodiment The first chip C1 disposed on one surface of the flexible circuit board 100 for all-in-one chip on film according to the embodiment may be connected to the first sub first inner lead pattern part I1a, the second sub first inner lead pattern part I1b, or the third sub first inner lead pattern part I1c via a first connection part 70.

The first connection part 70 may include a first sub second connecting part 71, a second sub first connection part 72, and a third sub first connection part 73 depending on the location and/or function.

The first chip C1 disposed on one surface of the flexible circuit board 100 for all-in-one chip on film according to the embodiment may be electrically connected to the first sub first inner lead pattern part I1a via the first sub first connection part 71.

The first sub first inner lead pattern part I1a may transmit an electrical signal to the first sub first outer lead pattern part O1a adjacent to a second via hole V2 along the upper surface of the substrate 110. The second via hole V2 and the first sub first outer lead pattern part O1a may be electrically connected to each other. That is, the first sub first inner lead pattern part I1a and the first sub first outer lead pattern part O1a may be one end and the other end of the conductive pattern part extending in one direction.

For example, the main board 40 may be connected to the first sub first outer lead pattern part O1a via an adhesive layer 50. Accordingly, a signal transmitted from the first chip may be transmitted to the main board 40 via the first sub first inner lead pattern part I1a and the first sub first outer lead pattern part O1a In addition, the first sub first inner lead pattern part I1a may be electrically connected to the second via hole V2 along the upper surface of the substrate 110, and an electrical signal may be transmitted to the third sub first outer lead pattern part O1c adjacent to the second via hole V2 along the lower surface of the substrate 110 through the conductive material filled in the second via hole V2. The second via hole V2 may be electrically connected to the third sub first outer lead pattern part O1c. Accordingly, although not shown in the drawing, the main board 30 may be electrically connected to the third sub first outer lead pattern part O1e via the adhesive layer 50.

The first chip C1 disposed on one surface of the flexible circuit board 100 for all-in-one chip on film according to the embodiment may be electrically connected to the second sub first inner lead pattern part I1b via the second sub first connection part 72.

The second sub first inner lead pattern part I1b disposed on the upper surface of the substrate 110 may transmit an electrical signal to the fourth sub first inner lead pattern part I1d and the first test pattern part T1 adjacent to a first via hole V1 along the lower surface of the substrate 110 through a conductive material filled in the first via hole V1 positioned under the second sub first inner lead pattern part I1b. The first via hole V1, the first test pattern part T1, and the fourth sub first inner lead pattern part I1d may be electrically connected on the lower surface of the substrate.

The display panel 30 may be attached to the fourth sub first inner lead pattern part I1d and the fourth sub first outer lead pattern part O1d.

The first test pattern part T1 may confirm a failure of an electrical signal that may be transmitted through the first via hole V1. For example, accuracy of a signal transmitted to the fourth sub first inner lead pattern part I1d may be confirmed via the first test pattern part T1. In detail, by measuring a voltage or a current in the first test pattern part T1, it may be possible to confirm whether a short circuit or a short occurs or a generated location of the short circuit or short in the conductive pattern part positioned between the first chip and the display panel, thereby improving reliability of a product.

The first chip C1 disposed on one surface of the flexible circuit board 100 for all-in-one chip on film according to the embodiment may be electrically connected to the third sub first inner lead pattern part I1c via the third sub first connection part 73.

The third sub first inner lead pattern part I1c may transmit an electrical signal to the second sub first outer lead pattern part O1b adjacent to a third via hole V3 along the upper surface of the substrate 110. The third via hole V3 and the second sub first outer lead pattern part O1b may be electrically connected. That is, the third sub first inner lead pattern part I1c and the second sub first outer lead pattern part O1b may be one end and the other end of the conductive pattern part extending in one direction.

In addition, the third sub first inner lead pattern part I1c may be electrically connected to the third via hole V3 along the upper surface of the substrate 110, and an electrical signal may be transmitted to the fourth sub first outer lead pattern part O1d and the second test pattern part T2 adjacent to the third via hole V3 along the lower surface of the substrate 110 through the conductive material filled in the third via hole V3.

The second via hole V2, the fourth sub first outer lead pattern part O1d, and the second test pattern part T2 may be electrically connected at the lower surface of the substrate.

As described above, the display panel 30 may be attached to the fourth sub first inner lead pattern part I1d and the fourth sub first outer lead pattern part O1d through the adhesive layer 50.

The second test pattern part T2 may confirm a failure of an electrical signal that may be transmitted via the third via hole V3. For example, accuracy of a signal transmitted to the fourth sub first outer lead pattern part O1d may be confirmed via the second test pattern part T2. In detail, by measuring a voltage or a current in the second test pattern part T2, it may be possible to confirm whether a short circuit or a short occurs or a generated location of the short circuit or short in the conductive pattern part positioned between the first chip and the display panel, thereby improving reliability of a product.

The flexible circuit board for all-in-one chip on film according to the embodiment may dispose the display panel 30 on the other surface opposite to one surface on which the first chip C1 is disposed, thereby improving the degree of freedom of design. Further, the display panel is disposed on the other surface opposite to the one surface on which a plurality of chips are mounted, and thus it is possible to dissipate heat effectively. Accordingly, reliability of the flexible circuit board for all-in-one chip-on-film according to embodiment may be improved.

Figure 11:
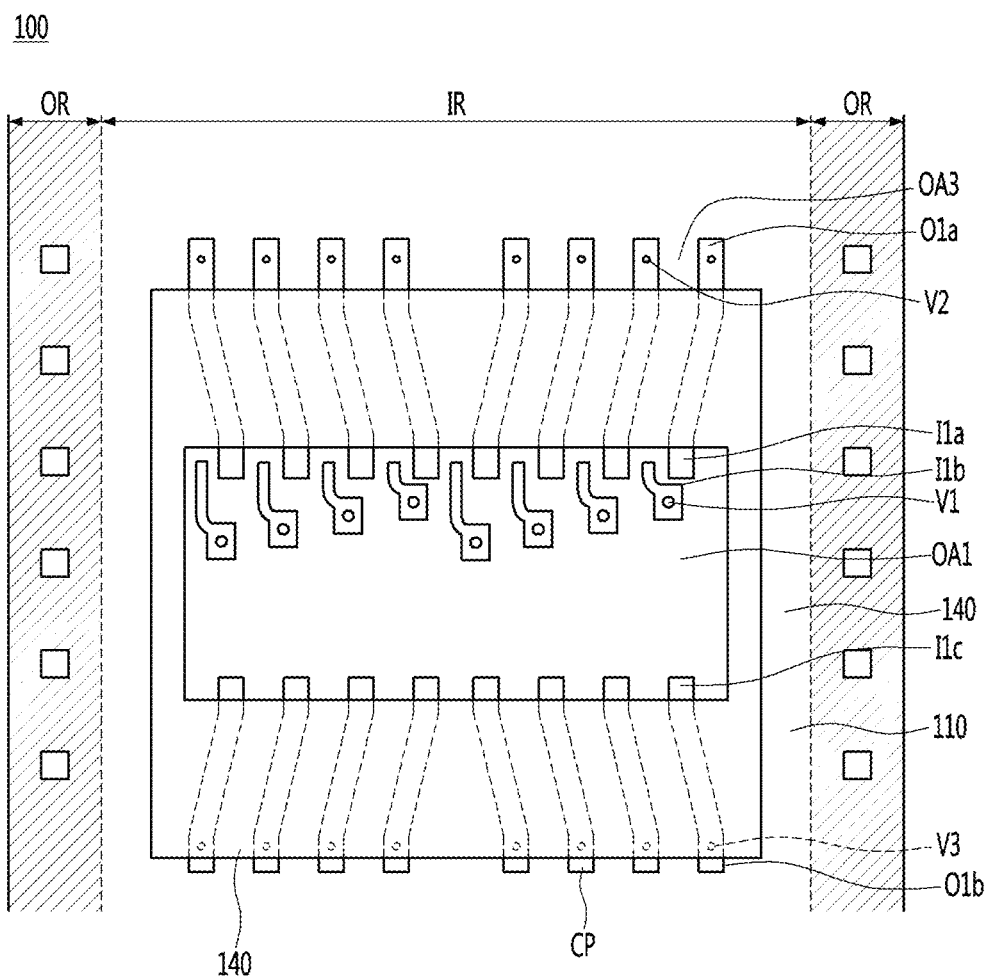
Figure 12:
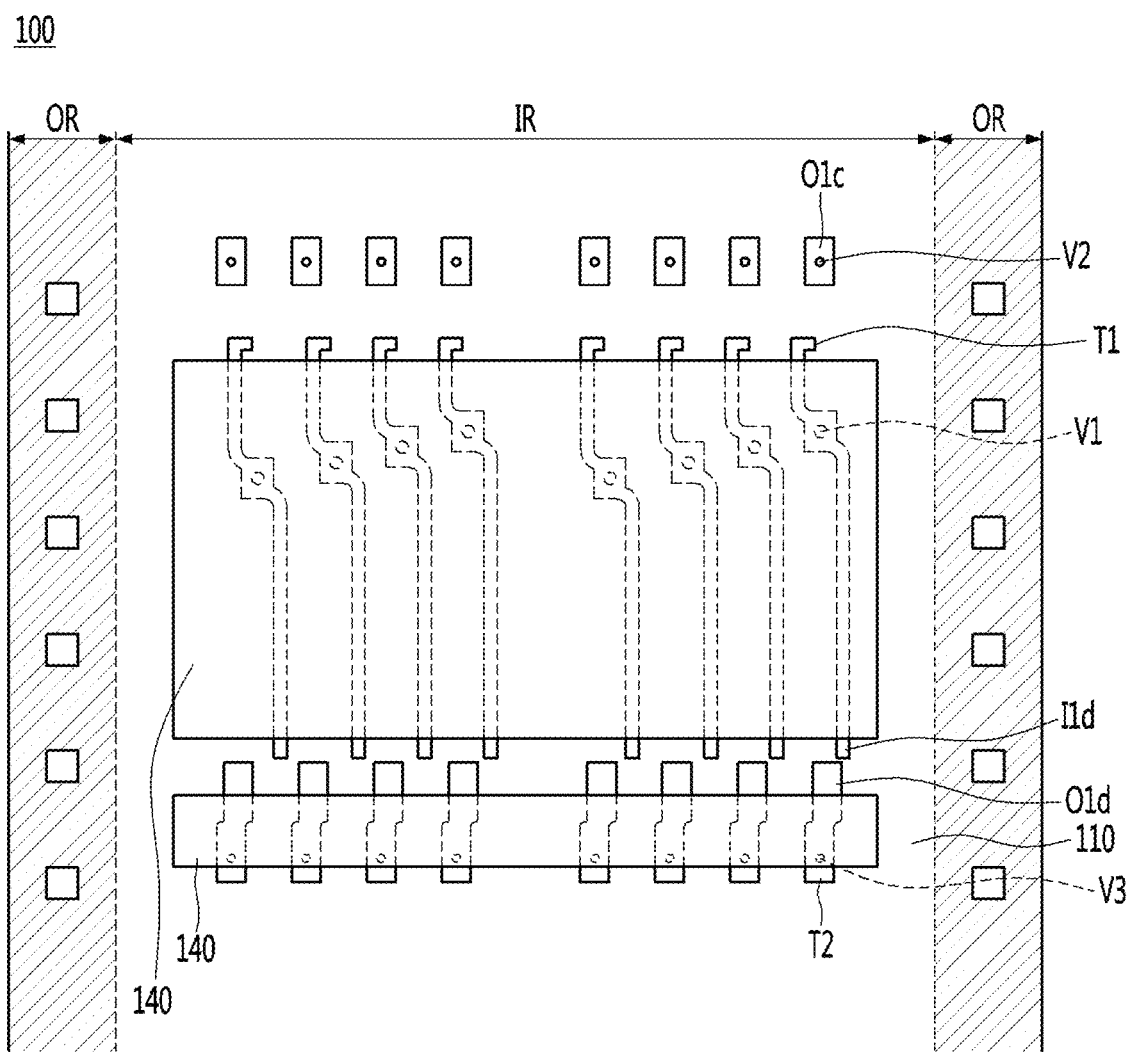

FIG. 11 is a plan view of FIG. 8a, and FIG. 12 is a bottom view of FIG. 8a.

FIG. 11 and FIG. 12 are plan views of an upper surface and a lower surface of the double-side flexible circuit board for all-in-one chip on film according to an embodiment centered on a first conductive pattern part for disposing a first chip.

Referring to FIGS. 11 and 12, the flexible circuit board 100 for all-in-one chip on film of the embodiment may include sprocket holes on both outsides in the longitudinal direction for convenience of manufacturing or processing. Accordingly, the flexible circuit board 100 for all-in-one chip on film of the embodiment may be rolled or unwound by sprocket holes in a roll-to-roll method.

The flexible circuit board 100 for all-in-one chip on film of the embodiment may be defined as an inner region IR and an outer region OR based on a cut portion indicated by a dotted line.

The conductive pattern part for connecting respectively the first chip, the second chip, the display panel, and the main board may be disposed in the inner region IR of the flexible circuit board 100 for all-in-one chip on film.

A chip package including the flexible circuit board 100 for all-in-one chip on film and an electronic device including the same may be processed by cutting a portion in which a sprocket hole is formed on the flexible circuit board 100 for all-in-one chip on film and disposing a chip on a substrate.

Referring to FIG. 11, on the upper surface of the flexible circuit board 100 for all-in-one chip on film, the first sub first inner lead pattern part I1a, the second sub first inner lead pattern part I1b, and the third sub first inner lead pattern part I1e which are one region of a conductive pattern part CP may be exposed to the outside via a first open region OA1 of the protective layer 140.

In addition, on the upper surface of the flexible circuit board 100 for all-in-one chip on film, the first sub first outer lead pattern part O1*a* which is one region of the conductive pattern part CP may be exposed to the outside via a third open region OA3 of the protective layer 140.

The first sub first inner lead pattern part I1*a* and the third sub first inner lead pattern part I1*c* may be a conductive pattern part connected to a chip via a first connection part.

End portions of the first sub first inner lead pattern part I1*a* and the third sub first inner lead pattern part I1*c* may be disposed in the same row. For example, a plurality of the first sub first inner lead pattern part I1*a* may be spaced apart from each other in a horizontal direction (x-axis direction) of a substrate, and the end portions of the first sub first inner lead pattern part I1*a* may be disposed in the same row. For example, a plurality of the third sub first inner lead pattern part I1*c* may be spaced apart from each other in a horizontal direction (x-axis direction) of the substrate, and the end portions of the third sub first inner lead pattern part I1*c* may be disposed in the same row. Accordingly, the first sub first inner lead pattern part I1*a* and the third sub first inner lead pattern part I1*c* may be excellent in bonding with the first connection part and the first chip.

A plurality of the second via holes V2 may be spaced apart from each other in a horizontal direction (x-axis direction) of the substrate, and may be disposed in the same row. A plurality of the third via holes V3 may be spaced apart from each other in a horizontal direction (x-axis direction) of the substrate, and may be disposed in the same row.

The end portion of the first sub first inner lead pattern part I1*a* may be spaced apart from an end portion of a second sub first inner lead pattern part I1*b*.

The second sub first inner lead pattern part I1*b* may be a conductive pattern that is not bonded to the first chip. At least one end portion of one end and the other end of the second sub first inner lead pattern part I1*b* may not be disposed in the same row.

For example, a plurality of the second sub first inner lead pattern part I1*b* may be spaced from each other in a horizontal direction (x-axis direction) of the substrate. In addition, a separation distance between at least one end portion of the one end and the other end of the second sub first inner lead pattern part I1*b* and the end of the first sub first inner lead pattern part I1*a* may decrease as closer to the horizontal direction (x-axis direction) of the substrate. A separation distance between at least one end of the one end and the other end of the second sub first inner lead pattern part I1*b* and the end of the first sub first inner lead pattern part I1*a* may increase as closer to the horizontal direction (x-axis direction) of the substrate.

A plurality of the first via holes V1 may be spaced apart from each other and disposed in different rows in a horizontal direction (x-axis direction) of the substrate.

A length between one end and the other end of the second sub first inner lead pattern part I1*b* is gradually decreased as closer to the horizontal direction (x-axis direction) of the substrate, and thus a first set part of the second sub first inner lead pattern parts I1*b* may be included. In detail, the length between the one end and the other end of the second sub first inner lead pattern part I1*b* is gradually decreased as closer to the horizontal direction (x-axis direction) of the substrate from a first length to a second length, and thus the first set part of the second sub first inner lead pattern parts I1*b* having a second length may be included. A plurality of first sets may be disposed on the substrate. Accordingly, a length of the second sub first inner lead pattern part I1*b* is gradually decreased as closer to the horizontal direction (x-axis direction) of the substrate from the second sub first inner lead pattern part I1*b* having a first length, and thus the second sub first inner lead pattern part I1*b* having the second length may be disposed. A plurality of second sub first inner lead pattern parts I1*b* having a length between the first length and the second length may be disposed between the second sub first inner lead pattern part I1*b* having the first length and the second sub first inner lead pattern part I1*b* having the second length. At this time, the length of the plurality of second sub first inner lead pattern parts I1*b* is gradually decreased as closer toward the second sub first inner lead pattern part I1*b* having the second length from the second sub first inner lead pattern part I1*b* having the first length. Again, the length between the one end and the other end of the second sub first inner lead pattern part I1*b* is gradually decreased as closer to the horizontal direction (x-axis direction) of the substrate from a first length to a second length, and thus a pattern in which the second sub first inner lead pattern parts I1*b* are spaced apart from each other may be repeated. At this time, the first length may be greater than the second length. A plurality of first sets may be disposed on the substrate. Therefore, the second sub first inner lead pattern part I1*b* having a length that is gradually decreased from the first length to the second length may be included on the substrate 110. The second sub first inner lead pattern part I1*b* adjacent to the second sub first inner lead pattern part I1*b* having the second length may have the first length again. Accordingly, the first set part of the second sub first inner lead pattern parts I1*b* of which length is gradually decreased from the first length to the second length as closer to the horizontal (x-axis direction) of the substrate and the first set part of the second sub first inner lead pattern parts I1*b* of which length is gradually decreased from the first length to the second length may be repeatedly disposed.

The separation distance between at least one end portion of the one end and the other end of the second sub first inner lead pattern part I1*b* and the end portion of the first sub first inner lead pattern part I1*a* may decrease as closer to the horizontal direction (x-axis direction) of the substrate.

A plurality of the first sub first inner lead pattern part I1*a* may be spaced apart from each other by a first distance.

One end portion of the second sub first inner lead pattern part I1*b* may be positioned in a region between two adjacent first sub first inner lead pattern parts I1*a* which are spaced apart from each other. In the horizontal direction of the substrate, the end portion of the first sub first inner lead pattern part I1*a* and the end portion of the second sub first inner lead pattern part I1*b* may be alternately disposed.

Referring to FIG. 12, on the lower surface of the flexible circuit board 100 for all-in-one chip on film, the fourth sub first inner lead pattern part I1*d* and the fourth sub first outer lead pattern part O1*d* which are one region of the conductive pattern part CP may be exposed to the outside via the third open region OA3 of the protective layer 140.

Referring to FIGS. 8*b*, and 13*a*-17*c*, a chip package including a first chip C1 and a second chip C2 on a double-side flexible circuit board 100 all-in-one chip on film according to an embodiment will be described in detail.

Figure 13A:
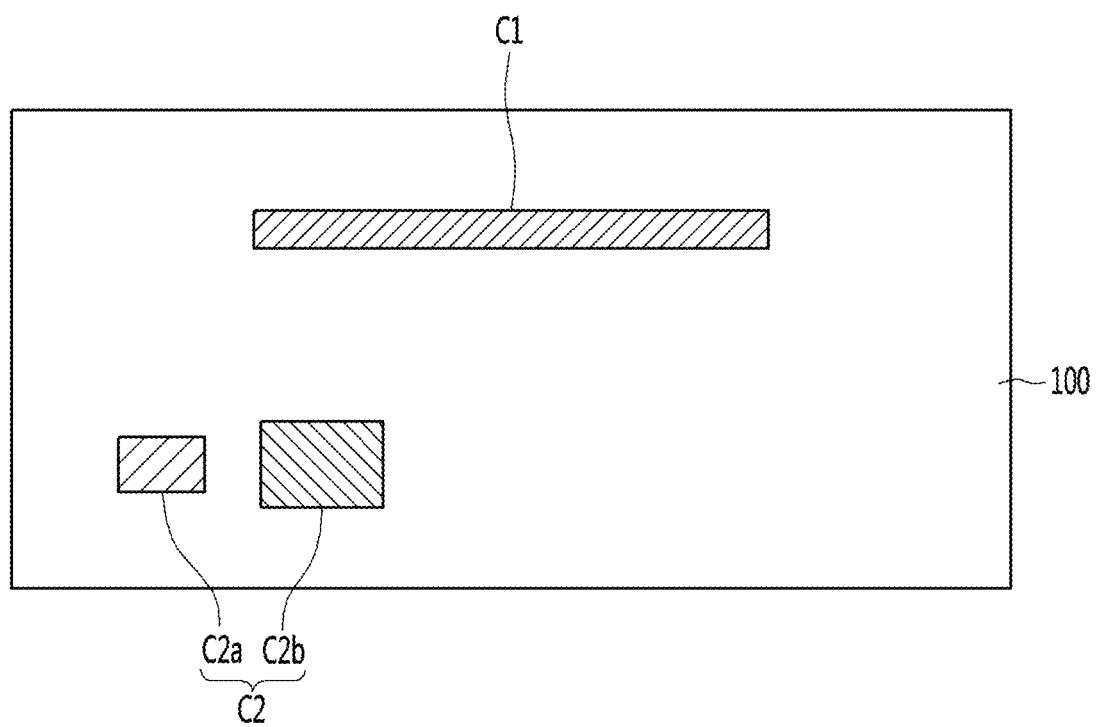
FIGS. 13a and 13b are schematic plan views of a chip package including the double-side flexible circuit board for all-in-one chip on film according to FIG. 8b.
Figure 13B:
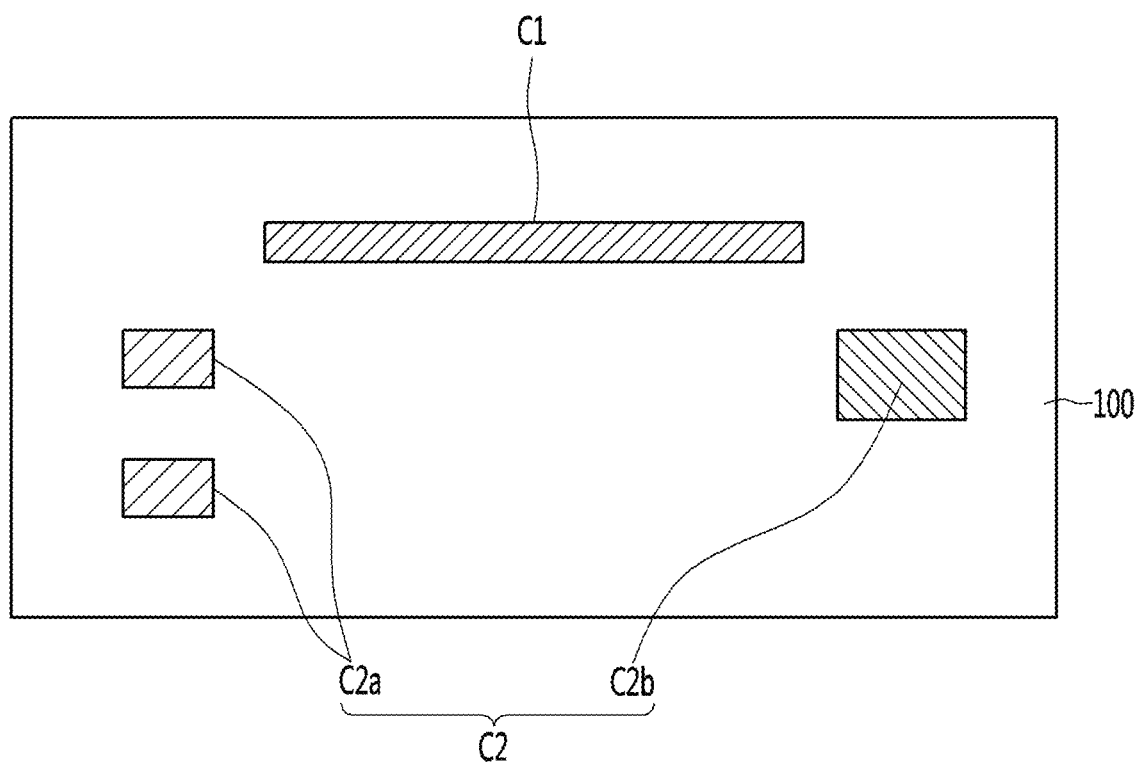

FIGS. 13*a* and 13*b* are schematic plan views of a chip package including a double-side flexible circuit board 100 for all-in-one chip on film according to an embodiment in which a first chip and a second chip are mounted.

With reference to FIGS. 13*a* and 13*b*, the double-side flexible circuit board 100 for all-in-one chip on film according to the embodiment may include the first chip C1 and the second chip C2 disposed on the same one surface.

In the double-side flexible circuit board 100 for all-in-one chip on film according to the embodiment, a length in a horizontal direction (x-axis direction) may be larger than a length in a vertical direction (y-axis direction). That is, the double-side flexible circuit board 100 for all-in-one chip on film according to the embodiment may include two long sides in the horizontal direction and two short sides in the vertical direction.

Each of the first chip C1 and the second chip C2 may have the length in the horizontal direction (x-axis direction) larger than the length in the vertical direction (y-axis direction). That is, the first chip C1 and the second chip C2 may include two long sides in the horizontal direction and two short sides in the vertical direction.

The long side of the double-side flexible circuit board 100 for all-in-one chip on film according to the embodiment may be disposed in parallel with the long side of the first chip C1 and the long side of the second chip C2, respectively, and thus a plurality of chips may be efficiently disposed on one double-side flexible circuit board 100 for all-in-one chip on film.

The length in the horizontal direction (long side) of the first chip C1 may be larger than the length in the horizontal direction (long side) of the second chip C2. The length in the vertical direction (short side) of the first chip C1 may be smaller than the length in the vertical direction (short side) of the second chip C2. Referring to FIG. 13a, the second chip C2 may be disposed at a lower portion of the first chip C1. At least a part or all of the long side of the first chip C1 and the long side of the second chip C2 may be overlapped vertically.

Referring to 13b, the second chip C2 may be disposed on a side portion of the first chip C1. The long side of the first chip C1 and the long side of the second chip C2 may not be overlapped vertically.

The first chip C1 is a drive IC chip, and the second chip C2 may include a second chip C2a of any one of a diode chip, a power supply IC chip, a touch sensor IC chip, an MLCC chip, a BGA chip, and a chip condenser and one second chip C2b different from the any one of the diode chip, the power supply IC chip, the touch sensor IC chip, the MLCC chip, the BGA chip, the chip condenser.

Figure 14A:
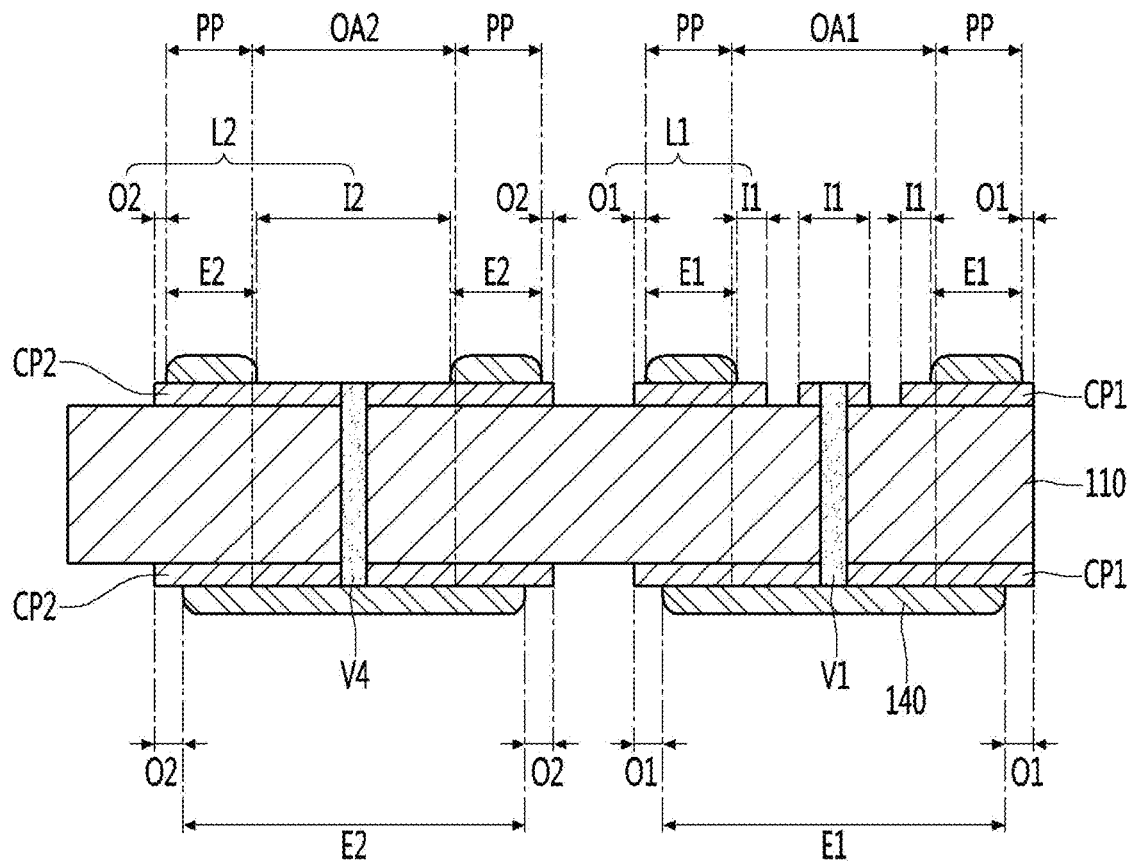
FIG. 14a is a cross-sectional view of the double-side flexible circuit board for all-in-one chip on film according to FIGS. 13a and 13b.

FIG. 14a is a cross-sectional view of a double-side flexible circuit board for all-in-one chip on film according to an embodiment showing a first conductive pattern part for disposing a first chip and a second conductive pattern part for disposing a second chip.

A double-side flexible circuit board 100 for all-in-one chip on film according to an embodiment includes: a substrate 110; a conductive pattern part CP disposed on the substrate; and a protective layer 140 disposed partially on the conductive pattern part, wherein the conductive pattern part may include a first conductive pattern part CP1 and a second conductive pattern part CP2 that are spaced apart from each other, wherein each of the first conductive pattern part and the second conductive pattern part may include a wiring pattern layer 120, a first plating layer 131, and a second plating layer 132 sequentially disposed on the substrate, the first conductive pattern part may include a first inner lead pattern part I1 positioned at one end of the first conductive pattern part, a first outer lead pattern part O1 positioned at the other end of the first conductive pattern part, and a first extension pattern part E1 connecting the one end and the other end of the first conductive pattern part, and the second conductive pattern part may include a second inner lead pattern part I2 positioned at one end of the second conductive pattern part, a second outer lead pattern part O2 positioned at the other end of the second conductive pattern part, and a second extension pattern part E2 connecting the one end and the other end of the second conductive pattern part.

A plurality of conductive pattern parts CP disposed to be spaced apart from each other may be disposed on one surface and the other surface of the substrate. The first conductive pattern part CP1 and the second conductive pattern part CP2 disposed to be spaced apart from each other may be included on the one surface of the substrate. In addition, the first conductive pattern part CP1 and the second conductive pattern part CP2 disposed to be spaced apart from each other may be included on the other surface of the substrate. The first conductive pattern part CP1 and the second conductive pattern part CP2 may be spaced apart from each other in order to transmit signals of different first and second chips.

An upper first conductive pattern part CP1 disposed on one surface of the substrate may be electrically connected to a lower first conductive pattern part CP1 disposed on the other surface of the substrate through a via. For example, the upper first conductive pattern part CP1 disposed on the one surface of the substrate may be electrically connected to the lower first conductive pattern part CP1 disposed on the other surface of the substrate through a conductive material filled in a first via hole V1.

In addition, an upper second conductive pattern part CP2 disposed on one surface of the substrate may be electrically connected to a lower second conductive pattern part CP2 disposed on the other surface of the substrate through a via. For example, the upper second conductive pattern part CP2 disposed on the one surface of the substrate may be electrically connected to the lower second conductive pattern part CP2 disposed on the other surface of the substrate through a conductive material filled in a fourth via hole V4.

Accordingly, the embodiment may include a large number of conductive pattern parts on one substrate.

Figure 14B:
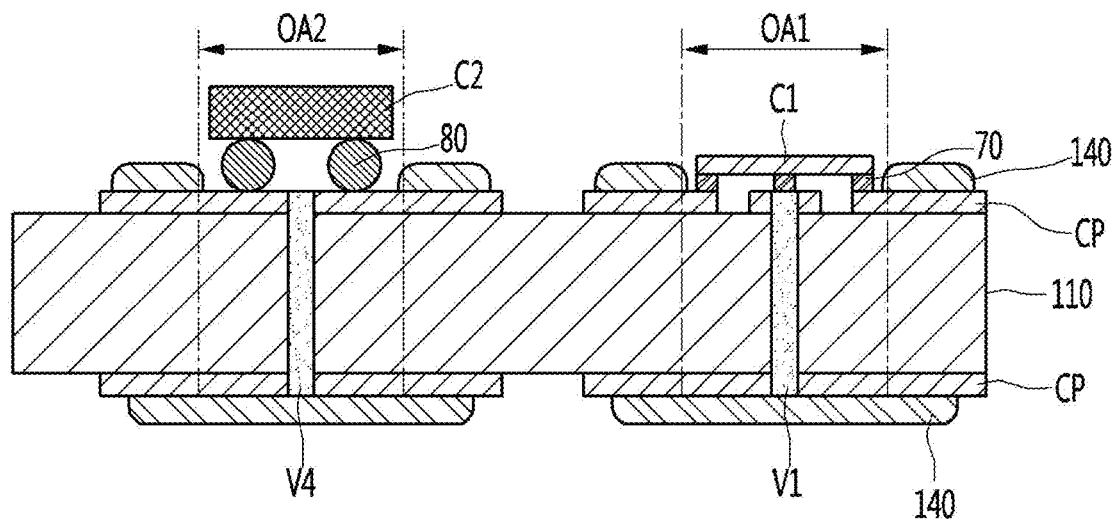

FIG. 14b is a cross-sectional view of a chip package including a double-side flexible circuit board for all-in-one chip on film according to an embodiment in which a first chip and a second chip are mounted.

The first chip C1 and the second chip C2 may be disposed in different sizes on the same one surface. For example, the second chip C2 may be larger than the first chip C1.

A via hole may be disposed at a lower portion of the first chip C1 and the second chip C2. That is, a substrate 110 in a region corresponding to the first open region OA1 and the second open region OA2 may include the via hole.

An electrical signal of the first chip C1 may be transmitted from an upper surface to a lower surface of the substrate through a conductive material disposed in a first via hole V1.

An electrical signal of the second chip C2 may be transmitted from the upper surface to the lower surface of the substrate through a conductive material disposed in a fourth via hole V4.

The second connection part 80 may be larger than the first connection part 70. A width of a first sub second inner lead pattern part I2a or a second sub second inner lead pattern part I2b exposed through the second open region is larger than that of a first sub first inner lead pattern part I1a exposed through the first open region, which are measured at the plane of the substrate, so that the second connection part 80 be larger than the first connection part 70. In addition, a height (thickness) of the second connection part 80 measured at a cross-sectional surface of the substrate may be greater than a height (thickness) of the first connection part 70. A step of disposing the first chip C1 and second chips C2a and C2b on the flexible circuit board 100 for all-in-one chip on film will be described with reference to FIGS. 14a and 14b.

The first chip C1 may be disposed on the first connection part 70.

The second chip C2 may be disposed on the second connection part 80.

The first chip C1 and the second chip C2 may be disposed to be spaced apart at a predetermined distance in order to inhibit problems such as signal interference, disconnection failures, failures due to heat, or the like.

FIG. 15a, FIG. 15b, FIG. 15c, FIG. 16a, FIG. 16b, FIG. 16c FIG. 17a, FIG. 17b and FIG. 17c are views showing a process for manufacturing a chip package including the double-side flexible circuit board for all-in-one chip on film according to FIGS. 13a and 13b.

Figure 15A:
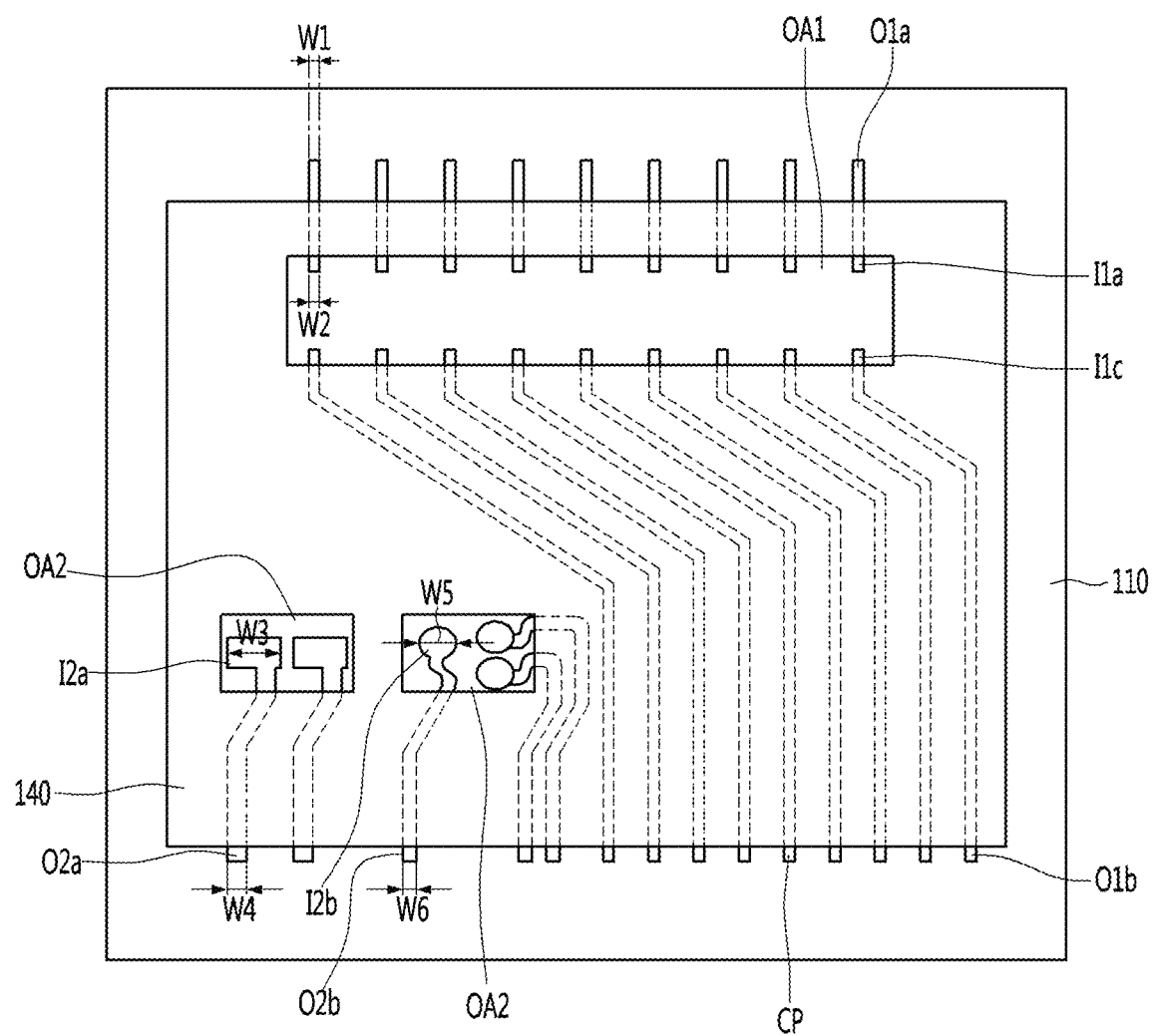
FIGS. 15a, 15b, 15c, 16a, 16b, 16c, 17a, 17b and 17c are views showing a process of manufacturing the double-side flexible circuit board for all-in-one chip on film according to FIG. 14a into a chip package including the double-side flexible circuit board for all-in-one chip on film according to FIG. 14b.
Figure 15B:
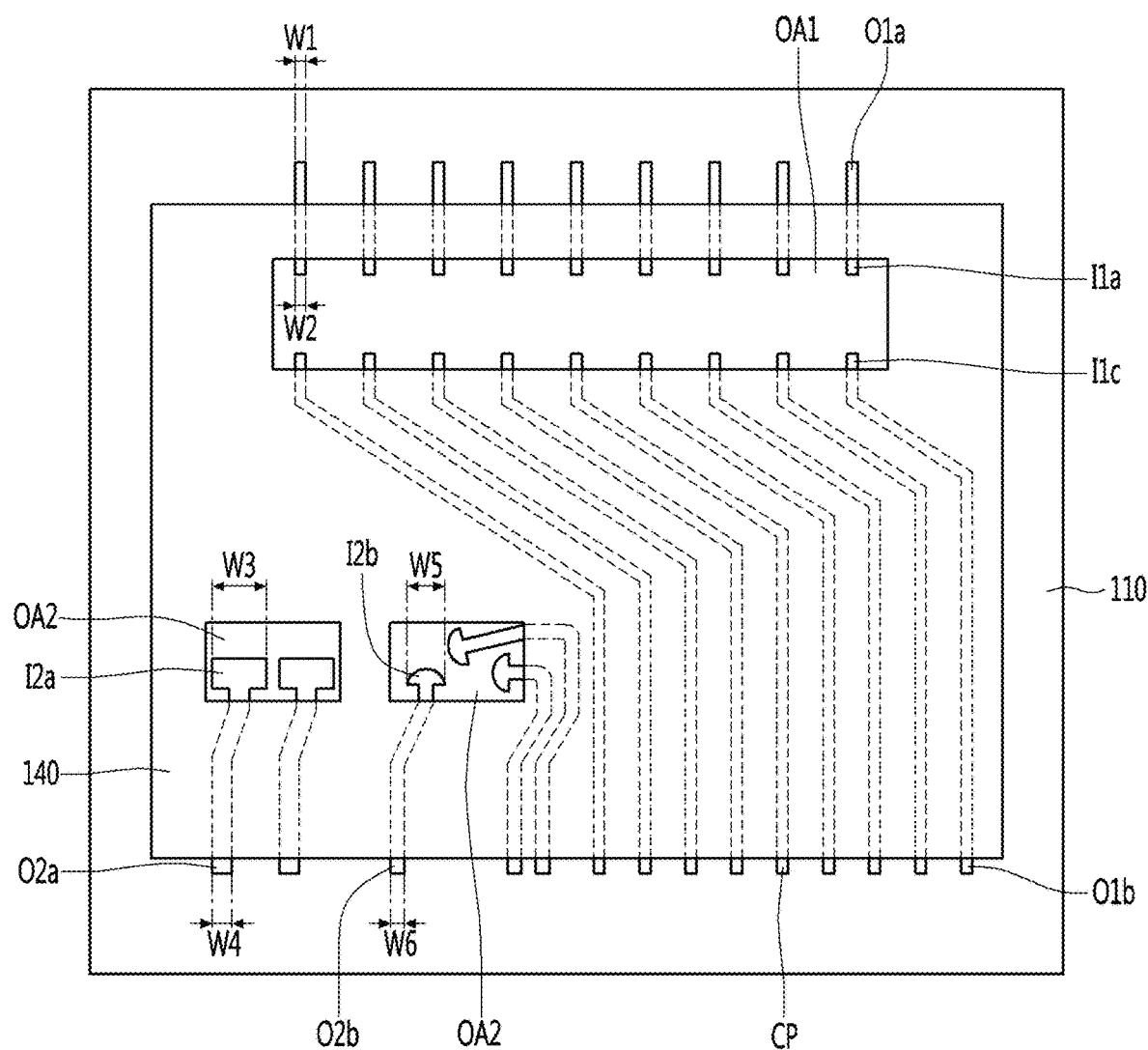
Figure 15C:
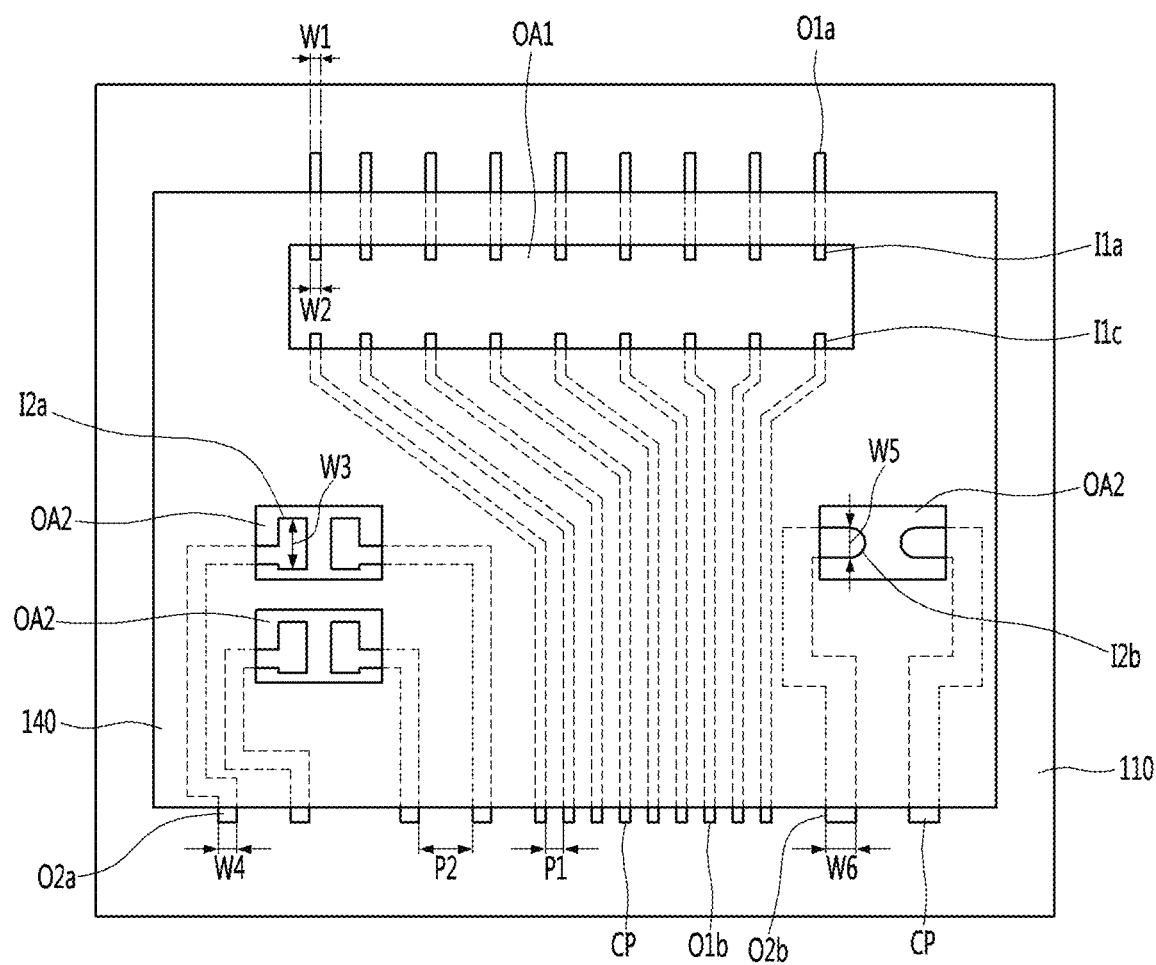

FIG. 15a, FIG. 15b and FIG. 15c are plan views of a double-side flexible circuit board 100 for all-in-one chip on film according to an embodiment.

Referring to FIGS. 14a, 15a, 15b and 15c, the first lead pattern part L1 may include a different shape from that of the second lead pattern part L2. Accordingly, the embodiment may improve adhesion characteristics of the second chip as compared with the chip package of a comparative example.

The flexible circuit board for all-in-one chip on film according to the embodiment may include the second lead pattern part having a shape different from that of the first lead pattern part, thereby improving tensile strength.

A chip package in which a first chip and a second chip are mounted on the flexible circuit board for all-in-one chip on film according to the embodiment was pulled to the short side (y-axis direction) of the substrate to measure a tensile strength, and a second printed circuit board 20 on which the second chip of the comparative example is mounted was pulled to the short side (y-axis direction) to measure the tensile strength.

In the embodiment, it was confirmed that average tensile strength was improved as compared with the comparative example.

It was confirmed that the tensile strength of the embodiment increased by 0.1 kgf to 1 kgf compared to the tensile strength of the comparative example depending on a type of a chip included in the second chip. It was confirmed that the tensile strength of the embodiment increased by 0.1 kgf to 0.5 kgf compared to the tensile strength of the comparative example. It was confirmed that the tensile strength of the embodiment increased by 0.14 kgf to 0.45 kgf compared to the tensile strength of the comparative example.

In addition, different types of the first chip and the second chip are mounted on one substrate, and thus the first lead pattern part and the second lead pattern part having different shapes may be an optimal pattern design for ensuring a predetermined bonding strength.

For example, a shape of the first inner lead pattern part I1 in a plane may be a square stripe pattern. Specifically, the shape of the first inner lead pattern part I1 in the plane may be a square stripe pattern having a uniform width and extending in one direction. As an example, widths of one end and the other end of the first inner lead pattern part I1 may be the same.

A shape of the second inner lead pattern part I2 in a plane may be a pattern in which at least one or any one of end portion protrudes. For example, the shape of the second inner lead pattern part I2 in the plane may be a protrusion pattern having various shapes such as a polygonal shape, a circular shape, an elliptical shape, a hammer shape, a T shape, a random shape, and the like. Specifically, the shape of the second inner lead pattern part I2 in the plane has a variable width, and may be a protruding pattern such as a polygonal shape, a circular shape, an elliptical shape, a hammer shape, a T shape, a random shape, and the like extending in a direction different from the one direction. As an example, widths of one end and the other end of the second inner lead pattern part I2 may be different from each other. The width of the other end which is an end portion far from the protective layer may be larger than that of the one end of the second inner lead pattern part I2 near the protective layer. However, the embodiment is not limited thereto, and of course, the width of the other end which is the end portion far from the protective layer may be smaller than that of the one end of the second inner lead pattern part I2 near the protective layer.

At least one of the first inner lead pattern part I1: I1a, I1b, I1c, I1d and the first outer lead pattern part O1: O1a, O1b, O1c, O1d included in the first lead pattern part L1 may include a different shape from at least one of the second inner lead pattern part I2: I2a, I2b and the second outer lead pattern part O2: O2a, O2b included in the second lead pattern part L1.

For example, in the plan view, a shape of any one pattern part of the first sub first outer lead pattern part O1a, the first sub first inner lead pattern part I1a, the third sub first inner lead pattern part I1c, and the second sub first outer lead pattern part O1b may be different from a shape of any one pattern part of the first sub second inner lead pattern part I2a and the second sub second inner lead pattern part I2b.

As an example, when the second chip is an MLCC chip, the second lead pattern part may have a protruding T shape like the first sub second inner lead pattern part I2a of FIG. 15b. A width of the first sub second inner lead pattern part I2a of FIG. 15b may be larger than that of the first sub second outer lead pattern part O2a.

As an example, when the second chip is a BGA chip, the second lead pattern part may be a protruding circular shape like the second sub second inner lead pattern part I2b of FIG. 15a. A width of the second sub second inner lead pattern part I2b of FIG. 15a may be larger than that of the second sub second outer lead pattern part O2b. The width of the second sub second inner lead pattern part I2b of FIG. 15a may be the maximum diameter measured in a central region of a circular pattern part thereof.

Alternatively, when the second chip is a BGA chip, the second lead pattern part may be a protruding semicircular shape or a shape in which a protruding end is rounded like the second sub second inner lead pattern part I2b of FIG. 15b.

As an example, when the second chip is a BGA chip, the second lead pattern part may be a rounded end shape like the second sub second inner lead pattern part I2b of FIG. 15c. A width of the second sub second inner lead pattern part I2b of FIG. 15c may be smaller than that of the second sub second outer lead pattern part O2b. The width of the second sub second inner lead pattern part I2b of FIG. 15c may be smaller than that of the second sub second outer lead pattern part O2b toward an end thereof.

Shapes of the first inner lead pattern part and the first connection part may be the same. For example, shapes of planes (top view) of the first inner lead pattern part and the first connection part may be a quadrangular shape. Here, the fact that the first inner lead pattern part and the first connection part have the same shape means that the top view is the same polygon, and may include that sizes are different.

Shapes of the second inner lead pattern part and the second connection part may be the same or different from each other.

Figure 16A:
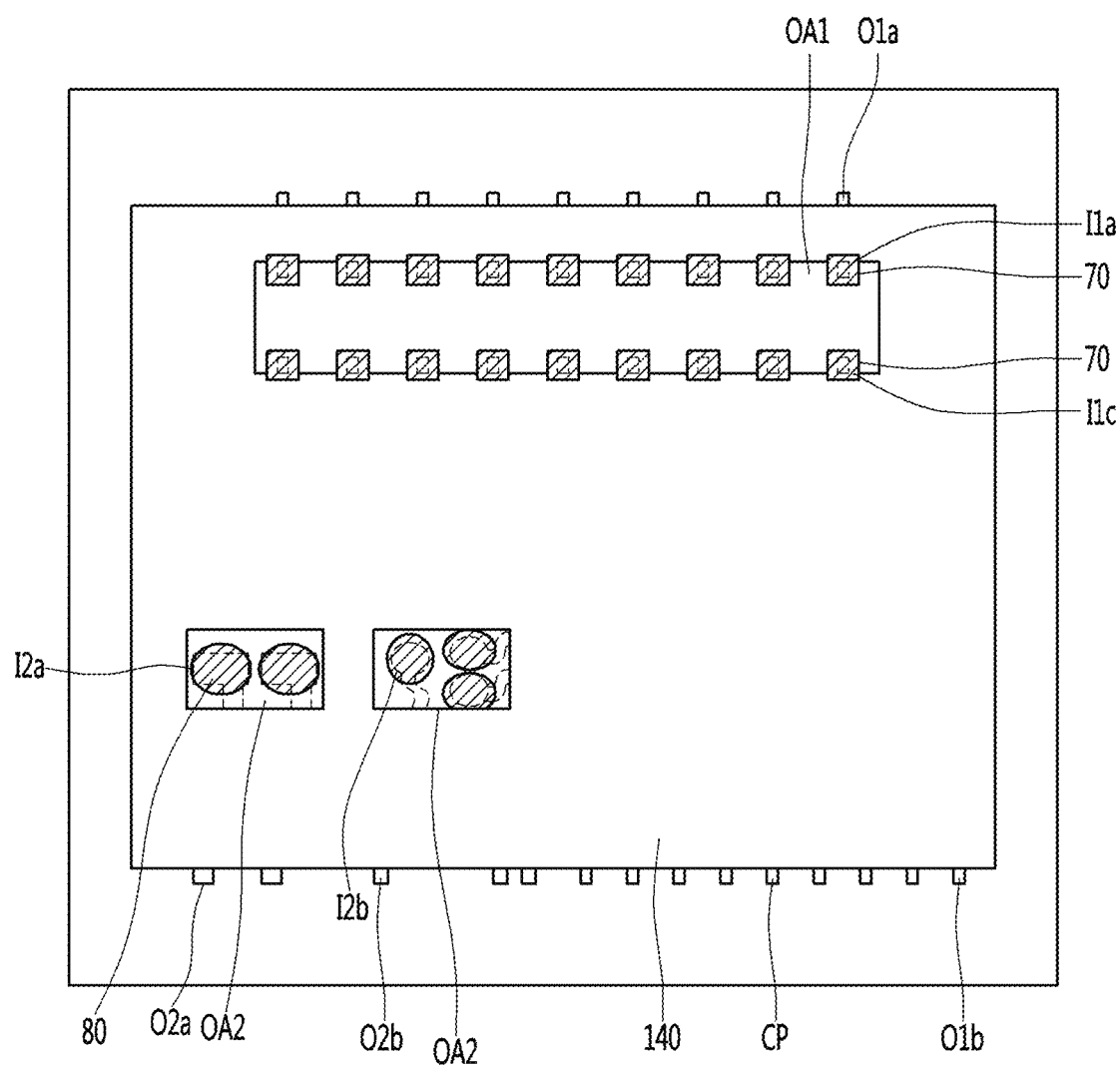

Referring to FIG. 15a and FIG. 16a, the top view of the first sub second inner lead pattern part I2a may be a polygonal shape, and the top view of the second connection part may be a circular shape. The top view of the second sub second inner lead pattern part I2b may be a circular shape, and the second connection part may be a circular shape.

Figure 16B:
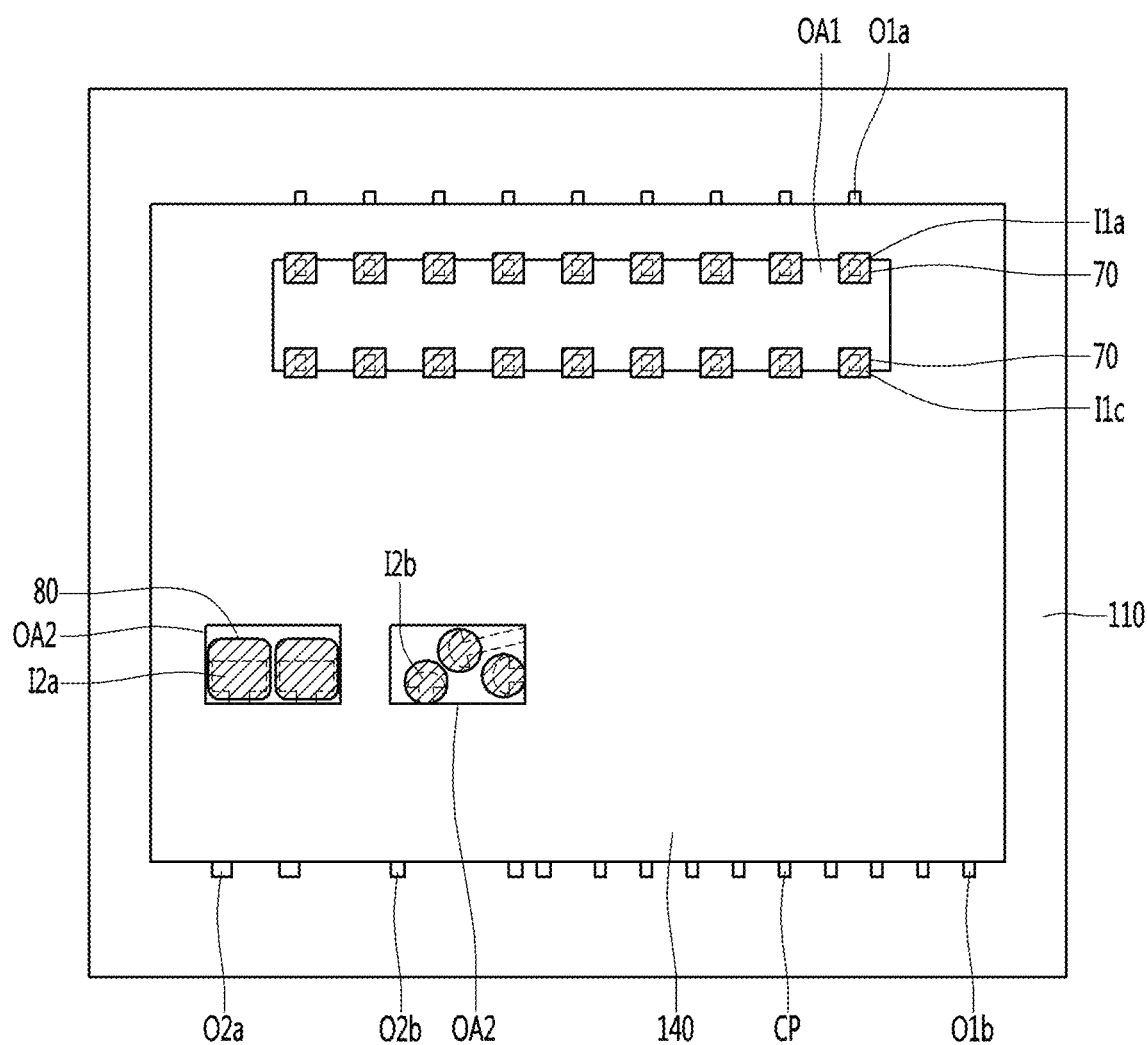

Referring to FIG. 15b and FIG. 16b, the top view of the first sub second inner lead pattern part I2a may be a polygonal shape, and the second connection part may be a quadrangular shape having rounded corners. The top view of the second sub second inner lead pattern part I2b may be a protruding semicircular shape, and the second connection part may be a circular shape.

Figure 16C:
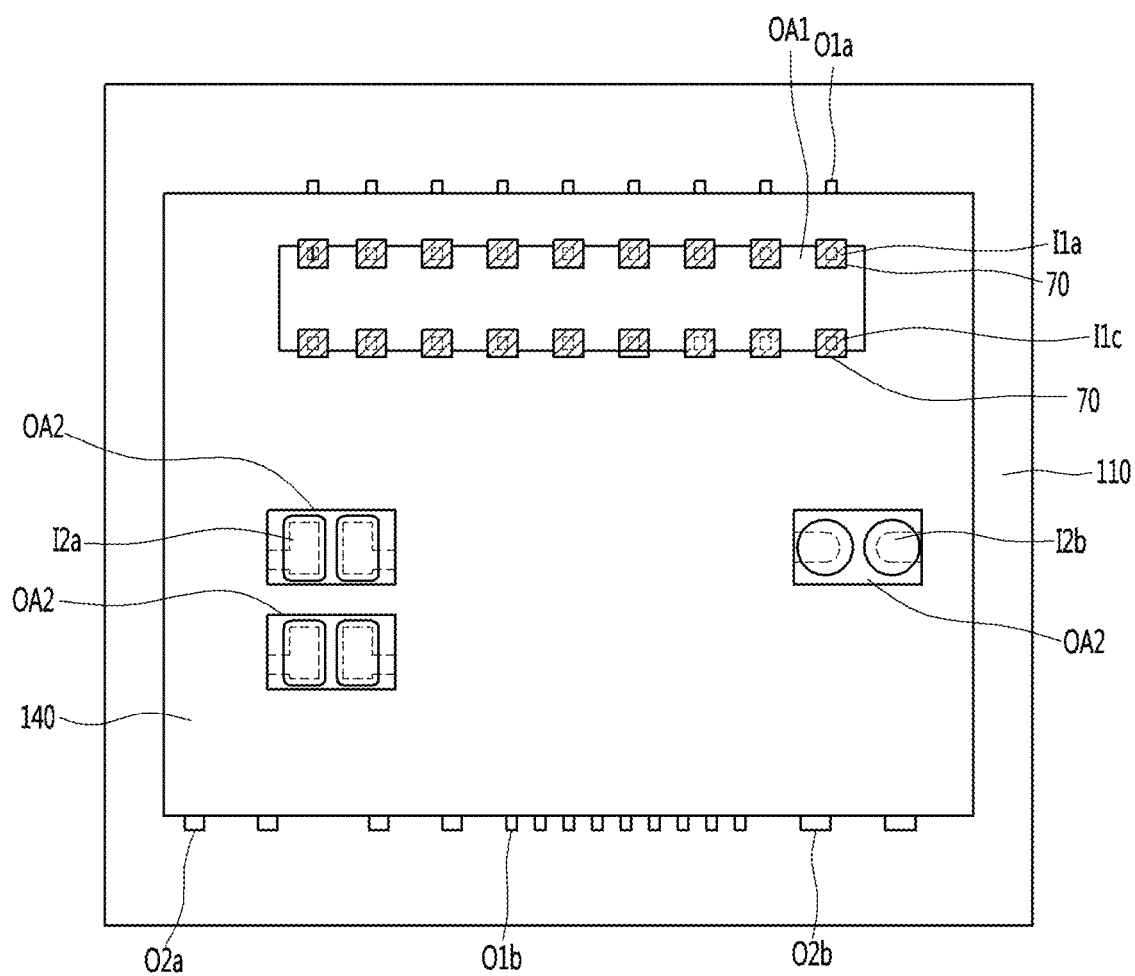

Referring to FIG. 15c and FIG. 16c, the top view of the first sub second inner lead pattern part I2a may be a polygonal shape, and the second connection part may be a quadrangular shape having rounded corners. The top view of the second sub second inner lead pattern part I2b may be a semicircular shape having a rounded end, and the second connection part may be a circular shape.

In the top view of the first connection part 70, a horizontal length and a vertical length (aspect ratio) may correspond to each other, or may be different from each other. For example, the top view of the first connection part 70 may be a square shape in which the horizontal length and the vertical length (aspect ratio) correspond to each other, or may be rectangular shape in which the horizontal length and the vertical length (aspect ratio) are different from each other.

In the top view of the second connection part 80, the horizontal length and the vertical length (aspect ratio) may correspond to each other, or may be different from each other. For example, the top view of the second connection part 80 may be a circular shape in which the horizontal length and the vertical length (aspect ratio) correspond to each other, or may be an elliptical shape in which the horizontal length and the vertical length (aspect ratio) are different from each other.

The protective layer 140, which is positioned on one surface of the double-side flexible circuit board 100 for all-in-one chip on film according to an embodiment, may include a plurality of holes. That is, the protective layer 140 may include a plurality of open regions.

The first open region OA1 of the protective layer may be a region exposed to be connected to the first connection part 70. The conductive pattern part CP exposed in the first open region OA1 of the protective layer may include pure plating on a surface facing the first connection part. That is, in the first open region OA1 of the protective layer, a content of tin of the second plating layer included in the conductive pattern part CP may be 50 atomic % or more.

The second open region OA2 of the protective layer may be a region exposed to be connected to the second connection part 80. The conductive pattern part CP exposed in the second open region OA2 of the protective layer may include an alloy layer of copper and tin on a surface facing the second connection part. That is, in the second open region OA2 of the protective layer, the content of tin of the second plating layer included in the conductive pattern part CP may be less than 50 atomic %.

A line width of the first lead pattern part may correspond to that of the first extension pattern part. The first open region OA1 may be a region for connecting a first chip. The first sub first inner lead pattern part I1a extending from the first sub first outer lead pattern part O1a positioned in the third open region OA3 and facing the inside of the first open region OA1 may correspond to or have a different width from the first sub first outer lead pattern part O1a. For example, a width W1 of the first sub first outer lead pattern part O1a may correspond to a width W2 of the first sub first inner lead pattern part I1a. For example, the width W1 of the first sub first outer lead pattern part O1a may be larger than the width W2 of the first sub first inner lead pattern part I1a. Specifically, a difference between the width W1 of the first sub first outer lead pattern part O1a and the width W2 of the first sub first inner lead pattern part I1a may be within 20%.

The first sub first inner lead pattern part I1a and the third sub first inner lead pattern part I1c extending toward the inside of the first open region OA1 may have a width corresponding to each other.

The first sub first outer lead pattern part O1a and the second sub first outer lead pattern part O1b extending from the first open region OA1 toward an outer periphery of the substrate may have a width corresponding to each other.

The flexible circuit board 100 for all-in-one chip on film may include a plurality of the second open regions OA2 for connecting second chips C2a and C2b which are different types, respectively.

A line width of the second lead pattern part may be larger than that of the second extension pattern part. For example, the line width of the second inner lead pattern part may be larger than that of the second extension pattern part.

One of the second open region OA2 may be a region for connecting one second chip C2a. The first sub second outer lead pattern part O2a extending from the first sub second inner lead pattern part I2a positioned in the second open region OA2 toward the outer periphery of the substrate may have different widths. For example, a width W3 of the first sub second inner lead pattern part I2a may be larger than a width W4 of the first sub second outer lead pattern part O2a. Specifically, the width W3 of the first sub second inner lead pattern part I2a may be larger 1.5 times or more than the width W4 of the first sub second outer lead pattern part O2a.

Another one of the second open region OA2 may be a region for connecting another one second chip C2b. The second sub second outer lead pattern part O2b extending from the second sub second inner lead pattern part I2b positioned in the second open region OA2 toward the outer periphery of the substrate may have different widths. For example, a width W5 of the second sub second inner lead pattern part I2b may be larger than a width W6 of the second sub second outer lead pattern part O2b. Specifically, the width W5 of the second sub second inner lead pattern part I2b may be larger 1.5 times or more than the width W6 of the second sub second outer lead pattern part O2b.

The line width of the first lead pattern part may be smaller than that of the second lead pattern part. For example, the line width of the first inner lead pattern part may be smaller than that of the second inner lead pattern part.

Any one of the width W3 of the first sub second inner lead pattern part I2a and the width W5 of the second sub second inner lead pattern part I2b exposed through the second open region may be larger than the width W2 of the first sub first inner lead pattern part I1a exposed through the first open region.

For example, the line width of the first outer lead pattern part may be smaller than that of the second outer lead pattern part.

The line width of the first extension pattern part may be smaller than that of the second extension pattern part.

A first pitch which is a distance between adjacent the first conductive pattern parts CP1 may be smaller than a second pitch which is a distance between adjacent the second conductive pattern parts CP2. At this time, the first pitch and the second pitch may refer to an average separation distance between two adjacent conductive pattern parts.

The first pitch may be less than 100 μm. For example, the first pitch may be less than 30 μm. For example, the first pitch may be 1 μm to 25 μm.

The second pitch may be 100 μm or more. For example, the second pitch may be 100 μm to 500 μm. For example, the second pitch may be 100 μm to 300 μm.

Accordingly, signal interference between the first conductive pattern part CP1 and the second conductive pattern part CP2 may be inhibited. In addition, it is possible to improve accuracy of signals transmitted from the first conductive pattern part CP1 and the second conductive pattern part CP2 to the first chip and the second chip, respectively.

In the first open region OA1, a plane area of the first inner lead pattern part I1 may correspond to or different from the first connection part 70.

The width of the first inner lead pattern part I1 and the width of the first connection part 70 may be the same or different within 20%. For example, the width of the first inner lead pattern part I1 and the width of the first connection part 70 may be the same or different within 10%. For example, the width of the first inner lead pattern part I1 and the width of the first connection part 70 may be the same or different within 5%.

Accordingly, the first inner lead pattern part I1 and the first connection part 70 may be stably mounted. In addition, adhesion characteristics between the first inner lead pattern part I1 and the first connection part 70 may be improved.

In the second open region OA2, a plane area of the second inner lead pattern part I2 may correspond to or different from the second connection part 80.

The width of the second connection part 80 may be larger than that of the second inner lead pattern part I2, and the width of the second connection part may be 1.5 times or more that of the second inner lead pattern part. For example, the width of the second connection part may be 3 times or more that of the second inner lead pattern part. For example, the width of the second connection part may be 5 times or more that of the second inner lead pattern part. As an example, the width of the second inner lead pattern part for connecting an MLCC chip or a diode chip may be smaller than that of the second connection part.

Accordingly, the second inner lead pattern part I2 and the second connection part 80 may be stably mounted. In addition, adhesion characteristics between the second inner lead pattern part I2 and the second connection part 80 may be improved.

Referring to FIGS. 16*a*, 16*b* and 16*c*, a step of disposing a first connection part 70 and a second connection part 80 on a flexible circuit board 100 for all-in-one chip on film of an embodiment will be described.

The first connection part 70 may be disposed on the first sub first inner lead pattern part I1*a* and the third sub first inner lead pattern part I1*c* exposed through the first open region OA1, respectively. For example, the first connection part 70 may cover entirely or partially upper surfaces of the first sub first inner lead pattern part I1*a* and the third sub first inner lead pattern part I1*c*.

A total number of a plurality of the first sub first inner lead pattern parts I1*a* disposed to be spaced apart from each other and a plurality of the third sub first inner lead pattern parts I1*c* disposed to be spaced from each other may correspond to a number of the first connection part 70.

Figure 17A:
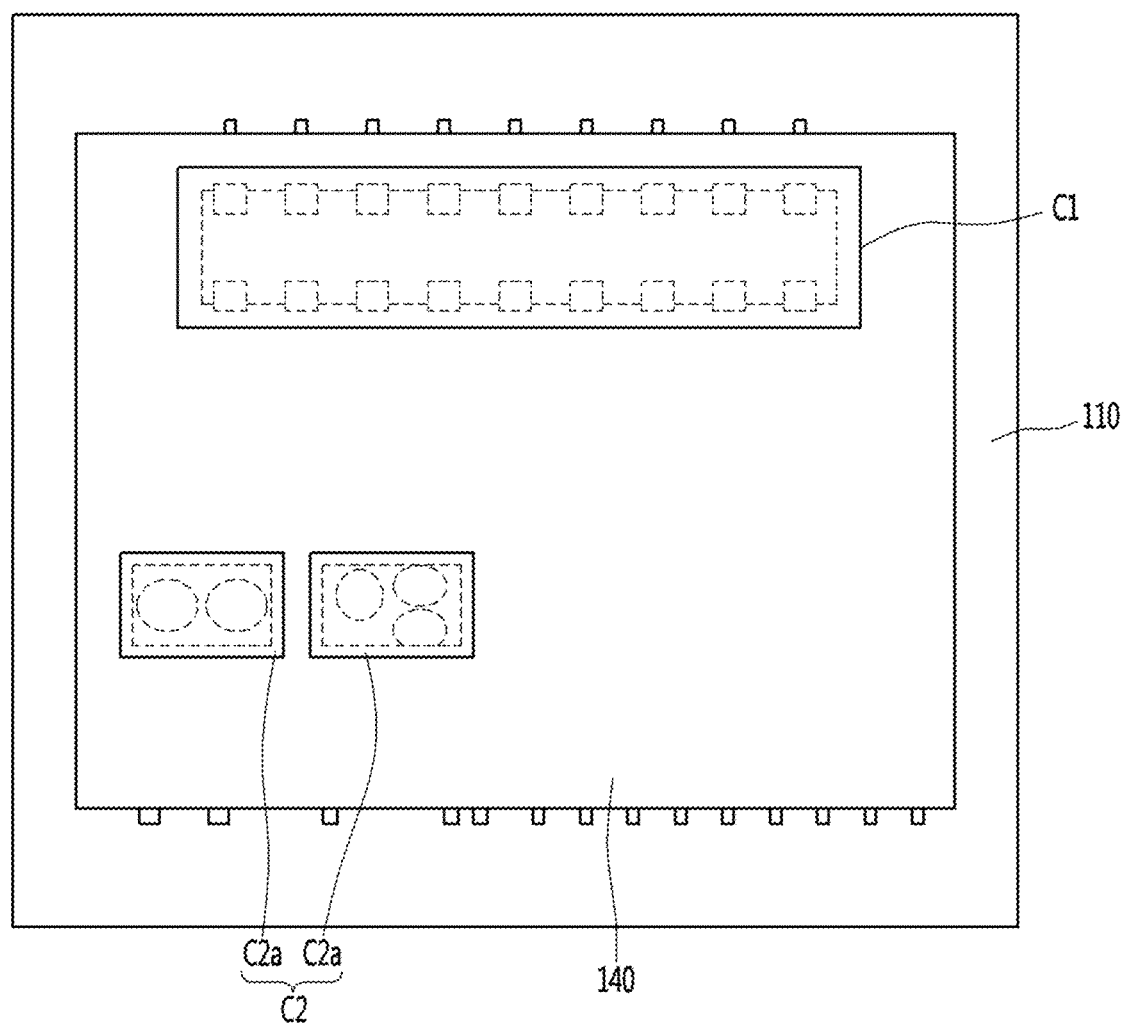
Figure 17B:
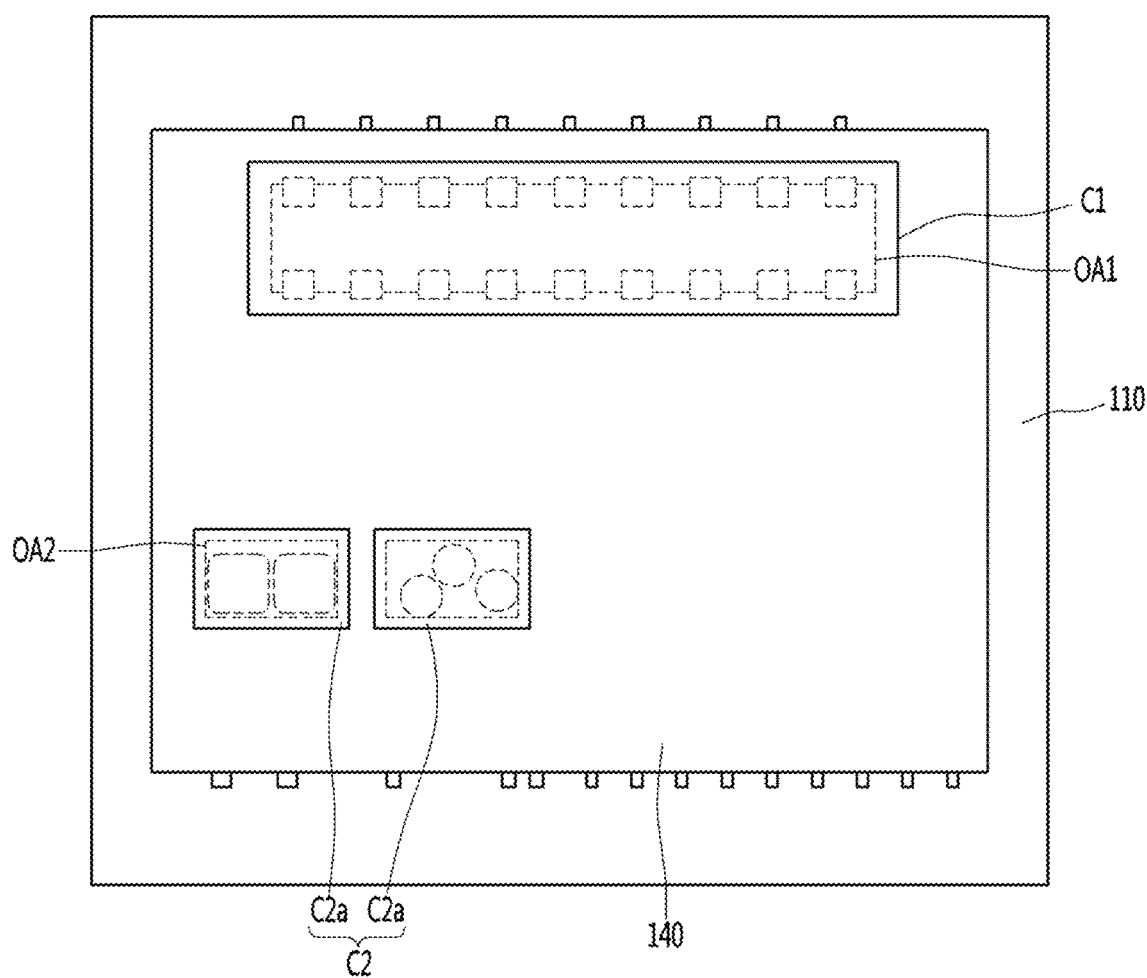
Figure 17C:
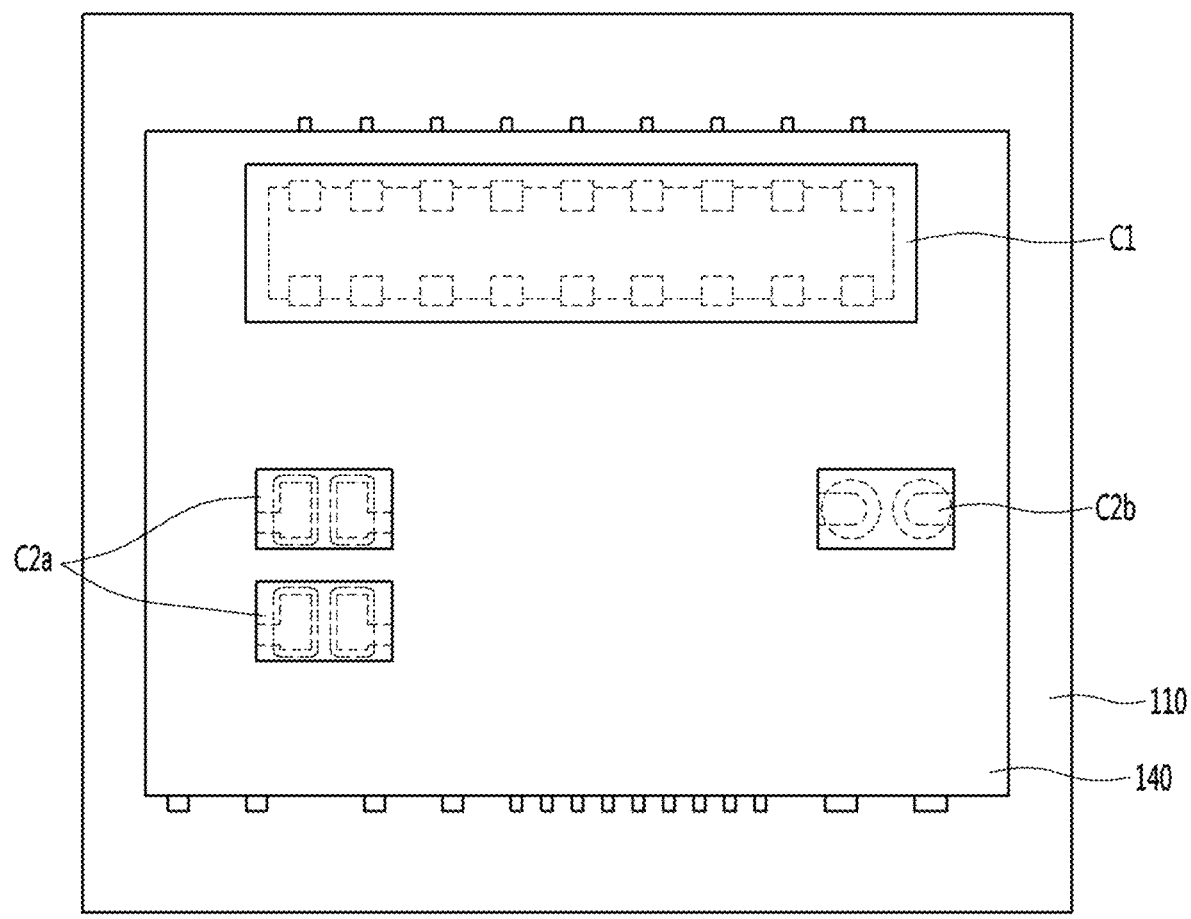

For example, referring to FIG. 17*a*, FIG. 17*b*, and FIG. 17*c*, the number of the plurality of the first sub first inner lead pattern parts I1*a* that are spaced apart from each other is nine, and the number of the plurality of the third sub first inner lead pattern parts I1*c* that are spaced apart from each other is nine, and the number of the first connection part 70 may be 18 which is the sum of nine, the number of the first sub first inner lead pattern parts I1*a* and nine, the number of the plurality of third sub first inner lead pattern parts I1*c* that are spaced apart from each other.

The second connection part 80 may be disposed on the first sub second inner lead pattern part I2*a* and the second sub second inner lead pattern part I2*b* exposed through the second open region OA2, respectively. For example, the second connection part 80 may cover entirely or partially upper surfaces of the first sub second inner lead pattern part I2*a* and the second sub second inner lead pattern part I2*b*.

A number of a plurality of the first sub second inner lead pattern parts I2*a* disposed to be spaced apart from each other may correspond to a number of the second connection part 80 disposed on the first sub second inner lead pattern part I2*a*.

For example, referring to FIGS. 16*a*-16*c*, the number of a plurality of the first sub second inner lead pattern parts I2*a* disposed to be spaced apart from each other may be two, and the number of the second connection part 80 disposed on the first sub second inner lead pattern part I2*a* may be two.

A number of a plurality of the second sub second inner lead pattern part I2*b* disposed to be spaced apart from each other may correspond to a number of the second connection part 80 disposed on the second sub second inner lead pattern part I2*b*.

For example, referring to FIG. 16*a*, FIG. 16*b*, FIG. 17*a*, and FIG. 17*b*, the number of the plurality of the second sub second inner lead pattern part I2*b* disposed to be spaced apart from each other may be three, and the number of the second connection part 80 disposed on the second sub second inner lead pattern part I2*b* may be three.

For example, referring to FIG. 16*c* and FIG. 17*c*, the number of the plurality of the second sub second inner lead pattern part I2*b* disposed to be spaced apart from each other may be two, and the number of the second connection part 80 disposed on the second sub second inner lead pattern part I2*b* may be two.

An electronic device according to an embodiment includes: an all-in-one flexible circuit board including a substrate; a conductive pattern part disposed on the substrate; and a protective layer partially disposed on the conductive pattern part, wherein the conductive pattern part includes a first conductive pattern part and a second conductive pattern part which are spaced apart from each other, each of the first conductive pattern part and the second conductive pattern part includes a wiring pattern layer, a first plating layer, and a second plating layer that are sequentially placed on the substrate, the first conductive pattern part includes a first inner lead pattern part positioned at one end of the first conductive pattern part, a first outer lead pattern part positioned at the other end of the first conductive pattern part, and a first extension pattern part connecting the one end and the other end of the first conductive pattern part, the second conductive pattern part includes a second inner lead pattern part positioned at one end of the second conductive pattern part, a second outer lead pattern part positioned at the other end of the second conductive pattern part, and a second extension pattern part connecting the one end and the other end of the second conductive pattern part, the second conductive pattern part includes a second inner lead pattern part positioned at one end of the second conductive pattern part, a second outer lead pattern part positioned at the other end of the second conductive pattern part, and a second extension pattern part connecting the one end and the other end of the second conductive pattern part, a first connection part and the first chip are disposed on the first inner lead pattern part, and a second connection part and the second chip are disposed on the second inner lead pattern part; a display panel connected to one end of the all-in-one flexible circuit board; and a main board connected to the other end opposite to the one end of the all-in-one flexible circuit board.

The flexible circuit board 100 for all-in-one chip on film according to the embodiment may realize a conductive pattern part with a fine pitch on both surfaces thereof, and thus it may be suitable for an electronic device having a high-resolution display portion.

Further, the flexible circuit board 100 for all-in-one chip on film according to the embodiment is flexible, small in size, and thin in thickness, and thus it may be used for various electronic devices.

Figure 18:
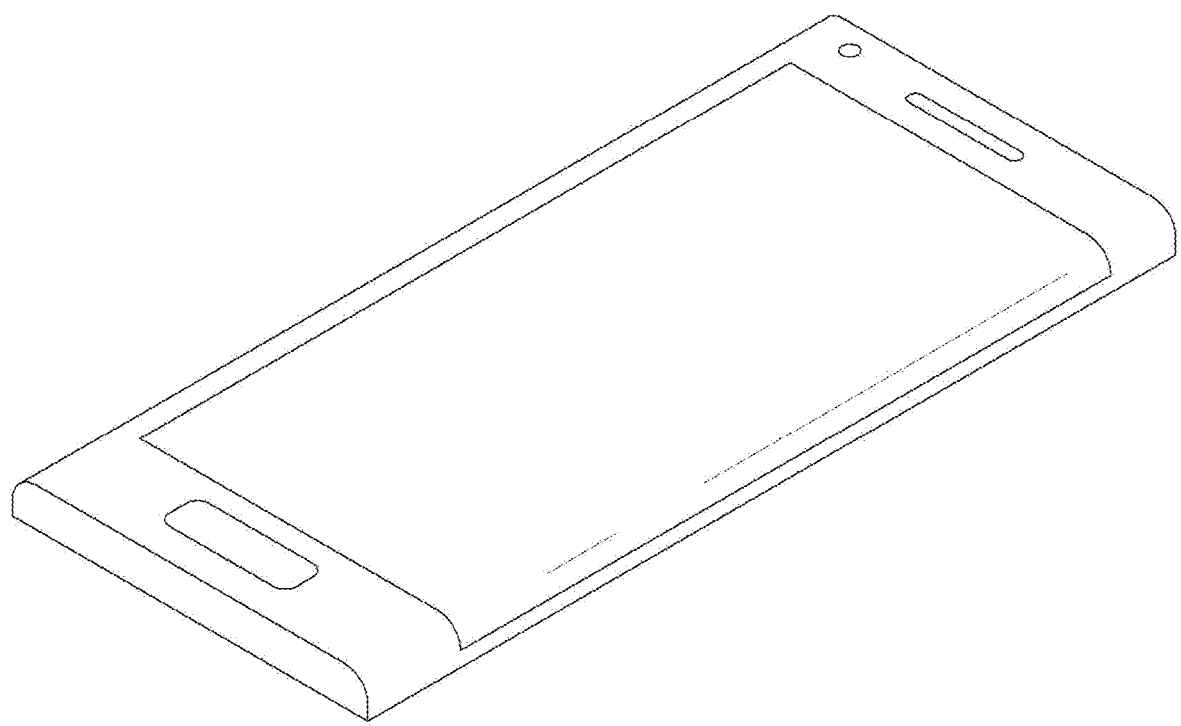
FIGS. 18 to 22 are views of various electronic devices including a flexible circuit board for all-in-one chip on film.

For example, referring to FIG. 18, the flexible circuit board 100 for an all-in-one chip on film according to the embodiment may be reduced a bezel, and thus it may be used for an edge display.

Figure 19:
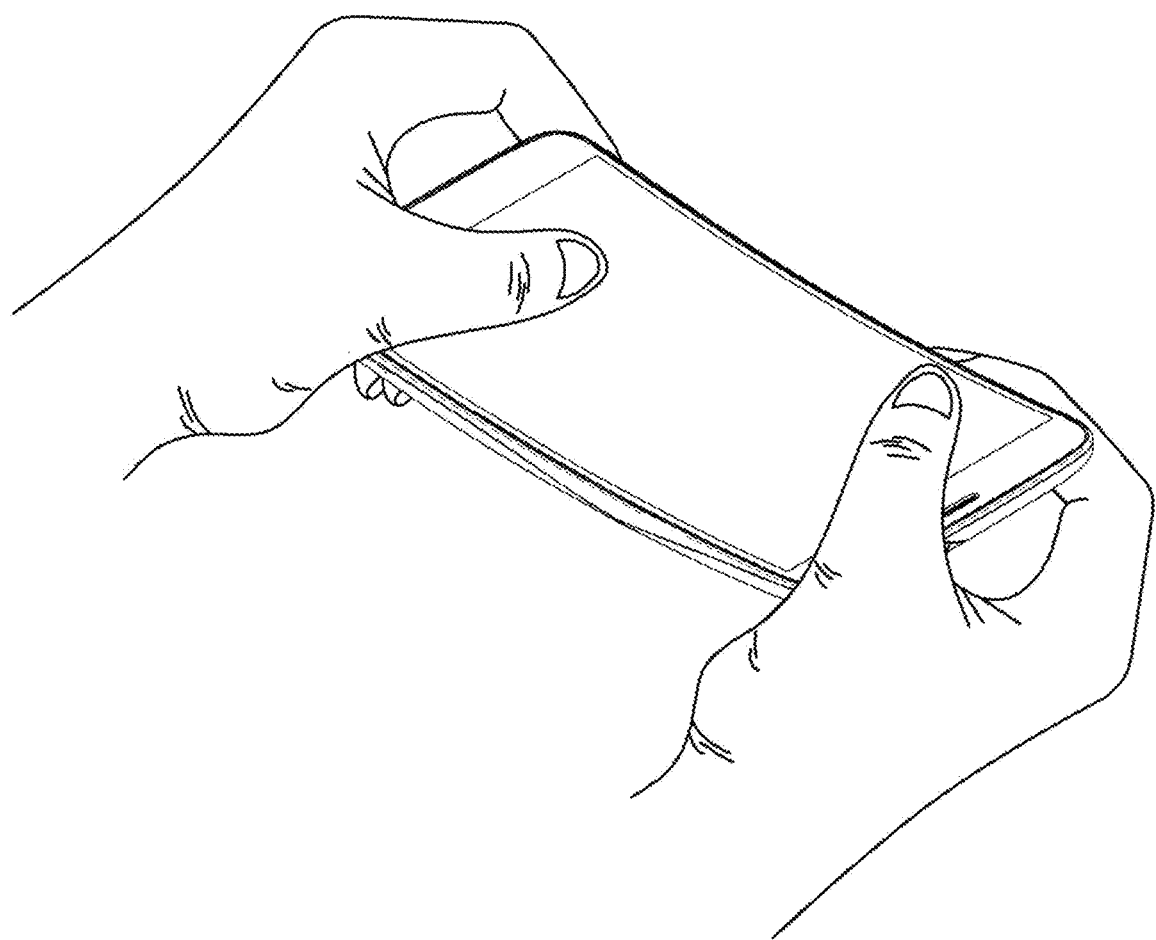

For example, referring to FIG. 19, the flexible circuit board 100 for all-in-one chip on film according to the embodiment may be included in a fordable flexible electronic device. Therefore, the touch device including the same may be a flexible touch device. And thus, a user may fold or bend by hand. Such a flexible touch window may be applied to a wearable touch device or the like.

Figure 20A:
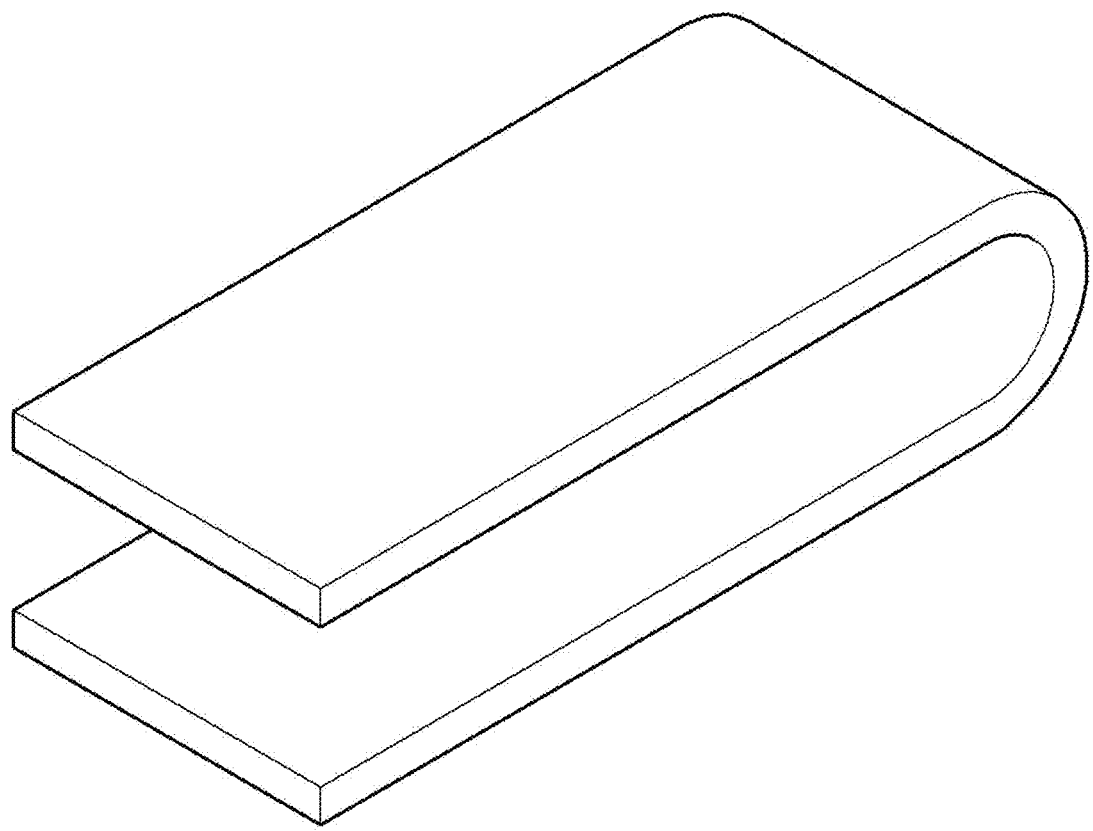
Figure 20B:
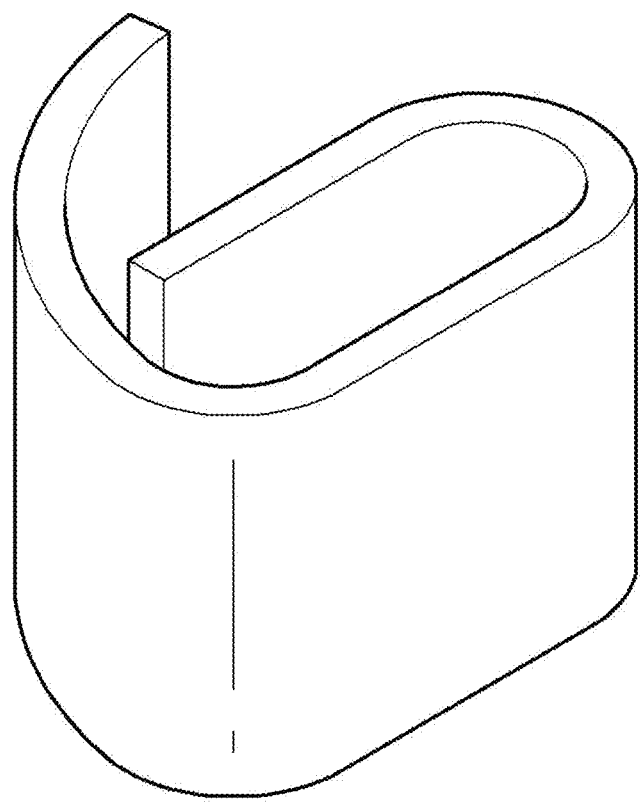
Figure 20C:
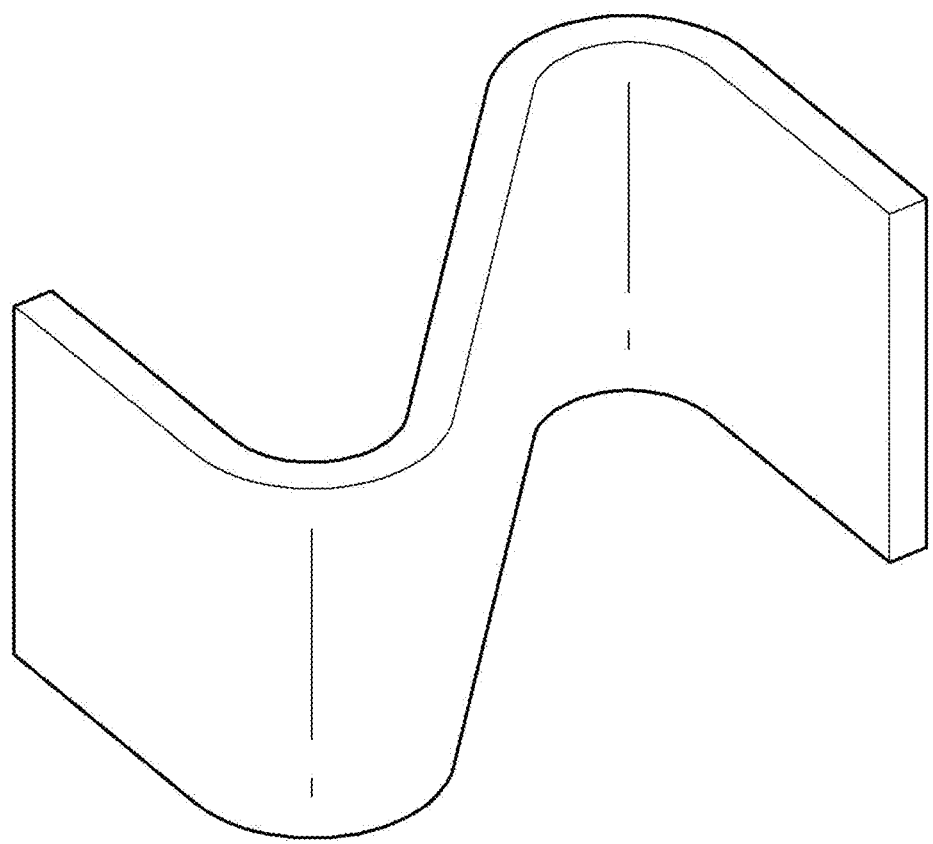

For example, referring to FIGS. 20a-20c, a flexible circuit board 100 for all-in-one chip on film according to an embodiment may be applied to various electronic devices to which a foldable display device is applied. Referring also to FIGS. 20a to 20c, the foldable display device may fold a foldable cover window. The foldable display device may be included in various portable electronic products. Specifically, the foldable display device may be included in a mobile terminal (mobile phone), a notebook (portable computer), and the like. Accordingly, while increasing the display region of a portable electronic product, a size of the device may be reduced during storage and transportation, and thus portability may be improved. Therefore, convenience of a user of the portable electronic product may be improved. However, the embodiment is not limited thereto, and of course, the foldable display device may be used for various electronic products.

Referring to FIG. 20a, a foldable display device may include one folding region in a screen region. For example, the foldable display device may have a C-shape in a folded form. That is, in the foldable display device, one end and the other end opposite to the one end may be overlapped with each other. At this time, the one end and the other end may be disposed close to each other. For example, the one end and the other end may be disposed to face each other.

Referring to 20b, a foldable display device may include two folding regions in a screen region. For example, the foldable display device may have a G-shape in a folded form. That is, the foldable display device may be overlapped with each other by folding one end and the other end opposite to the one end in a direction corresponding to each other. At this time, the one end and the other end may be spaced apart from each other. For example, the one end and the other end may be disposed in parallel to each other.

Referring to FIG. 20c, a foldable display device may include two folding regions in a screen region. For example, the foldable display device may have an S-shape in a folded form. That is, in the foldable display device, one end and the other end opposite to the one end may be folded in different directions. At this time, the one end and the other end may be spaced apart from each other. For example, the one end and the other end may be disposed in parallel to each other.

Although not shown in the drawings, of course, a flexible circuit board 100 for all-in-one chip on film according to an embodiment may be applied to a rollable display.

Figure 21:
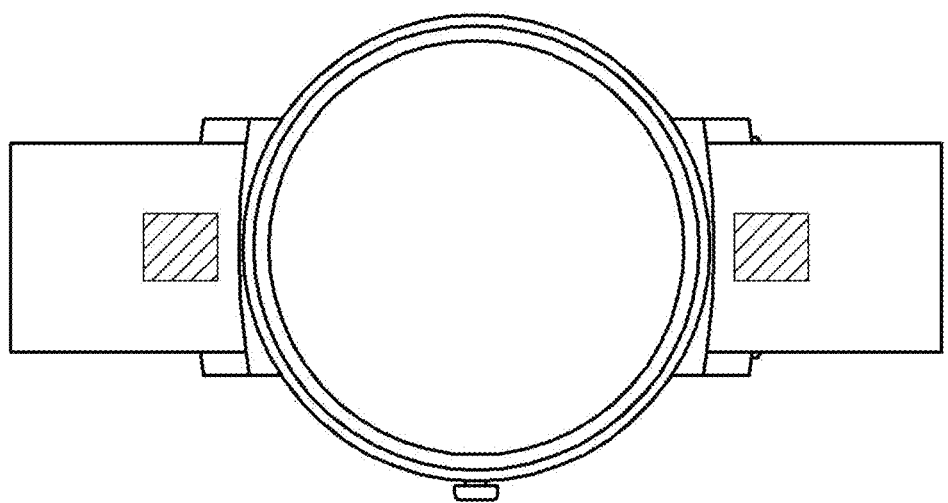

Referring to FIG. 21, a flexible circuit board 100 for all-in-one chip on film according to an embodiment may be included in various wearable touch devices including a curved display. Therefore, an electronic device including the flexible circuit board 100 for all-in-one chip on film according to the embodiment may be reduced in thickness, size and weight.

Figure 22:
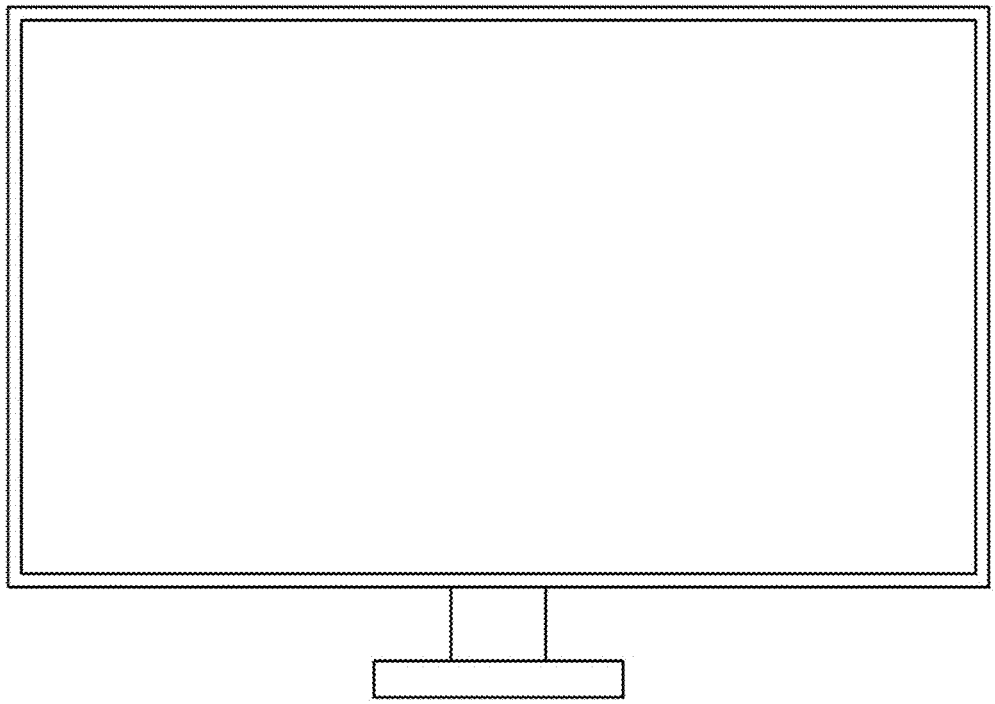

Referring to FIG. 22, a flexible circuit board 100 for all-in-one chip on film according to an embodiment may be used for various electronic devices having a display portion such as a TV, a monitor, and a laptop computer.

However, the embodiment is not limited thereto, and of course, the flexible circuit board for all-in-one chip on film 100 according to the embodiment may be used for various electronic devices having a flat plate or a curved-shaped display portion.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A flexible circuit board for all-in-one chip on film, the flexible circuit board comprising:
    a substrate;
    a conductive pattern part disposed on the substrate; and
    a protective layer partially disposed on the conductive pattern part,
    wherein the conductive pattern part includes a first conductive pattern part and a second conductive pattern part which are spaced apart from each other,
    each of the first conductive pattern part and the second conductive pattern part includes a wiring pattern layer, a first plating layer, and a second plating layer that are sequentially placed on the substrate,
    the first conductive pattern part includes a first open region in which the protective layer is open,
    the second conductive pattern part includes a second open region in which the protective layer is open, and
    a content of tin of the second plating layer in the first open region is greater than that of the second plating layer in the second open region.

2. The flexible circuit board of claim 1, wherein the content of tin (Sn) of the second plating layer is 50 atomic % or more in the first open region, and
the content of tin (Sn) of the second plating layer is less than 50 atomic % in the second open region.

3. The flexible circuit board of claim 1, wherein the second plating layer is an alloy layer of copper (Cu) and tin (Sn) in the second open region.

4. The flexible circuit board of claim 1, wherein the first conductive pattern part includes a first lead pattern part positioned at one end and the other end of the first conductive pattern part, and a first extension pattern part connecting the one end and the other end of the first conductive pattern part,
the second conductive pattern part includes a second lead pattern part positioned at one end and the other end of the second conductive pattern part, and a second extension pattern part connecting the one end and the other end of the second conductive pattern part, and
the first lead pattern part is different from the second lead pattern part in shape.

5. The flexible circuit board of claim 4, wherein a line width of the first lead pattern part is smaller than that of the second lead pattern part.

6. The flexible circuit board of claim 4, wherein a line width of the first lead pattern part corresponds to a line width of the first extension pattern part, and
a line width of at least one end portion of the second lead pattern part is different from a line width of the second extension pattern part.

7. The flexible circuit board of claim 4, wherein the first conductive pattern part includes a plurality of first conductive pattern parts spaced at a first distance on the substrate,
the second conductive pattern part includes a plurality of second conductive pattern parts spaced at a second distance on the substrate, and
the first distance is smaller than the second distance.

8. A chip package which comprises a flexible circuit board for all-in-one chip on film, the flexible circuit board comprising:
a substrate;
a conductive pattern part disposed on the substrate; and
a protective layer partially disposed on the conductive pattern part,
wherein the conductive pattern part includes a first conductive pattern part and a second conductive pattern part which are spaced apart from each other,
each of the first conductive pattern part and the second conductive pattern part includes a wiring pattern layer, a first plating layer, and a second plating layer that are sequentially placed on the substrate,
the first conductive pattern part includes a first open region in which the protective layer is open,
the second conductive pattern part includes a second open region in which the protective layer is open,
a content of tin of the second plating layer in the first open region is greater than that of the second plating layer in the second open region, and
a first chip is disposed in the first open region and a second chip is disposed in the second open region.

9. The chip package of claim 8, wherein the first chip is a drive IC chip, and the second chip is at least one of a diode chip, a power supply IC chip, a touch sensor IC chip, a multilayer ceramic capacitor (MLCC) chip, a ball grid array (BGA) chip, and a chip condenser.

10. The chip package of claim 8, wherein the first chip and the second chip are disposed on the same one surface of the flexible circuit board for all-in-one chip on film.

11. The chip package of claim 8, wherein the first conductive pattern part includes a first inner lead pattern part positioned at one end of the first conductive pattern part, a first outer lead pattern part positioned at the other end of the first conductive pattern part, and a first extension pattern part connecting the one end and the other end of the first conductive pattern part,
the second conductive pattern part includes a second inner lead pattern part positioned at one end of the second conductive pattern part, a second outer lead pattern part positioned at the other end of the second conductive pattern part, and a second extension pattern part connecting the one end and the other end of the second conductive pattern part,
a first connection part and the first chip are disposed on the first inner lead pattern part, and
a second connection part and the second chip are disposed on the second inner lead pattern part.

12. The chip package of claim 11, wherein the first connection part and the second connection part have different sizes and different shapes.

13. The chip package of claim 11, wherein the first connection part includes gold (Au), and
the second connection part includes a metal other than gold (Au).

14. The chip package of claim 11, wherein the second plating layer of the first inner lead pattern part is a pure tin layer having a content of tin (Sn) of 50 atomic % or more, and
the second plating layer of the second inner lead pattern part is a tin alloy layer having a content of tin (Sn) of less than 50 atomic %.

15. The chip package of claim 11, wherein a width of the first inner lead pattern part and a width of the first connection part are equal to each other or have a difference of 20% or less, and
a width of the second connection part is not less than 1.5 times a width of the second inner lead pattern part.

16. An electronic device comprising:
a flexible circuit board for all-in-one chip on film including:
a substrate;
a conductive pattern part disposed on the substrate; and
a protective layer partially disposed on the conductive pattern part,
wherein the conductive pattern part includes a first conductive pattern part and a second conductive pattern part that are spaced apart from each other,
each of the first conductive pattern part and the second conductive pattern part includes a wiring pattern layer, a first plating layer, and a second plating layer that are sequentially disposed on the substrate,
the first conductive pattern part includes a first open region in which the protective layer is open,
the second conductive pattern part includes a second open region in which the protective layer is open, and
a content of tin of the second plating layer in the first open region is greater than that of the second plating layer in the second open region;
a display panel connected to one end of the flexible circuit board for all-in-one chip on film; and a main board connected to the other end opposite to the one end of the flexible circuit board for all-in-one chip on film.

17. The electronic device of claim 16, wherein a first chip disposed in the first open region and a second chip disposed in the second open region of the flexible circuit board for all-in-one chip on film are different types, the display panel and the main board are disposed facing each other, and the flexible circuit board for all-in-one chip on film is bent and disposed between the display panel and the main board.

18. The flexible circuit board of claim 1, wherein a content of tin (Sn) of the second plating layer in the first open region is 70 atomic % or more.

19. The flexible circuit board of claim 1, wherein a content of tin (Sn) of the second plating layer in the first open region is 90 atomic % or more.

20. The flexible circuit board of claim 4, wherein the protective layer is disposed on the first extension pattern part and the second extension pattern part, and one surfaces of the first lead pattern part and the second lead pattern part are exposed to the outside.

\* \* \* \* \*